United States Patent
Morita

[19]

[11] Patent Number: 6,008,691
[45] Date of Patent: Dec. 28, 1999

[54] FREQUENCY-DEPENDENT RESISTOR

[75] Inventor: Yoichi Morita, Moriyama, Japan

[73] Assignee: Matsushita Electric Industrial Co., Ltd., Osaka-fu, Japan

[21] Appl. No.: 08/945,509

[22] PCT Filed: Feb. 26, 1997

[86] PCT No.: PCT/JP97/00577

§ 371 Date: Oct. 24, 1997

§ 102(e) Date: Oct. 24, 1997

[87] PCT Pub. No.: WO97/32396

PCT Pub. Date: Sep. 4, 1997

[30] Foreign Application Priority Data

Mar. 1, 1996 [JP] Japan .................................. 8-044497

[51] Int. Cl.⁶ .................................................. H03B 1/00
[52] U.S. Cl. .......................... 327/552; 327/557; 327/558
[58] Field of Search .................................. 327/552, 555, 327/556, 557, 558, 559, 311; 330/107, 109, 305

[56] References Cited

U.S. PATENT DOCUMENTS 4,952,891  8/1990  Moulding .............................. 333/17.1
5,012,201  4/1991  Morita et al. ........................... 330/252
5,357,208  10/1994 Nelson .................................... 330/126

FOREIGN PATENT DOCUMENTS 63-244921  10/1988  Japan .
3-216086   9/1991   Japan .
5-251991   9/1993   Japan .
WO95/31036 11/1995  WIPO .

OTHER PUBLICATIONS

Van Valkenburg, M.E., "Analog Filter Design"; HRW Series in *Electrical and Computer Engineering*; pp. v, 54–57, 432–441, 1982.

*Primary Examiner*—Kenneth B. Wells
*Assistant Examiner*—Hai L. Nguyen
*Attorney, Agent, or Firm*—Akin, Gump, Strauss, Hauer & Feld, L.L.P.

[57] ABSTRACT

A frequency dependent resistor is disclosed, in which a reactive load represented by a coil or a capacitor is connected to the output of a voltage-current converter thereby to constitute a phase rotator for rotating the phase of an input voltage by 90 degrees. Plural phase rotators are connected in cascade, and the output voltage of a phase rotator in an even-numbered stage is converted into a current and applied to the input terminal of the phase rotator in the first stage.

23 Claims, 33 Drawing Sheets

FREQUENCY-DEPENDENT RESISTOR

TECHNICAL FIELD

The present invention relates to an analog filter, or more in particular to a frequency dependent resistor; suitably used for a bandpass filter producing a chrominance signal from a composite video signal; for a lowpass filter removing high harmonics after demodulating the chrominance signal in TV or VTR; for an equalizer for controlling the frequency and amplitude in an audio circuit; for a filter for detecting an IQ signal in some B.S. tuners; for filter removing the noise component of some pulse signals in a digital signal processing circuit.

BACKGROUND ART

In designing a filter circuit, appropriately combining resistors, capacitors, coils, operational amplifiers configure a passive filter or an active filter. Some specific examples are some single-tuned circuits using resistors, capacitors and coils, and further, a Butterworth, Chebyshev, Bessel or an elliptic function filters combining an operational amplifier with the elements. These filters have such a characteristic of which the phase of the output signal changes with the frequency of it. The reason is that the ratio between the imaginary number component and the real number component of the impedance of these filters changes with frequency. In the signal processing, when the phase change with frequency is at least linear in characteristic, the group delay characteristic is flat. Thus, we can remove the distortion of the output with respect to the input signal waveform. With the Bessel filter, for example, limiting the frequency flattens the group delay characteristic as far as possible.

A single tuned circuit that is one of the conventional filter units is shown in FIG. 30. This single tuned circuit comprises a resistor 130 having a resistance value of 10 kΩ, a coil 50 having an inductance value of 0.01 H, and a capacitor 52 having a capacitance value of 10 pF connected in series, and a signal source 140 having a phase of zero degree and an amplitude of unity connected across the series circuit. The output signal's amplitude and phase characteristic with respect to the input signal of this single tuned circuit is shown in FIGS. 31 to 33. FIG. 31 shows the lowpass filter characteristic obtained at a terminal 13, FIG. 32 shows the band rejection filter characteristic obtained at a terminal 14, and FIG. 33 shows the bandpass filter characteristic obtained between the terminals 14 and 15. FIGS. 31 and 32 show that, in spite of the cut off frequency of about 500 kHz, the phase begins to change already at 10 kHz in a signal-pass frequency range. FIG. 33 shows that the phase changes sharply at both side of central frequency of signal-pass frequency range.

In the case where the chrominance.signal is taken out of the composite video signal of a TV signal using these conventional bandpass filters, unevenness of group delay develops in the frequency about the carrier frequency. Therefore, a distortion occurs in the waveform after demodulation, sometimes inconveniently making an adverse effect in doing faithful color reproduction. For removing the high harmonics from the demodulated chrominance signal, a lowpass filter is used, so that a comparatively large phase delay is developed for the signal. To correct the time delay due to the phase delay, inserting a delay line in a luminance signal processing circuit having no time delay is necessary.

The FDNR (frequency dependent negative converter) has been proposed as one of the impedance converts (also called GIC), which comprises a combination of two operational amplifiers and five elements in which two elements are made up capacitors and the remaining elements are resistors.

This FDNR has the characteristic that the phase characteristic of it remains unchanged with frequency but the resistance value of it changes with frequency. Nevertheless, the resistance characteristic of FDNR is negative and is limited to the square of the frequency. Also, since replacing the value of each component element with another value is needed for changing the resistance value, the field in which the FDNR is applicable was limited.

Further, when noises are removed from the pulse signal using these conventional lowpass filters, the large phase change sometimes causes a considerable difference between the phase of the input pulse and that of the pulse output. Especially, there happened a serious trouble in a circuit requiring synchronous processing.

DISCLOSER OF INVENTION

The present invention is intended to provide a frequency dependent resistor in which the impedance thereof changes with frequency. This invention is intended to provide a filter unit comprising a combination of the frequency dependent resistor with another resistor to produce a signal with a very low-suppressed phase change about frequency. The resistor herein means a resistor element, a circuit equivalently providing a resistor element or a circuit including a combination of it.

A frequency dependent resistor according to the present invention comprises: a cascade-connected circuit wherein plural phase rotators are connected in cascade; each of the phase rotators having a voltage-current converter for putting out a current from an output terminal thereof responding to a voltage applied to an input terminal thereof, and a reactive load connected to the output terminal of the voltage-current converter; each of the phase rotators putting out a voltage generated in the reactive load responding to the voltage applied to the input terminal: a signal terminal connected to the input terminal of the voltage-current converter of the first-stage phase rotator of the cascade-connected circuit: and at least one voltage-current converter putting out a current to the signal terminal responding to the output voltage of even-numbered stage phase rotators as counted from the first-stage phase rotator of the cascade-connected circuit.

In the present invention, the reactive load means a load with the characteristic of it controlled by the imaginary part of the impedance.

When an AC voltage applied to the signal terminal of the frequency dependent resistor is, the reactive load of the first-stage phase rotator generates a voltage. The voltage is 90 degrees out of a phase with the voltage applied to the input terminal of the first-stage phase rotator, i.e., the voltage applied to the signal terminal. This voltage is applied to the second-stage phase rotator, and the reactive load of the second-stage phase rotator generates a voltage. The voltage is 90 degrees out of a phase with the voltage applied to the input terminal of the second-stage phase rotator. As a result, the reactive load of the second-stage phase rotator generates a voltage of 180 degrees out of a phase with the voltage applied to the signal terminal. In this way, the reactive load of the fourth-stage phase rotator generates a voltage of 360 degrees out of a phase with the voltage applied to the signal terminal. Further, the reactive loads of the sixth-stage phase rotator and the eighth-stage phase rotator generate voltages that are 540 degrees and 720degrees, respectively, out of a phase with the voltage applied to the signal terminal.

Furthermore, the voltage generated in the reactive load of the even-numbered stage phase rotators is converted into a current of an identical or opposite phase to the phase of this voltage and applied to the signal terminal. Consequently, a current having an identical or opposite phase to the voltage applied to the signal terminal is fed back to the signal terminal.

Especially, when a feedback current which phase is opposite to the phase of the voltage applied to the signal terminal is applied to the signal terminal, a current flows into the frequency dependent resistor from the signal terminal, and the current has the same phase as the voltage applied to the signal terminal, so that a positive resistance characteristic is obtained in the signal terminal.

In the case where the reactive load is compositely configured of a capacitor or a coil, the resistance value of the frequency dependent resistor changes in various manners responding to the frequency, as described in detail later.

According to another aspect of the present invention, a frequency dependent resistor comprises: a cascade-connected circuit wherein plural phase rotators are connected in cascade; each of the phase rotatores has a voltage-current converter for putting out a bidirectional AC current from an output terminal pair responding to an AC voltage applied to an input terminal pair of it, and a reactive load connected to the output terminal pair of the voltage-current converter; each of the phase rotators puts out a voltage generated in the reactive load responding to the voltage applied to the input terminal pair: a signal terminal pair is connected to the input terminal pair of the voltage-current converter of the first-stage phase rotator of the cascade-connected circuit: and at least one voltage-current converter applied a bidirectional AC current to the signal terminal pair from the output terminal pair responding to the output voltage of even-numbered stage phase rotators as counted from the first-stage phase rotator of the cascade-connected circuit.

A voltage is generated across the reactive load of the first-stage phase rotator. The voltage is 90 degrees out of a phase with the voltage applied to the input terminal pair of the first-stage phase rotator, i.e., the voltage applied to the signal terminal pair. This voltage is applied to the second-stage phase rotator, so that a voltage of 90 degrees out of a phase with the voltage applied to the input terminal pair of the second-stage phase rotator is generated across the reactive load of the second-stage phase rotator. As a result, a voltage of 180 degrees out of a phase with the voltage applied to the signal terminal pair is applied across the reactive load of the second-stage phase rotator. In this way, a voltage of 360 degrees out of a phase with the voltage applied to the signal terminal pair is generated across the reactive load of the fourth-stage phase rotator. Further, voltages of 540 degrees and 720 degrees out of a phase with the voltage applied to the signal terminal pair are generated across the reactive loads of the sixth-stage phase rotator and the eighth-stage phase rotator, respectively. Furthermore, the voltage generated across the reactive load of even-numbered stage phase rotators is converted into an identical phase current and an opposite phase current to the particular voltage, which individually applied to the signal terminal pair. As a result, a bidirectional current, which is an identical phase current and an opposite phase current to the voltage applied to the signal terminal pair, is fed back to the signal terminal pair.

A first signal terminal being one terminal of the signal terminal pair is considered with respect to a second signal terminal being the other terminal of it. In the case considered that a current in a phase with the voltage applied to the first signal terminal flows from the first signal terminal into the frequency dependent resistor, and that a current in a phase flows out of the second signal terminal (or, a current of opposite phase flows into the second signal terminal). A positive resistance characteristic is obtained between the signal terminal pair.

In the case where the reactive load is configured compositely of a capacitor or a coil, the resistance value of the frequency dependent resistor variously changes responding to frequency, as described in detail later.

According to still another aspect of the invention, a frequency dependent resistor comprises: a cascade-connected circuit in which plural phase rotators are connected in cascade; each of the phase rotators composed of a differential amplifier circuit having an output terminal pair for putting out a current responding to the voltage applied from an input terminal pair of it, and a reactive load connected to the output terminal pair: a signal terminal pair connected to the input terminal pair of the first-stage differential amplifier circuit of the cascade-connected circuit: and at least one differential amplifier circuit putting out currents from the output terminal pair of it responding to the voltage applied between the input terminal pair when the voltage generated across the reactive load of even-numbered stage phase rotators as counted from the first-stage phase rotator of the cascade-connected circuit is applied to the input terminal pair of it.

A voltage is applied to the input terminal pair of the differential amplifier circuit of the first-stage phase rotator. A bidirectional current putting out from the output terminal pair of the differential amplifier responding to the applied voltage is supplied to the reactive load. A voltage of 90 degrees out of a phase from the voltage applied to the input terminal pair of the differential amplifier circuit of the first-stage phase rotator, i.e., the voltage applied to the signal terminal pair is generated across the reactive load. This voltage is applied to the input terminal pair of the differential amplifier circuit of the second-stage phase rotator. A bidirectional current putting out from the output terminal pair of the differential amplifier responding to this voltage is supplied to the reactive load of the second-stage phase rotator. A voltage of 90 degrees out of a phase from the voltage applied to the input terminal pair of the differential amplifier circuit of the second-stage phase rotator is generated across the reactive load of the second-stage phase rotator. As a result, a voltage of 180 degrees out of a phase from the voltage applied to the signal terminal pair is generated across the reactive load of the second-stage phase rotator. Thus, a voltage of 360 degrees out of a phase from the voltage applied to the signal terminal pair is generated across the reactive load of the fourth-stage phase rotator. Further, voltages of 540 degrees and 720 degrees out of a phase from the voltage applied to the signal terminal pair are generated across the reactive loads of the sixth-stage phase rotator and the eighth-stage phase rotator, respectively. The voltage generated across the reactive load of even-numbered stage phase rotators is converted into a bidirectional current, which is supplied to the signal terminal pair, by which a resistance characteristic is obtained at the signal terminal pair. A positive or negative resistance characteristic is obtained by selecting the direction of the bidirectional current applied to the signal terminal pair.

Since the impedance of the reactive load varies with frequency, a voltage generated across each reactive load is different with frequency, so that the value of the bidirectional current applied to the signal terminal pair changes responding to frequency. Therefore, the resistance value of the signal terminal pair changes with frequency.

With the differential amplifier circuits of the phase rotators other than the first-stage phase rotator, fixed potential is applied desirably to one of the input terminal pair of it for stabilizing the operation. Let us add that in the case where a DC voltage is applied to one of the input terminal pair from a DC voltage source, a current path toward this input terminal is formed through the DC voltage source.

A frequency dependent resistor according to this invention can comprise at least one current-current converter in which different current transmission coefficient varies responding to a control signal applied thereto from an external source.

The value of the current fed back to the signal terminal or the signal terminal pair of the frequency dependent resistor is changed by amplifying the current by a signal supplied from an external source. By which, the resistance value of the frequency dependent resistor can be changed by this signal. This advantage lies in the fact that the resistance characteristic of the frequency dependent resistor can be altered without replacing the component parts of the frequency dependent resistor. The signal supplied from an external source includes an AC electrical signal applied from a signal source or the like; an electrical signal detected by a detection circuit; a DC voltage produced through a D/A converter from the digital data of a microcomputer or a memory; also a DC current obtained from these component parts.

In a case, the current that fed back to the signal terminal or the signal terminal pair is an opposite phase to the voltage that applied to the signal terminal or the signal terminal pair.

This form causes a current in a phase with the voltage applied to the signal terminal or the signal terminal pair to flow into the frequency dependent resistor. Therefore, the frequency dependent resistor has the function of a resistor element having a positive resistance characteristic.

In the other case, the current that fed back to the signal terminal or the signal terminal pair is in a same phase with the voltage that applied to the signal terminal or the signal terminal pair.

This form causes a current in a phase with the voltage applied to the signal terminal or the signal terminal pair to flow out of the frequency dependent resistor. Thus, the frequency dependent resistor has the function of a resistance element having a negative resistance characteristic.

In the frequency dependent resistor according to this invention, the reactive load can be capacitive element.

In the case where the reactive load is a capacitive element, the impedance of the reactive load is inversely proportional to the product of the frequency and the capacitance value. Thus, a voltage generated in the reactive load of the [2×n]th stage (where n is a positive integer) has an amplitude inversely proportional to the product of the [2×n]th power of the frequency and the capacitance value of each reactive load that is in the first-stage phase rotator to the [2×n]th stage phase rotator. This voltage is converted into a current, which is applied to the signal terminal or the signal terminal pair. The amplitude of this current is also inversely proportional to the product of the [2×n]th power of the frequency and the capacitance value of each reactive load of the first-stage phase rotator to the [2×n]th stage phase rotator. Consequently, the frequency dependent resistance is directly proportional to the product of the [2×n]th power of the frequency and the capacitance value of each reactive load that is in the first-stage phase rotator to the [2×n]th stage phase rotator.

According to this invention, the reactive load of the frequency dependent resistor can be an inductance element.

In the case where the reactive load is an inductance element, the impedance of the reactive load is directly proportional to the product of the frequency and the inductance value. Thus, a voltage generated in the reactive load of the [2×n]th phase rotator has an amplitude directly proportional to the product of the [2×n]th power of the frequency and the inductance value of each reactive load that is in the first-stage phase rotator to the [2×n]th-stage phase rotator. This voltage is converted into a current, which is applied to the signal terminal or the signal terminal pair. The amplitude of this current is also directly proportional to the product of the [2×n]th power of the frequency and the inductance value of each reactive load that is in the first-stage phase rotator to the [2×n]th stage phase rotator. The frequency dependent resistor's is inversely proportional to the product of the [2×n]th power of the frequency and the inductance value of each reactive load that is in the first-stage phase rotator to the [2×n]th stage phase rotator.

According to this invention, the reactive load of the frequency dependent resistor can be a parallel circuit including capacitive element and inductance element.

In the case where the reactive load is configured of a parallel circuit including a capacitive element and an inductance element, the impedance of the of the reactive load is given as the reciprocal of a value made by deducing a value inversely proportional to the product of the frequency and the inductance value of the inductance element from a value proportional to the product of the frequency and the capacitance value of the capacitive element. Therefore, across the reactive load of the [2×n]th-stage phase rotator, a voltage having an amplitude proportional to a value made by each other multiplying the reciprocal of a value made by deducing, a value inversely proportional to the product of the frequency and the inductance value of the inductance element, from a value proportional to the product of the frequency and the capacitance value of the capacitive element, which is a value for determining the impedance of respective reactive loads of the first-stage phase rotator through the [2×n]th stage phase rotator, is generated. This voltage is converted into a current, which is applied to the signal terminal or the signal terminal pair. The amplitude of this current is directly proportional to the voltage generated in the reactive load of the [2×n]th-stage phase rotator. As a result, the resistance value of the impedance of the frequency dependent resistor is directly proportional to a value made by each other multiplying a value made by deducing, a value inversely proportional to the product of the frequency and the inductance value of the inductance element, from a value proportional to the product of the frequency and the capacitance value of the capacitive element, which is a value for determining the impedance of respective reactive loads of the first-stage phase rotator through the [2×n]th stage phase rotator.

The reactive load of the frequency dependent resistor according to this invention can be a series circuit including capacitive elements and inductance elements.

In the case where the reactive load is configured of a series circuit including a capacitive element and an inductance element, the value for determining the impedance of the reactive load is given as a value made by deducing a value inversely proportional to the product of the frequency and the capacitance value of the capacitive element from a value directly proportional to the product of the frequency and the inductance value of the inductance element.

Therefore, across the reactive load of the [2×n]th-stage phase rotator, a voltage having an amplitude proportional to a value made by each other multiplying a value made by deducing, a value inversely proportional to the product of the frequency and the capacitance value of the capacitive element, from a value directly proportional to the product of the frequency and the inductance value of the inductance element, which is a value for determining the impedance of respective reactive loads of the first-stage phase rotator through the [2×n]th stage phase rotator, is generated. This voltage is converted into a current, which is applied to the signal terminal or the signal terminal pair. The amplitude of this current is directly proportional to the voltage generated in the reactive load of the [2×n]th-stage phase rotator. As a result, the resistance value of the impedance of the frequency dependent resistor is inversely proportional to a value made by each other multiplying a value made by deducing, a value inversely proportional to the product of the frequency and the capacitance value of the capacitive element, from a value directly proportional to the product of the frequency and the inductance value of the inductance element, which is a value for determining the impedance of respective reactive loads of the first-stage phase rotator through the [2×n]th stage phase rotator.

The differential amplifier circuit or the voltage-current converter of the frequency dependent resistor according to the present invention can be configured of plural MOS transistors.

A resistance value of the frequency dependent resistor can be theoretically realized a high value responding to the frequency. In the case where the input impedance value of the phase rotator is low as compared with the calculating resistance value of the frequency dependent resistor, however, the phase of the current output from the phase rotator cannot be orthogonal to the voltage applied to the phase rotator. The gate input impedance of the MOS transistor is determined by a minuscule parasitic capacitance value in the gate section, and is large as compared with the base input impedance of the bipolar transistor. For this reason, the use of the MOS transistor advantageously contributes to the operation in a region where the calculating impedance between the signal terminals is high.

The reactive load of the frequency dependent resistor according to this invention can be configured of gyrator circuit.

In a semiconductor integrated-circuit, it is difficult to realize a high inductance value by means of the dimensions or the shape of the conductor. The use of a gyrator circuit as a reactive load, however, can increase the inductance value thereof by selecting a circuit constant, and thereby making it possible to realize a frequency dependent resistor with a large inductance value of each reactive load.

A voltage generated across the reactive load of the third-stage phase rotator or subsequent odd-numbered stage phase rotator of a cascade-connected circuit of the frequency dependent resistor according to this invention is converted into a current. The current is applied to the signal terminal or the signal terminal pair connected to the input section of the first-stage phase rotator. By which realizing a reactive load having a frequency characteristic different from that of the gyrator circuit is possible.

In a frequency dependent resistor according to this invention, we can apply a signal to the base of the bipolar transistors, which is essential parts of the differential amplifier circuit, through a buffer circuit connected to each of the input terminal pair of the differential amplifier circuit.

The buffer circuit has high entered impedance, and therefore, the input impedance of the differential amplifier circuit including the bipolar transistors can be increased by adding the buffer circuit thereto. As a result, a satisfactory orthogonality between the phase of the input voltage and the output voltage of a phase rotator can be maintained without adversely affecting the charge/discharge operation of the phase rotator in the preceding stage. Also, by using the buffer circuit, even when the calculating required input impedance value of the differential amplifier circuit is high, the operation of a physical circuit can follow, and by that permitting an operation over a wide frequency range.

According to still another aspect of the invention, a frequency dependent resistor comprises: a first resistor and a second resistor; end of the second resistor connected to one of the signal terminal pair of the first resistor, in which a signal is entered between the other signal terminal of the first resistor and the other end of the second resistor, and an output-signal is produced across the signal terminal pair of the first resistor or an end of the second resistor, and the first resistor include a cascade circuit in which plural phase rotators are connected in a cascade, a signal terminal pair connected to the input terminal pair of the first-stage phase rotator of the cascaded-connected circuit, and at least one voltage-current converter putting out a bidirectional AC current to the signal terminal pair from the output terminal pair of it responding to the voltage applied at one of input terminals from the even-numbered stage phase rotators as counted from the first-stage phase rotator of the cascade-connected circuit; each of the phase rotators has a voltage-current converter for putting out a bidirectional AC current from an output terminal pair of it responding to an AC voltage that applied to an input terminal pair of it, and a reactive load connected to the output terminal pair of the voltage-current converter; each of the phase rotators putting out a voltage generated in the reactive load responding to the voltage applied to the input terminal pair.

This form gets out an output signal respond to the ratio of the first resistor resistance value and the second resistor resistance value. Especially, in the case the second resistor is a fixed valued resistor element, the amplitude of the output signal value changes with frequency since the resistance value of the first resistor changes with frequency. The first resistor has a resistance characteristic within its operating region, by which the phase of the output signal of it does not change.

The second resistor can be this frequency dependent resistor according to the present invention. Generally, the first resistor and the second resistor are both required to have a positive resistance characteristic or a negative resistance characteristic.

A frequency dependent resistor according to this invention can further comprise a third resistor connected to the signal terminal pair.

We can produce an output signal responding to the ratio of the resistance value of a combined resistance of a parallel circuit that includes the first and the third resistor, and the resistance value of the second resistor. Especially, we assume the case that the second and the third resistor are fixed value resistors and that the first resistor value changes with frequency and becomes to an infinite large value. The output signal produced is determined by the ratio between the resistance value of the second resistor and the resistance value of the third resistor. Also, when the resistance value of the first resistor approaches zero, the signal produced is determined by the ratio between the resistance value of the first resistor and the resistance value of the second resistor.

According to a further aspect of the present invention, a frequency dependent resistor further comprises a pulse waveform shaping circuit connected to an end of the above-mentioned signal terminal pair.

In the case where a pulse signal containing high frequency noises is applied to the signal terminal, therefore, a binary signal free of noises can be produced at the output terminal of the pulse waveform shaping circuit.

According to a still further aspect of the present invention, a frequency dependent resistor comprises: a cascade-connected circuit in which plural phase rotators are connected in cascade; each of the phase rotators has a voltage-current converter putting out a reactive current from an output terminal pair responding to an applied voltage to an input terminal pair of it, and a resistive load connected to the output terminal pair of the voltage-current converter; each of the phase rotators puts out a voltage generated in the resistive load responding to the voltage applied to the input terminal pair: a signal terminal pair connected to the input terminal pair of the voltage-current converter of the cascade-connected circuit's first-stage phase rotator: and at least one voltage-current converter putting out a current to the signal terminal pair responding to the output voltage of even-numbered stage phase rotators as counted from the first-stage phase rotator of the cascade-connected circuit.

In this invention, the reactive current is a current with the characteristics of it controlled by the value of the imaginary part. Moreover, the resistive load is a load with the characteristics of it controlled by the value of the real part of the impedance.

A differential amplifier circuit with a reactive load connected between the emitters of a pair of transistors makes it possible to generate a reactive current from the collectors of the transistors responding to the voltage that is applied between the bases of the transistor pair. Thus, a voltage-current converter can be realized for converting the voltage applied to the input terminal pair to a reactive current.

In the resistive load of the first-stage phase rotator, it generates a voltage, and this voltage is 90 degrees out of a phase from the voltage applied to the input terminal pair of the first-stage phase rotator, i.e., the voltage applied to the signal terminal pair. When they apply this voltage to the second-stage phase rotator, they generate a voltage in the resistive load of the second-stage phase rotator, and the voltage is 90 degrees out of a phase from the voltage applied to the input terminal pair of the second-stage phase rotator. As a result, it generates a voltage in the resistive load of the second-stage phase rotator, and this voltage is 180 degrees out of a phase from the voltage applied to the signal terminal pair. In this way, it generates a voltage in the resistive load of the fourth-stage phase rotator, and the voltage is 360 degrees out of a phase from the voltage applied to the signal terminal pair. Further, it generates voltages in the resistive loads of the sixth-stage phase rotator and the eighth-stage phase rotator, respectively, and the voltages are 540 degrees and 720 degrees out of a phase from the voltage applied to the signal terminal pair. We convert the voltage generated in even-numbered stage phase rotators into a current, and this current is an identical or opposite phase to the phase of the particular voltage, and applied to the signal terminal pair. As a result, we feed a current back to the signal terminal pair, and a phase of this current is an identical or opposite to that of the voltage applied to the signal terminal pair.

Especially in the case where they are applied a voltage to the first signal terminal with respect to the second signal terminal, and they feed an opposite phase current back to the first signal terminal, a same current with the voltage flows into the frequency dependent resistor from the first signal terminal, and we obtain a positive resistance characteristic at the signal terminal.

According to a further aspect of the present invention, a frequency dependent resistor comprises: a cascade circuit in which plural phase rotators are connected in cascade; each of the phase rotators has a voltage-current converter for putting out a reactive current from an output terminal pair of it responding to a voltage applied an input terminal pair of it, and a resistive load connected to the output terminal pair of the voltage-current converter; each of the phase rotators puts out a voltage generated in the resistive load responding to the voltage applied to the input terminal pair: and a signal terminal pair connected to the input terminal pair of the voltage-current converter of the cascade-connected circuit's first-stage phase rotator, and the output current of the voltage-current converter of even-numbered stage phase rotators as counted from the cascade-connected circuit's first-stage phase rotator is supplied to the signal terminal pair.

In this form, when they feed bidirectional currents back to the signal terminal pair, the currents are identical and opposite phases to the phase of the voltage applied to the signal terminal pair, and by that realizing a frequency dependent resistor having a resistance characteristic.

The above and other objects, features and advantages will be made apparent by the detailed description taken in conjunction with the accompanying drawings.

BEST MODE FOR CARRYING OUT THE INVENTION

Embodiments of the present invention will be described below about FIGS. 1 to 29.

Embodiment 1

Figure 1:
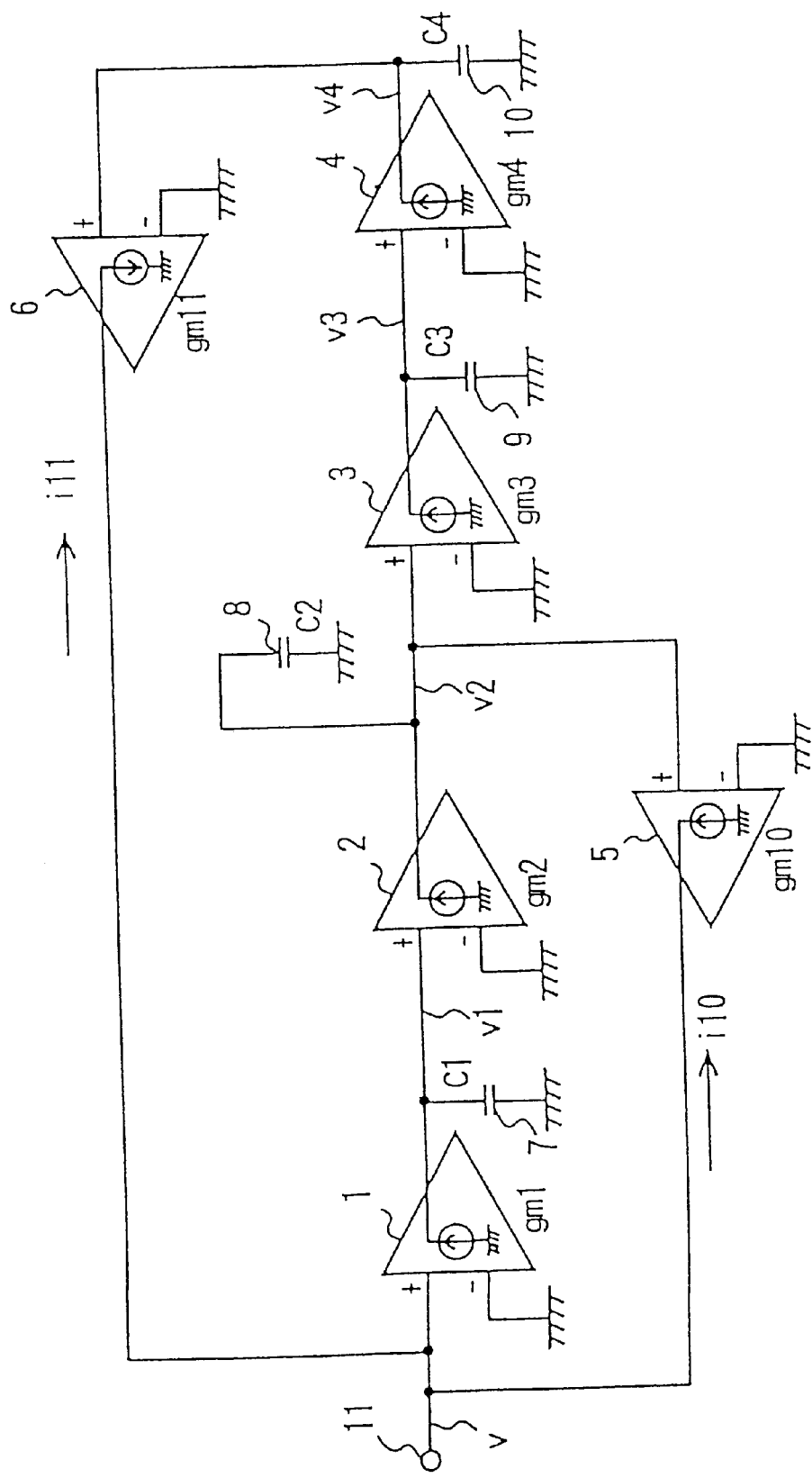
FIG. 1 shows a frequency dependent resistor according to the present invention.

A frequency dependent resistor according to the present invention is described about FIG. 1.

The frequency dependent resistor shown in FIG. 1 comprises voltage-current converters 1, 2, 3, 4, 5, 6, capacitors 7, 8, 9, 10, and a signal terminal 11. The voltage-current converter 1 and the capacitor 7 connected to the output terminal of the voltage-current converter 1 form a first-stage phase rotator; the voltage-current converter 2 and the capacitor 8 connected to the output terminal of the voltage-current converter 2 form a second-stage phase rotator; the voltage-current converter 3 and the capacitor 9 connected to the output terminal of the voltage-converter 3 form a third-stage phase rotator; and the voltage-current converter 4 and the capacitor 10 connected to the output terminal of the voltage-current converter 4 form a fourth-stage phase rotator.

The voltage-current converters 1, 2, 3, 4, 5, 6 convert a differential voltage between a voltage applied to the positive terminal and a voltage applied to the negative terminal into a current with the voltage applied to the negative terminal as a reference, and produce it as an output. The voltage-current converters 1, 2, 3, 4, 5 allow a current in a phase with the differential voltage to flow out of the output terminal of it when the differential voltage is positive; and allow a current in a phase with the differential voltage to flow into the output terminal when the differential voltage is negative. The voltage-current converter 6, on the other hand, allows a current in a phase with the differential voltage to flow into the output terminal of it when the differential voltage is positive; and allows a current in a phase with the differential voltage to flow out of the output terminal when the differential voltage is negative. The ratio of the output current to the differential voltage of the voltage-current converter is expressed as a current conversion rate gm; and the values of the current conversion rates of the voltage-current converters 1, 2, 3, 4, 5, 6 are defined as gm1, gm2, gm3, gm4, gm10, gm11, respectively.

The capacitors 7, 8, 9, 10 are a sort of reactive load and have the capacitance values of it defined as C1, C2, C3, C4, respectively. We generally give the impedance of the reactive load as $[+j \times X]$ or $[-j \times X]$. Let Zc be the impedance of the capacitor, and the impedance Zc is given by the following equation:

$$Zc = 1/(j \times \omega \times C) = -j/(\omega \times C) \tag{1}$$

Where j is an imaginary number, X is a reactance, $\omega$ is an angular frequency of the signal involved, and C is a capacitance value of the capacitor. The reactive load includes a capacitor, a coil, a combination circuit of a capacitor and a coil or the like, as described later.

Next, the operation of the frequency dependent resistor shown in FIG. 1 will be explained. The voltage and the current handled in the below description are assumed to be AC ones unless otherwise specified.

Assume that a current is fed back from the voltage-current converter 5 while no current is fed back from the voltage-current converter 6.

Upon application of a voltage v to the signal terminal 11, the voltage-current converter 1 is applied to the voltage v. The voltage-current converter 1 converts the applied voltage v into a current with the current conversion rate of gm1 for output. This current is supplied to the capacitor 7. The capacitor 7 is charged and generates a voltage v1 as expressed below.

$$v1 = v \times gm1/(j \times \omega \times C1) \tag{2}$$

This voltage v1 is applied to the voltage-current converter 2 of the second-stage phase rotator. The voltage-current converter 2 converts the applied voltage v1 into a current with the current conversion rate of gm2 for output. This current is supplied to the capacitor 8. The capacitor 8 is charged and generates a voltage v1 as expressed below.

$$v2 = v1 \times gm2/(j \times \omega \times C2) \tag{3}$$

This voltage v2 is applied to the voltage-current converter 5. The voltage-current converter 5 converts the applied voltage v2 into a current expressed by the following expression with the current conversion rate of gm10, for output from the output terminal thereof. Numeral i10 is defined as a current flowing from the signal terminal 11 toward the output terminal of the voltage-current converter 5.

$$-i10 = gm10 \times v2 \tag{4}$$

The impedance Zin2 that is impedance as seen inward from the signal terminal 11 is given as the ratio between the voltage applied to the signal terminal 11 and the current i10 flowing inward from the signal terminal 11, and is expressed by the following equation:

$$Zin2 = \omega^2 \times C1 \times C2 / (gm1 \times gm2 \times gm10) \quad (5)$$

As seen from this equation, the impedance Zin2 has no imaginary number. In other words, it is given as a resistor having a value determined by the square of ω, the capacitance values C1, C2, and the current conversion rates gm1, gm2, gm10.

Next, assume that a current is fed back from the voltage-current converter 6 and no current is fed back from the voltage-current converter 5.

As in the assumed case where a current is fed back from the voltage-current converter 5 and no current is fed back from the voltage-current converter 6, the voltage v2 given by equation (3) is generated across the capacitor 8.

This voltage v2 is applied to the voltage-current converter 3. The voltage-current converter 3 converts the applied voltage v2 into a current with the current conversion rate of gm3. This current is supplied to the capacitor 9. The capacitor 9 is thus charged, and a voltage v3 given by the following expression is generated across the capacitor 9.

$$v3 = gm3 \times v2 / (j \times \omega \times C3) \quad (6)$$

This voltage v3 is applied to the voltage-current converter 4. The voltage-current converter 4 converts the applied voltage v3 into a current with the current conversion rate of gm4 and puts out it. This current is supplied to the capacitor 10. As a result, the capacitor 10 is charged and a voltage v4 expressed by the following expression is generated across the capacitor 10.

$$v4 = gm4 \times v3 / (j \times \omega \times C4) \quad (7)$$

This voltage v4 is applied to the voltage-current converter 6. The applied voltage v4 is converted into a current expressed by the following expression with the current conversion rate of gm11 and the current is put out from the output terminal thereof. Numeral i11 is defined as a current flowing from the signal terminal 11 toward the output terminal of the voltage-current converter 6.

$$i11 = gm11 \times v4 \quad (8)$$

The impedance Zin4 that is impedance as seen inward from the signal terminal 11 is given as the ratio between the voltage applied to the signal terminal 11 and the current i11 flowing inward from the signal terminal 11, and expressed by the following equation:

$$Zin4 = \omega^4 \times C1 \times C2 \times C3 \times C4 / (gm1 \times gm2 \times gm3 \times gm4 \times gm11) \quad (9)$$

As seen from this equation, the impedance Zin4 is given as a resistor; and the value of it is determined by the fourth power of ω, the capacitance values C1, C2, C3, C4, and the current conversion rates gm1, gm2, gm3, gm4, gm11.

Further, assuming that a current is fed back from the voltage-current converters 5 and 6, the current passing through the signal terminal 11 is given as the sum of i10 and i11. Thus, the impedance Zin that is impedance as seen inward from the signal terminal 11 is given as a parallel connection of Zin2 and Zin4, and expressed by the following equation:

$$Zin = \{(Zin2)^{-1} + (Zin4)^{-1}\} \quad (10)$$

Therefore, the impedance Zin changes with the square and the fourth power of the frequency. Normally, a positive impedance (Zin>0) is employed.

Embodiment 2

Another frequency dependent resistor according to this invention will be explained with reference to FIG. 2.

Figure 2:
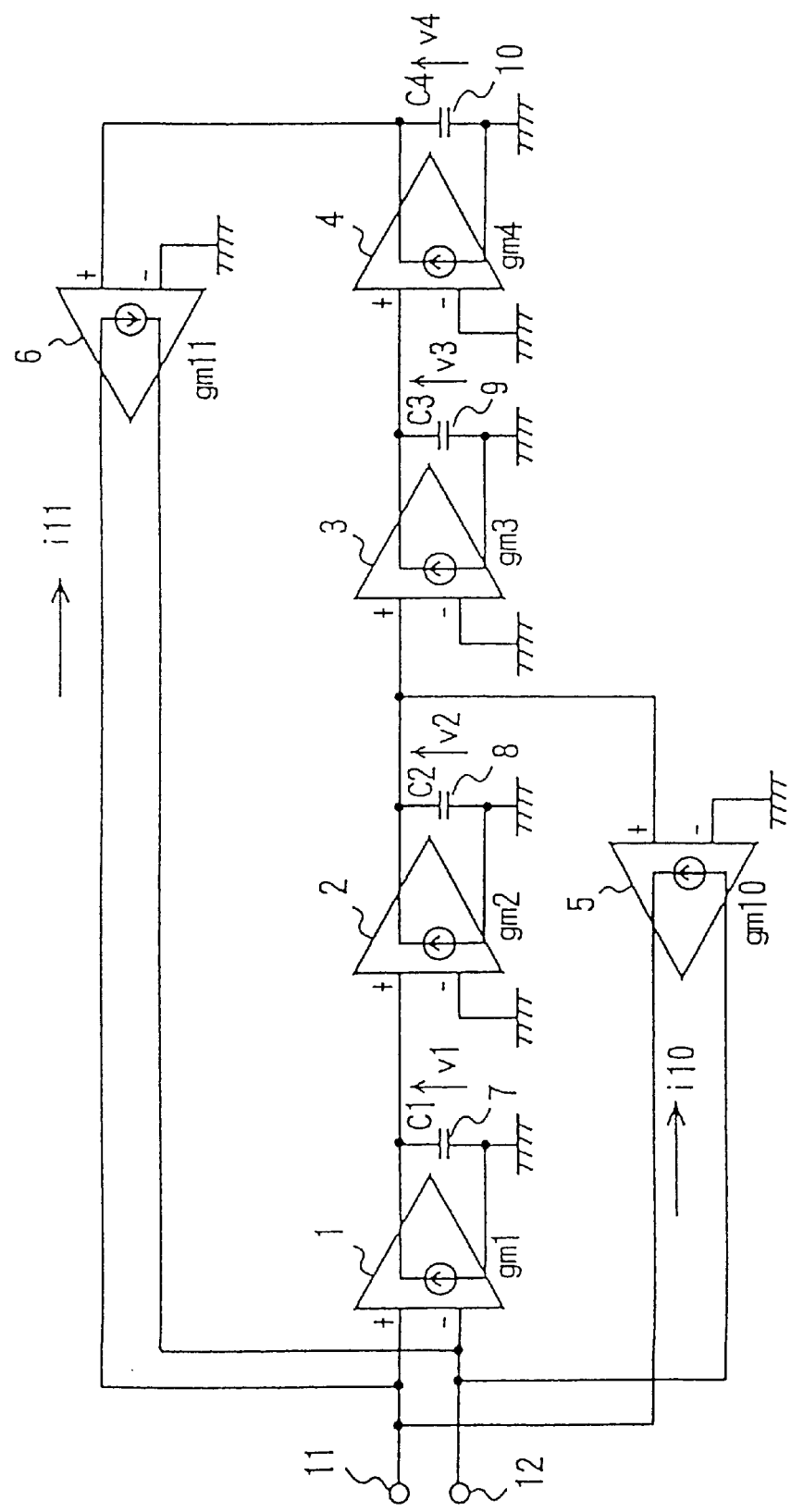
FIG. 2 shows another frequency dependent resistor according to this invention.

The frequency dependent resistor shown in FIG. 2 comprises voltage-current converters 1, 2, 3, 4, 5, 6, capacitors 7, 8, 9, 10, and signal terminals 11, 12. The voltage-current converter 1 and the capacitor 7 connected across an output terminal pair of the voltage-current converter 1 form a first-stage phase rotator; the voltage-current converter 2 and the capacitor 8 connected across an output terminal pair of the voltage-current converter 2 form a second-stage phase rotator; the voltage-current converter 3 and the capacitor 9 connected across an output terminal pair of the voltage-current converter 3 form a third-stage phase rotator; and the voltage-current converter 4 and the capacitor 10 connected across an output terminal pair of the voltage-current converter 4 form a fourth-stage phase rotator. The voltage-current converters 1, 2, 3, 4, 5, 6, and the capacitors 7, 8, 9, 10, which have already been explained about FIG. 1, will be not described again.

Next, the operation of the frequency dependent resistor shown in FIG. 2 will be described. In the description below, assume that the voltage and current are A.C. ones.

Also assume that a current is fed back from the voltage-current converter 5 and no current is fed back from the voltage-current converter 6.

When a voltage v is applied to the signal terminal 11 with respect to the signal terminal 12, the voltage v is applied between the input terminals of the voltage-current converter 1. The voltage-current converter 1 converts this voltage v into a current with the current conversion rate of gm1, for outputs bidirectional current from the output terminal pair. This current is supplied to the capacitor 7, so that a voltage v1 expressed by the following expression is generated across the capacitor 7.

$$v1 = v \times gm1 / (j \times \omega \times C1) \quad (11)$$

This voltage v1 is applied between the input terminals of the voltage-current converter 2. The voltage-current converter 2 converts the voltage v1 into a bidirectional current with the current conversion rate of gm2, and puts out it. This current is supplied to the capacitor 8, and a voltage v2 given by the following expression is generated across the capacitor 8.

$$v2 = v \times gm2 / (j \times \omega \times C2) \quad (12)$$

This voltage v2 is applied between the input terminals of the voltage-current converter 5. The voltage-current converter 5 converts the applied voltage v2 into a current expressed by the following expression with the current conversion rate of gm10, for output from the output terminal pair. Numeral i10 is defined as a current flowing from the signal terminal 11 toward one output terminal of the voltage-current converter 5; and defined as a current flowing from the other output terminal toward the signal terminal 12.

$$i10 = gm10 \times v2 \quad (13)$$

The impedance Zin22 that is impedance as seen inward from the signal terminals 11, 12 is given as the ratio between the voltage applied to the signal 11 with respect to the signal terminal 12 and the current flowing inward from the signal terminal 11 and further toward the signal terminal 12, and is expressed by the following equation:

$$Zin22 = \omega^2 \times C1 \times C2 / (gm1 \times gm2 \times gm10) \quad (14)$$

As seen from this equation, the impedance Zin22 is given as a resistor lacking an imaginary number and is determined the square of ω, the capacitance values C1, C2, and the current conversion rates gm1, gm2, gm10.

Next, assume that a current is fed back from the voltage-current converter 6 and no current is fed back from the voltage-current converter 5.

As in the assumed case where a current is fed back from the voltage-current converter 5 and no current is fed back from the voltage-current converter 6, the voltage v2 given by equation (12) is generated across the capacitor 8.

This voltage v2 is applied between the input terminals of the voltage-current converter 3. The voltage-current converter 3 converts the applied voltage v2 into a bidirectional current with the current conversion rate of gm3, and puts out it. This current is supplied to the capacitor 9, and a voltage v3 expressed by the following expression is generated across the capacitor 9.

$$v3 = gm3 \times v2/(j \times \omega \times C3) \quad (15)$$

This voltage v3 is applied between the input terminals of the voltage-current converter 4. The voltage-current converter 4 converts the applied voltage v3 to a bidirectional current with the current conversion rate of gm4, and puts out it. This current is supplied to the capacitor 10, and a voltage v4 given by the following expression is generated across the capacitor 10.

$$v4 = gm4 \times v3/(j \times \omega \times C4) \quad (16)$$

This voltage v4 is applied between the input terminals of the voltage-current converter 6, and converted into a current i11 expressed by the following expression with the current conversion rate of gm11. The current is withdrawn into one output terminal from the signal terminal 11 and supplied toward the signal terminal 12 from the other output terminal.

$$i11 = gm11 \times v4 \quad (17)$$

The impedance Zin24 that is impedance as seen inward from the signal terminals 11, 12 is given as the ratio between the voltage applied to the signal terminal 11 with respect to the signal terminal 12 and the current flowing inward from the signal terminal 11 and toward the signal terminal 12, and is expressed by the following equation:

$$Zin24 = \omega^4 \times C1 \times C2 \times C3 \times C4/(gm1 \times gm2 \times gm3 \times gm4 \times gm11) \quad (18)$$

As seen from this equation, the impedance Zin24 is given as a resistance lacking an imaginary number. The impedance is determined by the fourth power of ω, the capacitance values C1, C2, C3, C4 and the current conversion rates gm1, gm2, gm3, gm4, gm11.

Further, assuming that a current is fed back from the voltage-current converters 5 and 6, the current fed back to the signal terminal 11 is the sum of both current i10 and i11. The impedance Zin that is impedance as seen inward from the signal terminals 11, 12 is given by the following equation:

$$Zin = \{(Zin22)^{-1} + (Zin24)^{-1}\}^{-1} \quad (19)$$

Therefore, the impedance Zin changes with the square and the fourth power of the frequency.

Embodiment 3

Another frequency dependent resistor according to this invention will be explained with reference to FIG. 3.

Figure 3:
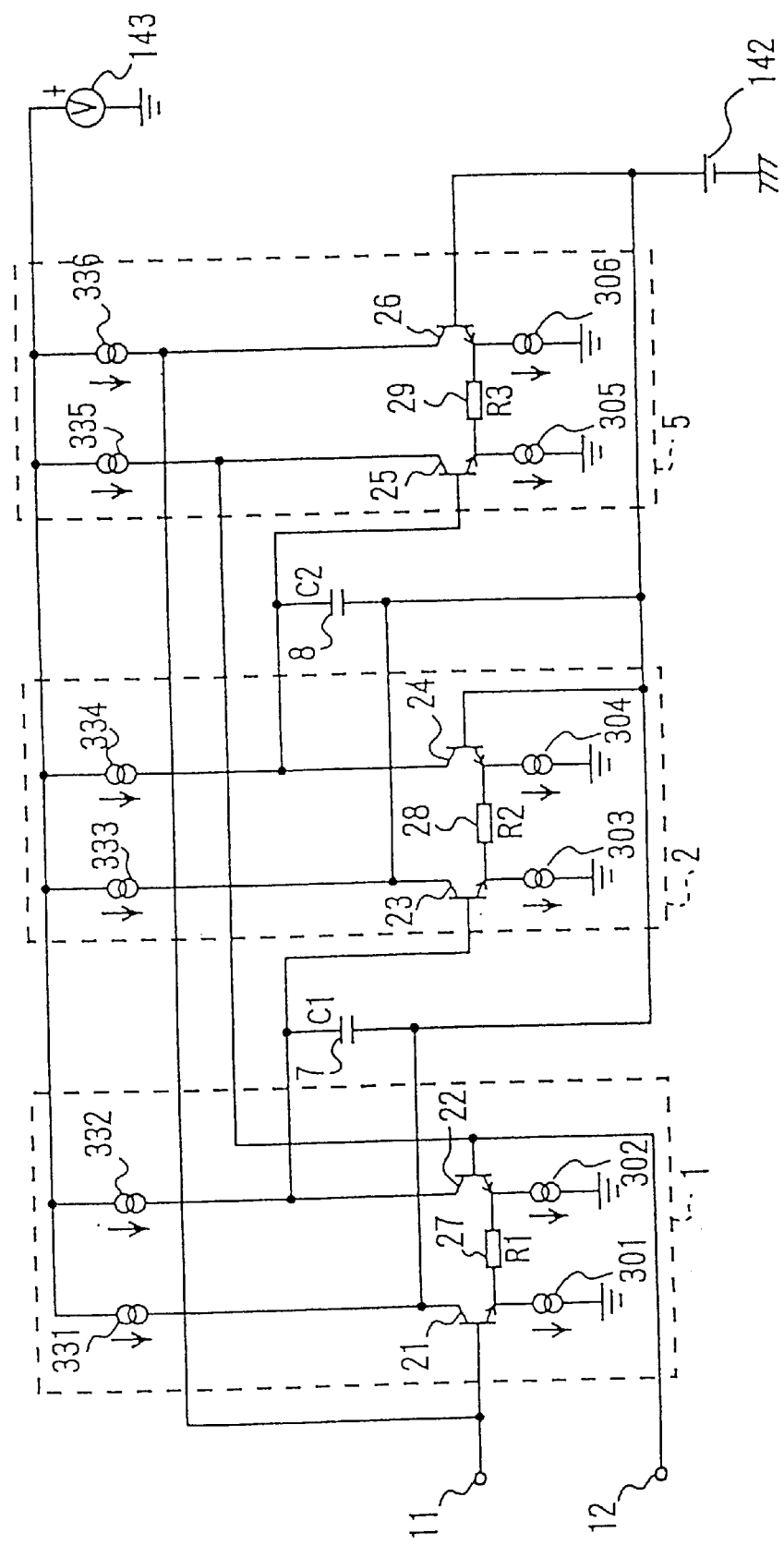
FIG. 3 shows a circuit configuration of a frequency dependent resistor according to this invention.

The frequency dependent resistor shown in FIG. 3 comprises transistors 21, 22, 23, 24, 25, 26; capacitors 7, 8; resistors 27, 28, 29; current sources 301, 302, 303, 304, 305, 306, 331, 332, 333, 334, 335, 336; voltage sources 142, 143; and signal terminals 11, 12.

The voltage-current converter 1 is by a differential amplifier circuit that comprises the transistors 21, 22; the resistor 27 connected between the emitters of the transistors 21 and 22; the current source 301 connected between the emitter of the transistor 21 and the ground; the current source 302 connected between the emitter of the transistor 22 and the ground; the current source 331 connected between the collector of the transistor 21 and the voltage source 143; and the current source 332 connected between the collector of the transistor 22 and the voltage source 143. This voltage-current converter 1 and the capacitor 7 connected between the collectors of the transistors 21 and 22 form a first-stage phase rotator. The base of the transistor 21 of the first-stage phase rotator is connected with the signal terminal 11, and the base of the transistor 22 is connected with the signal terminal 12. The voltage-current converter 2 is by a differential amplifier circuit that comprises the transistors 23, 24; the resistor 28 connected between the emitters of the transistors 23 and 24; the current source 303 connected between the emitter of the transistor 23 and the ground; the current source 304 connected between the emitter of the transistor 24 and the ground; the current source 333 connected between the collector of the transistor 23 and the voltage source 143; and the current source 334 connected between the collector of the transistor 24 and the voltage source 143. The voltage-current converter 2 and the capacitor 8 connected between the collectors of the transistors 23 and 24 form a second-stage phase rotator. The voltage-current converter 5 is by a differential amplifier circuit that comprises the transistors 25, 26; the resistor 29 connected between the emitters of the transistors 25 and 26; the current source 305 connected between the emitter of the transistor 25 and the ground; the current source 306 connected between the emitter of the transistor 26 and the ground; the current source 335 connected between the collector of the transistor 25 and the voltage source 143; and the current source 336 connected between the collector of the transistor 26 and the voltage source 143.

The current conversion rate of the voltage-current converter is given as the reciprocal of the sum of; the emitters resistance of the pair of the transistors of the differential amplifier circuit forming each voltage-current converter; and the resistance of the resistor connected between the emitters of the transistor pair of the differential amplifier circuit. When a current of 1 mA flow in each transistor of the differential amplifier circuit, the value of each emitter resistance is about 26 Ω; which is sufficiently small as compared with the resistance values of the resistors 27, 28, 29. Therefore, the current conversion rate of each voltage-current converter is approximately given by the reciprocal of the resistance value of the resistor connected between each pair of emitters. The resistance values of the resistors 27, 28 and 29 are defined as R1, R2 and R3, respectively. When the value of the voltage-current conversion rate gm of the voltage-current converter 1 of the first-stage phase rotator is defined as gm1; the value of the voltage-current conversion rate gm of the voltage-current converter 2 of the second stage phase rotator is defined as gm2; and the value of the voltage-current conversion rate gm of the voltage-current converter 5 is defined as gm10; and gm1, gm2 and gm10 are given by the following equations, respectively.

$$gm1 = 1/R1 \quad (20)$$

$$gm2 = 1/R2 \quad (21)$$

$$gm10 = 1/R3 \quad (22)$$

By reducing the current flowing in the transistors, increasing the emitter resistance value inversely proportionally is possible. By that, we can differentiate the current conversion rates of the respective voltage-current converters in an area not negligible for the resistor 27, 28 or 29.

Figure 25:
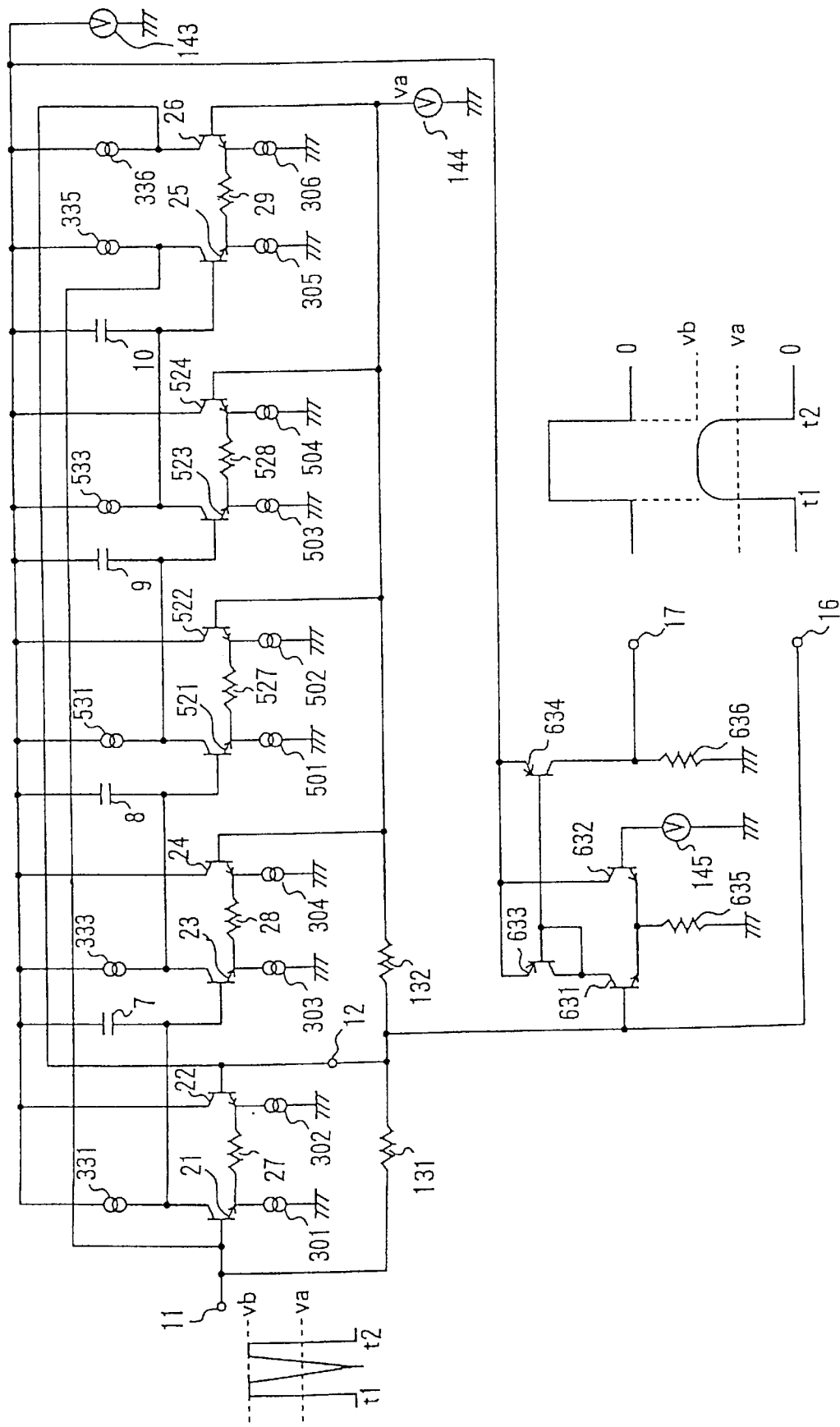
FIG. 25 shows a circuit configuration of still another frequency dependent resistor according to the present invention.

The conditions, which are required for realizing an ideal voltage-current converter, are that the current amplification factor $h_{FE}$ that is the ratio of the collector current to the base current of each transistor is infinitely large; and the Early effect for determining the values of the collector voltage and the collector current of the transistor dependently is negligibly small about operation. When the current amplification factor $h_{FE}$ of a transistor is finite, the sum of both the current values; of the current source connected to the collector of the transistor; and of the base current of the same transistor, is required to be set as a current value of the current source connected to the emitter of the same transistor. Also, in the case that the influence of the Early effect is present, the Early effect can be reduced by processing a comparatively small signal. Often, however, an ideal voltage-current converter cannot be realized due to the variation in the characteristic with the temperature and so on. In such a case, provision of a feedback loop taking the DC voltage and the DC current into consideration can avoid the oscillatory operation. Specifically, when a signal source having an impedance of a positive characteristic is connected outside the signal terminals 11 or 12, we form a negative feedback loop; that gives a DC current flow into the frequency dependent resistor from one signal terminal in response to the DC voltage applied thereto concerning the other signal terminal. By doing so, a stable operation can be obtained for the DC voltage and the DC current even in the case where the operating voltage undergoes a fluctuation. Here, when we get in the frequency dependent resistor having a resistance of the same positive characteristic as the characteristic of an external signal source, as shown in FIG. 25 later, the number of the phase rotators is required to be set to an integer multiple of four. When a signal source having an impedance of negative characteristic is connected to the signal terminals 11 or 12, in contrast, the number of the phase rotators is required to be set to an integer multiple of four less two.

When the DC current value of the current source for charging/discharging the capacitor is small as compared with the capacitor value, a new phase delay develops due to the time required for charge/discharge. The oscillation conditions may be affected when this phase delay is added to the feedback current The oscillation frequency appears with comparatively low frequency with an increase of number of phase rotators connected in cascade. Setting the DC current value of each current source at a high level is therefore desirable.

When we apply a fixed voltage to an end each of the capacitors 7, 8 and to the bases of the transistors 24 and 26, the collectors of the transistors 21 and 23 are supplied with a current from the voltage source 142. Therefore, to supply current from the current sources 331, 333 is not need.

The operation of the circuit shown in FIG. 3 will be explained below.

Upon application of a voltage between the signal terminals 11, 12, a current is supplied to the capacitor 7, so that a voltage of 90 degrees out of a phase from the voltage applied to the signal terminal pair is generated across the capacitor 7. The voltage generated across the capacitor 7 is applied to the bases of the transistors 23, 24, and a current is supplied to the capacitor 8. Therefore, a voltage of 90 degrees out of a phase from the voltage generated across the capacitor 7 is generated across the capacitor 8. Consequently, a voltage of 180 degrees out of a phase from the voltage applied to the signal terminal pair is generated across the capacitor 8. The voltage generated across the capacitor 8 is applied to the bases of the transistors 25 and 26, so that a current is supplied to the signal terminals 11, 12 from the collectors of the transistors 25, 26, respectively. In response to the voltage applied to the signal terminal 11 with respect to the signal terminal 12, a current of the same phase flows into the frequency dependent resistor from the signal terminal 11. The current flows out toward the signal terminal 12. Thus, a positive resistance characteristic is obtained for the signal terminal pair.

An equilibrium of operation is obtained by setting the DC potential or the average potential of the voltages applied to the signal terminals 11 and 12, to a substantially equal level. By that, to realize a frequency dependent resistor operating in a wide dynamic range is possible.

Embodiment 4

Still another frequency dependent resistor according to this invention will be explained with reference to FIGS. 4 and 5.

Figure 4:
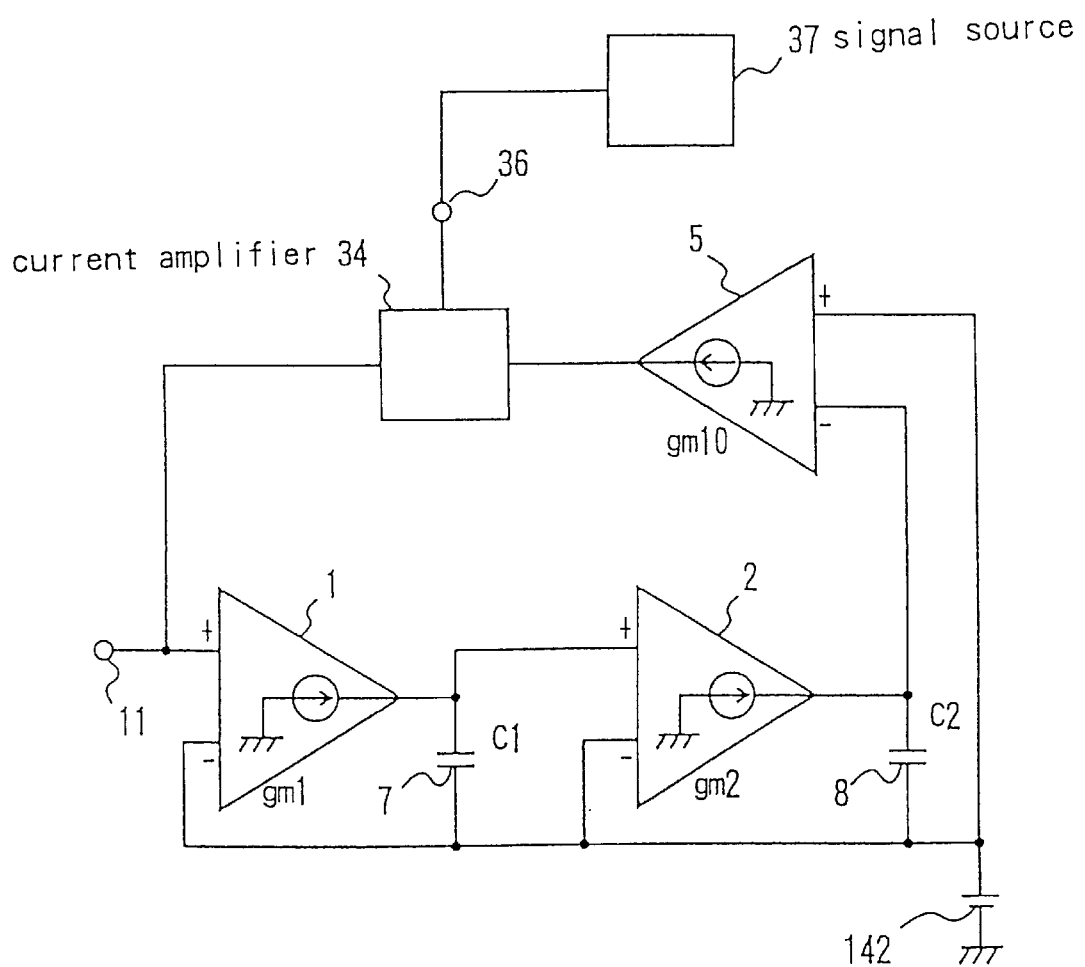
FIG. 4 shows still another frequency dependent resistor according to this invention.
Figure 5:
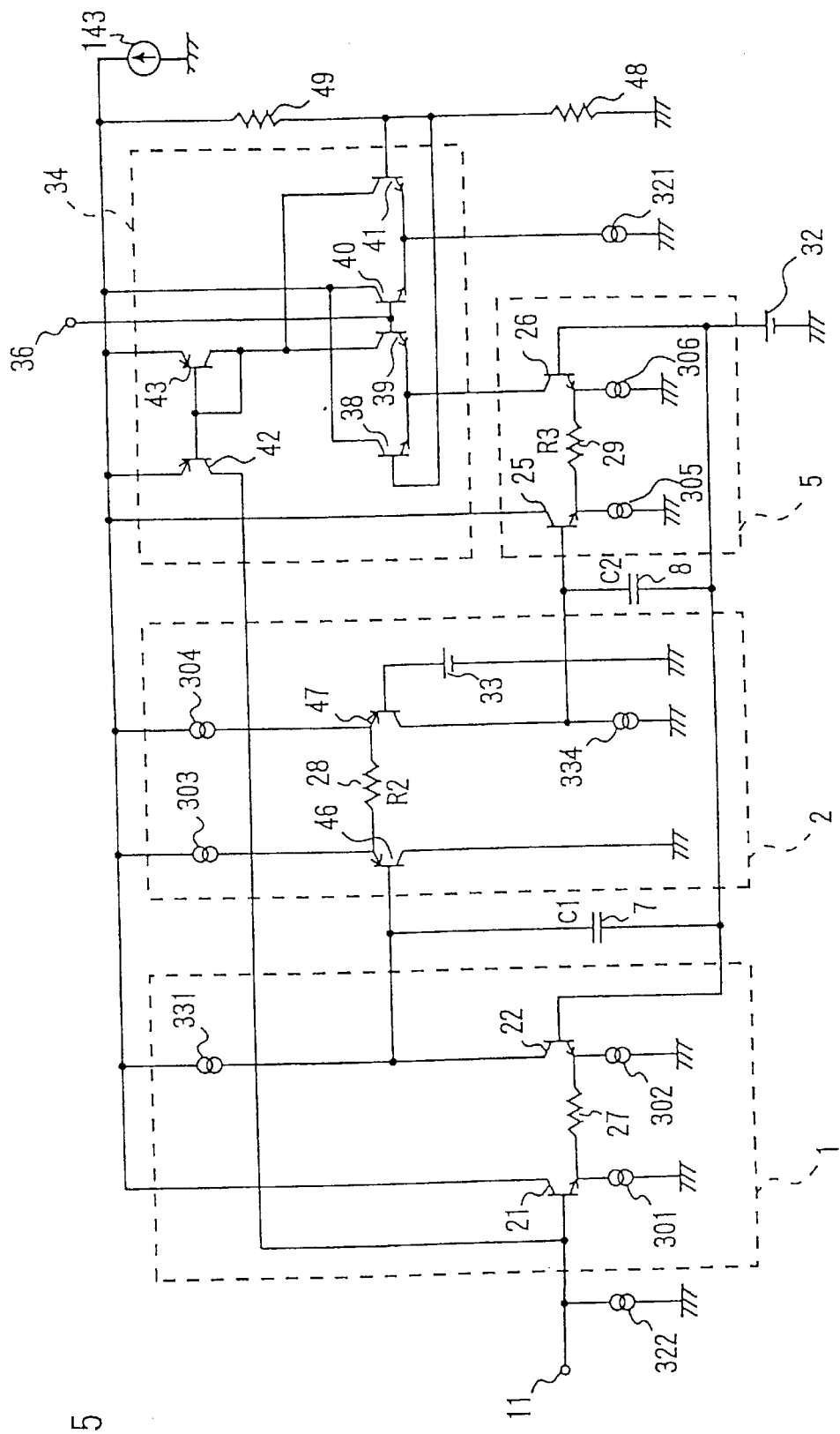
FIG. 5 shows a circuit configuration of the frequency dependent resistor shown in FIG. 4.

The frequency dependent resistor shown in FIG. 4 comprises voltage-current converters 1, 2, 5, capacitors 7, 8, a current amplifier 34, a voltage source 142, and signal terminals 11, 36. The voltage-current converter 1 and the capacitor 7 connected to the output terminal pair of the voltage-current converter 1 form a first-stage phase rotator; and the voltage-current converter 2 and the capacitor 8 connected to the output terminal pair of the voltage-current converter 2 form a second-stage phase rotator.

The current amplifier 34 amplifies the current supplied from the voltage-current converter 5 responding to the signal input from the signal terminal 36, and applies the amplified signal to the signal terminal 11. The current amplification factor of the current amplifier 34 changes with the signal applied from an external signal source 37 to the signal terminal 36. As the signal to be supplied from an external source to the signal terminal 36, an AC electrical signal, a detected electrical signal, a DC voltage or a DC current is provided. When an AC electrical signal is applied to the signal terminal 36, for example, the current amplification factor is determined by the phase or the amplitude of the AC electrical signal. The other component elements are identical to those explained with reference to FIG. 1, respectively, and will not be described again.

The impedance that is impedance as seen inward from the signal terminal 11 is determined by the ratio between the voltage applied to the signal terminal 11 and the current flowing inward from the signal terminal 11. This current can be changed by the signal applied to the signal terminal 36, and therefore, the impedance that is impedance as seen inward from the signal terminal 11 can be changed accordingly.

When a frequency dependent resistor is fabricated in a semiconductor integrated-circuit devices, the variations in resistance and capacitance values due to the error of setting the conditions in the diffusion process. The resistance variations with temperature cause the deviation of the resistance value of the frequency dependent resistor from a predetermined value. A signal is sometimes required from an external source to absorb this error. Here, we can stabilize the resistance to a predetermined value by a method that we apply a DC voltage or the like to the signal terminal 36 responding to the measured resistance value; we detect automatically the product of the resistance value and the capacitance value electrically and apply a DC voltage or the like to the signal terminal 36 responding to the value thus detected. In the former method, the functions of comparison and judgement are done by a computer. The latter method is realized by a feedback circuit having a phase comparator circuit built therein. For these techniques, refer to the Japanese Patent Number 2517048 entitled "Filtered frequency control apparatus". Specifically, it comprises the first and second series resonance circuits that include a resistor with an end of it supplied a video signal, an inductive load and a capacitive load connected in series to the resistor; a detection circuit for comparing the phase of the video signal with that of the junction point's signal of the inductive load and the series resonance circuits' capacitive load responding to the pulse signal input corresponding to the period of the burst signal included in the video signal, and detecting the phase difference between the two signals; a smoothing circuit that smooths the error output of the detection circuit; and a control circuit for changing the inductive load or the capacitive load for both the first and second series resonance circuits responding to the output signal of the smoothing circuit, and controlling the phase difference detected by the detection circuit to approach a predetermined phase difference. The output signal produced from the smoothing circuit can be expressed using a resistance value and a capacitive load by configuring the inductive load of a gyrator circuit. Applying this output signal to the signal terminal 36 instead of the second series resonance circuit, the resistance value of the frequency dependent resistor can approach to a predetermined value responding to the frequency of the burst signal.

Next, a specific circuit form of the frequency dependent resistor shown in FIG. 4 will be explained with reference to FIG. 5.

The frequency dependent resistor comprises transistors 21, 22, 25, 26, 38, 39, 40, 41, 42, 43, 46, 47; capacitors 7, 8; resistors 27, 28, 29, 48, 49; current sources 301, 302, 303, 304, 305, 306, 321, 322, 331, 334; voltage sources 32, 33, 143; and signal terminals 11, 36.

A voltage-current converter 1 is by a differential amplifier circuit that comprises the transistors 21, 22; the resistor 27 connected between the emitters of the transistors 21 and 22; the current source 301 connected between the emitter of the transistor 21 and the ground; the current source 302 connected between the emitter of the transistor 22 and the ground; and the current source 331 connected between the collector of the transistor 22 and the voltage source 143. The voltage-current converter 1 and the capacitor 7 connected to the collector of the transistor 22 form a first-stage phase rotator. The base of the transistor 21 of the first-stage phase rotator is connected with the signal terminal 11. A voltage-current converter 2 is by a differential amplifier circuit that comprises the transistors 46, 47; the resistor 28 connected between the emitters of the transistor 46 and 47; the current source 303 connected between the emitter of the transistor 46 and the voltage source 143; the current source 304 connected between the emitter of the transistor 47 and the voltage source 143; the current source 334 connected between the collector of the transistor 47 and the ground; and the voltage source 33 connected to the base of the transistor 47. The voltage-current converter 2 and the capacitor 8 connected to the collector of the transistor 47 form a second-stage phase rotator. Further, a voltage-current converter 5 is by a differential amplifier circuit that comprises the transistors 25, 26; the resistor 29 connected between the emitters of the transistors 25 and 26; the current source 305 connected between the emitter of the transistor 25 and the ground; and the current source 306 connected between the emitter of the transistor 26 and the ground. The transistors 38, 39, 40, 41, 42, 43 form a current amplifier 34. The emitters of the transistors 38, 39 are connected in common to the collector of the transistor 26, and the emitters of the transistors 40 and 41 are connected in common to an end of the current source 321. The other end of the current source 321 is connected to the ground.

A voltage is applied to the signal terminal 36 connected to the bases of the transistors 39, 40 with the base voltages of the transistors 38, 41 as a reference. Responding to the voltage applied to the signal terminal 36, the mixture ratio, between the current supplied from the collector of the transistor 26 of the voltage-current converter 5 and the current supplied from the current source 321, changes responding to the voltage applied to the signal terminal 36. The collector currents of the transistors 39, 40 are transmitted to the signal terminal 11 by the transistors 43, 42. Therefore, the signal applied to the signal terminal 36 permits the impedance of the frequency dependent resistor to control. The current sources 305, 306, 321, 322 are assumed to supply a current of an about equal value.

Embodiment 5

A frequency dependent resistor having a positive resistance characteristic was explained with reference to FIGS. 1 to 5. A frequency dependent resistor, however, has a positive resistance characteristic in some cases and a negative resistance characteristic in other cases; and according by the frequency dependent resistor having a positive resistance characteristic and the frequency dependent resistor having a negative resistance characteristic will be described below in the order.

The frequency dependent resistor having a positive resistance characteristic is shown in FIGS. 1 to 5. This frequency dependent resistor was already explained in relation to the voltage phase change in the third embodiment about FIG. 3. The explanation is omitted by that.

Next, the frequency dependent resistor having a negative resistance characteristic will be explained with reference to FIG. 6.

Figure 6:
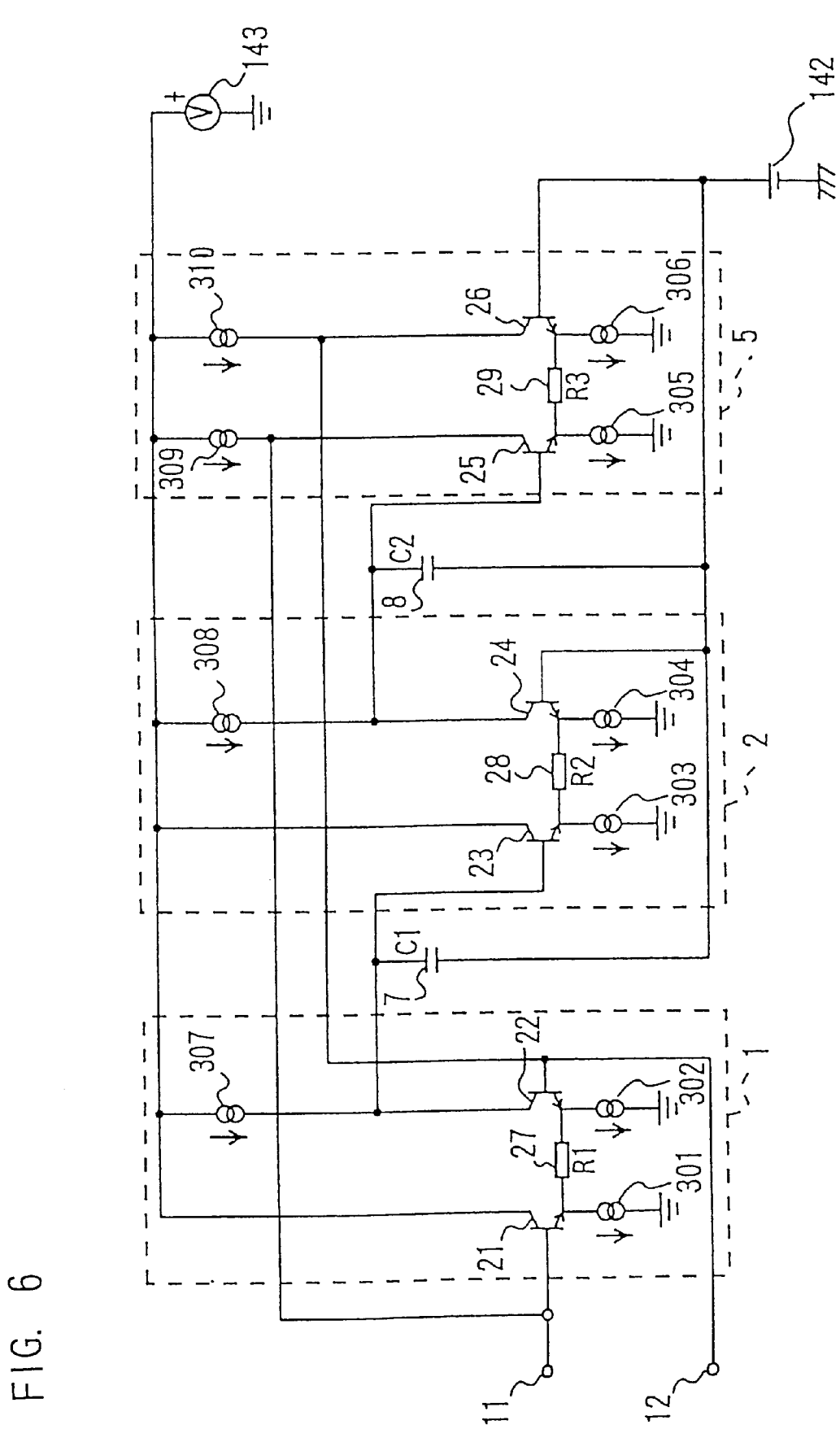
FIG. 6 shows a circuit configuration of another frequency dependent resistor according to the invention.

The frequency dependent resistor shown in FIG. 6 comprises capacitors 7, 8; transistors 21, 22, 23, 24, 25, 26; resistors 27, 28, 29; current sources 301, 302, 303, 304, 305, 306, 307, 308, 309, 310; voltage sources 142, 143; and signal terminals 11, 12.

The difference in configuration between FIGS. 3 and 6 lie in that the collectors of the transistors 25, 26 are connected with the signal terminals 11, 12 in opposite ways to each other.

The junction point between the collector of the transistor 24 and the capacitor 8 develops a voltage, that is 180 degrees out of a phase from the voltage applied across the signal terminals 11, 12, when we apply a voltage to the signal terminal 11 with the signal terminal 12 as a reference. When this voltage was applied to the base of the transistor 25, a current of an opposite phase to the voltage applied to the base of the transistor 25, i.e., a current in a phase with the voltage applied to the signal terminals 11, 12, is supplied to the signal terminal 11 from the junction point between the collector of the transistor 25 and the current source 309. On the other hand, a current in a phase to the voltage applied to the base of the transistor 25, i.e., a current of an opposite phase to the voltage applied to the signal terminal pair, is supplied to the signal terminal 12 from the junction point between the collector of the transistor 26 and the current source 310. Therefore, a negative resistance characteristic is obtained at the signal terminals 11, 12.

Embodiment 6

The foregoing description concerns the case in which a capacitor is used as a reactive load. The reactive load besides the capacitor, however, is a coil; a parallel circuit including a capacitor and a coil; a series circuit including a capacitor and a coil; also the like combination. Accordingly a frequency dependent resistor using them will be described below.

First, a case in which a capacitor is used as a reactive load is shown in FIGS. 1 to 6. The description was made above about this case with reference to FIG. 1. Since the configuration and operation of FIG. 1 were already explained, the description will be limited to an assumed case in which a current is fed back from the voltage-current converter 5 and no current is fed back from the voltage-current converter 6.

When the capacitance values of the capacitors 7 and 8 are defined as C1 and C2, respectively, the impedances ZC1 and ZC2 of the capacitors 7 and 8 are given by the following equation, respectively.

$$ZC1=1/(j\times\omega\times C1) \quad (23)$$

$$ZC2=1/(j\times\omega\times C2) \quad (24)$$

The impedance Zin that is impedance as seen inward from the signal terminal 11 is given by the following equation:

$$Zin=\omega^2\times C1\times C2/(gm1\times gm2\times gm10) \quad (25)$$

The frequency dependent resistor thus has a resistance characteristic which is directly proportional to the product of the square of $\omega$, the capacitance value C1 and the capacitance value C2, and inversely proportional to the product of the current conversion rates gm1, gm2, gm10.

The capacitors 7, 8 are of a sort of capacitive load; as the capacitive loads besides the capacitor, there are variable-capacitance diode, capacitance circuit including combination of a transistor and a capacitor for increasing or decreasing the capacitance value equivalently, and variable impedance circuit. The capacitance value across the variable-capacitance diode can be changed responding to the DC voltage applied across the diode. The capacitance circuit, on the other hand, can achieve a high capacitance value as shown in the Japanese Patent Number 2039606. Also, as shown by the U.S. Pat. No. 5,012,201, the variable impedance circuit to change of the capacitance value can be made by voltage applied thereto from outside.

The capacitance circuit disclosed in the Japanese Patent Number 2039606 will be described. Gyrator circuits are connected directly in two stages, and the output terminal of the second stage is connected with a capacitive element. This form can produce a capacitance characteristic between the input terminals of the gyrator circuit in the first stage. Each gyrator circuit is configured by two differential amplifier circuits. We obtain a capacitance value proportional to the ratio; that is a ratio between the products of the current amplification factors that are both of the respective differential amplifier circuits of the first-stage and the second-stage gyrator circuit, proportional to the capacitance value of the capacitive element connected to the output terminal of the second-stage. Since each current amplification factor is inversely proportional to the value of the resistor connected between the emitters of the differential amplifier circuits, the newly obtained capacitance value can be increased or decreased by selecting this resistance value.

The variable impedance circuit disclosed in the U.S. Pat. No. 5,012,201 will be described. This variable impedance circuit has a first differential amplifier circuit including a pair of input terminals, a pair of output terminals, and a capacitive element connected between a pair of transistors; a resistive load connected between the output terminals of the first differential amplifier circuit; and a second differential amplifier circuit including a pair of input terminals and a pair of output terminals. The output terminal pair of the first differential amplifier circuit is connected to the input terminal pair of the second differential amplifier circuit. The output terminal pair of the second differential amplifier circuit is connected to the input terminal pair of the first differential amplifier circuit. In this way, a capacitance characteristic directly proportional to the capacitance value of this capacitive element is obtained between the input terminals of the first differential amplifier circuit.

Next, a frequency dependent resistor using a coil as a reactive load will be described with reference to FIG. 7.

Figure 7:
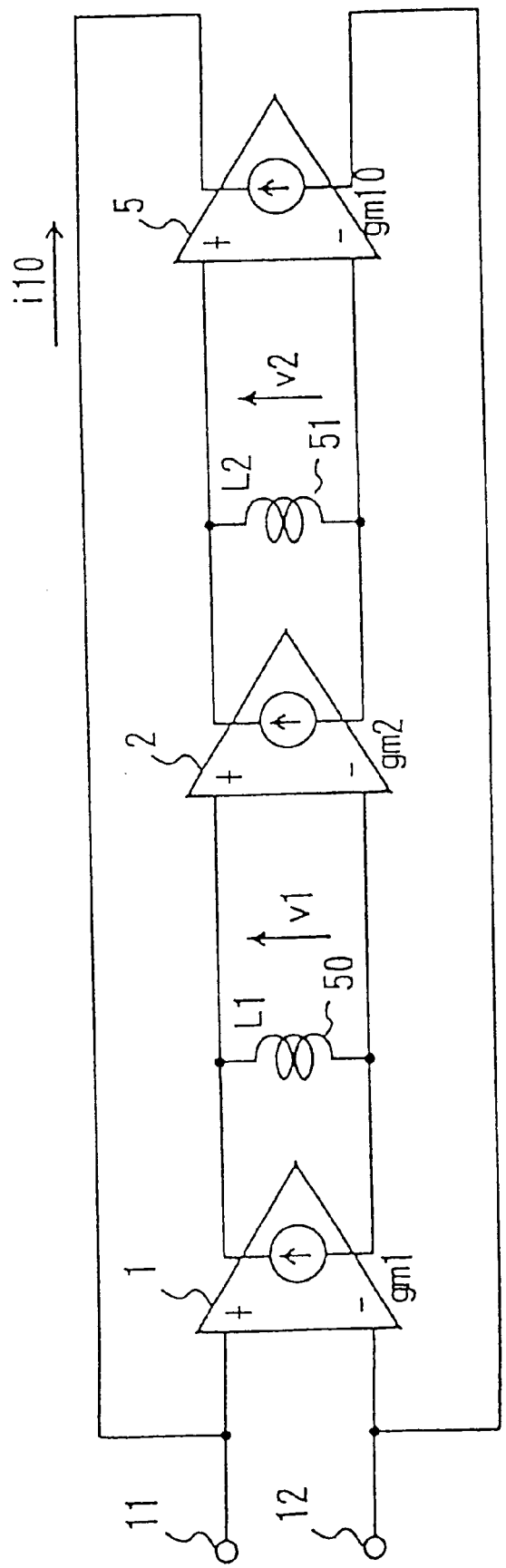
FIG. 7 shows another frequency dependent resistor according to the present invention.

The frequency dependent resistor shown in FIG. 7 comprises voltage-current converters 1, 2, 5, coils 50, 51, and signal terminals 11, 12. The voltage-current converter 1 and the coil 50 connected to the output terminal pair of the voltage-current converter 1 form a first-stage phase rotator; and the voltage-current converter 2 and the coil 51 connected to the output terminal pair of the voltage-current converter 2 form a second-stage phase rotator.

When the inductance values of the coils 50 and 51 are defined as L1 and L2, respectively, the inductances ZL1 and ZL2 of the coils 50 and 51 are given, respectively, by the following equation:

$$ZL1=j\times\omega\times L1 \quad (26)$$

$$ZL2=j\times\omega\times L2 \quad (27)$$

For other constituting elements, elucidations on those of FIG. 1 is applicable, and therefore, overlapped description will not be made.

Assuming that a voltage v is applied to the signal terminal 11 with respect to the signal terminal 12, the voltage v is applied between the input terminals of the voltage-current converter 1. The voltage-current converter 1 converts the voltage v into a current with the current conversion rate of gm1. This current is supplied to the coil 50. Therefore, a voltage v1 expressed by the following expression is generated across the coil 50.

$$v1=v\times gm1\times j\times\omega\times L1 \quad (28)$$

This voltage v1 is applied between the input terminals of the voltage-current converter 2. The voltage-current converter 2 converts the voltage v1 into a current with the current conversion rate of gm2. This current is supplied to the coil 51. Consequently, a voltage v2 given by the following expression is generated across the coil 51.

$$v2=v1\times gm2\times j\times\omega\times L2 \quad (29)$$

This voltage v2 is applied between the input terminals of the voltage-current converter 5, which converts the applied voltage v2 into a current expressed by the following expression with the current conversion rate of gm10, and puts out it from the output terminals of it. Numeral i10 is a current; flowing from the signal terminal 11 toward one output terminal of the voltage-current converter 5; and flowing from the other output terminal toward the signal terminal 12.

$$-i10=gm10\times v2 \quad (30)$$

Thus, in the frequency dependent resistor shown in FIG. 7, the impedance Zin that is impedance as seen inward from the signal terminals 11, 12 is given by the following equation:

$$Zin=1/(\omega^2\times gm1\times gm2\times gm10\times L1\times L2) \quad (31)$$

As seen from this equation, the frequency dependent resistor has a resistance characteristic inversely proportional to the product of the square of ω, the capacitance values L1, L2, and the current conversion rates gm1, gm2, gm10.

Next, a frequency dependent resistor using a parallel circuit including a capacitor and a coil as a reactive load will be explained with reference to FIG. 8.

Figure 8:
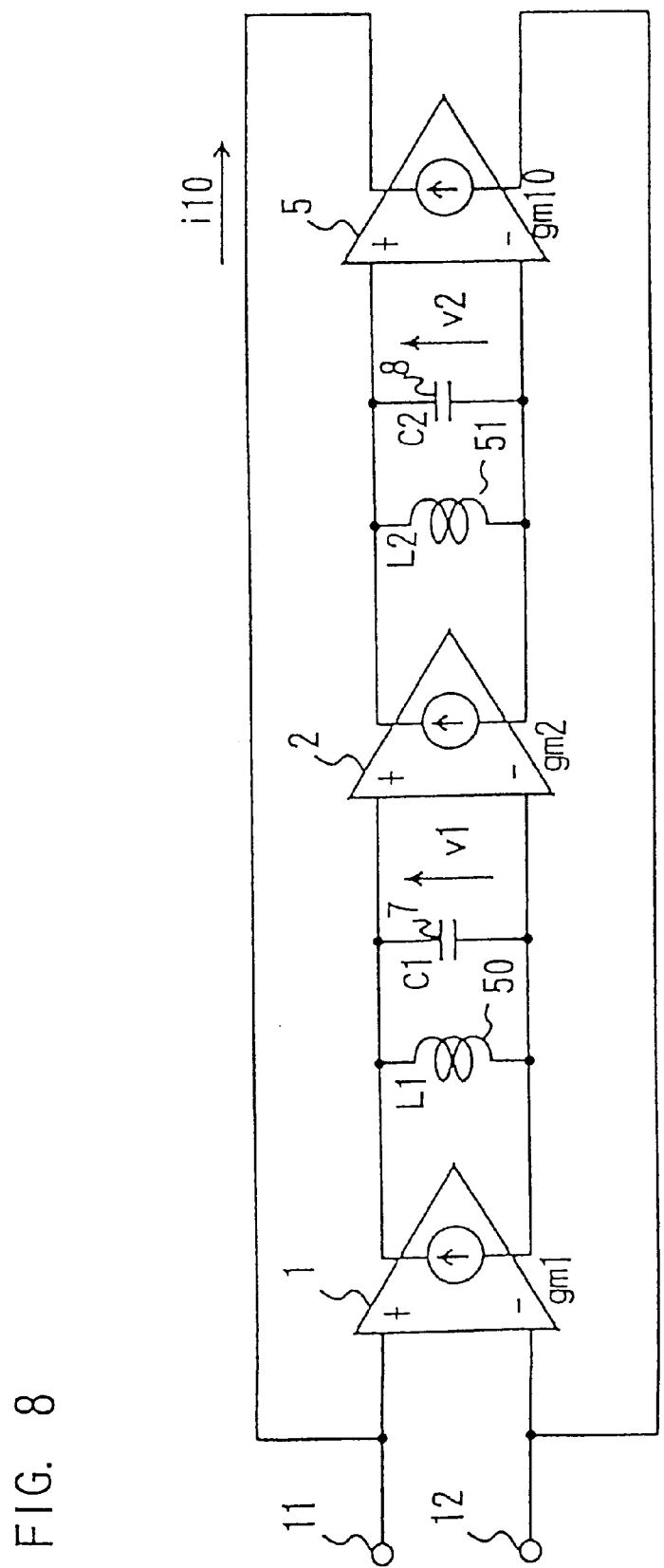
FIG. 8 shows still another frequency dependent resistor according to the present invention.

The frequency dependent resistor shown in FIG. 8 comprises voltage-current converters 1, 2, 5, capacitors 7, 8, coils 50, 51 and signal terminals 11, 12. The voltage-current converter 1, and the coil 50 and the capacitor 7 both connected to the output terminal pair of the voltage-current converter 1, form a first-stage phase rotator; and the voltage-current converter 2, and the coil 51 and the capacitor 8 both connected to the output terminal pair of the voltage-current converter 2, form a second-stage phase rotator.

The capacitance values of the capacitors 7 and 8 are C1 and C2, respectively, and the inductance values of the coils 50 and 51 are L1 and L2, respectively. The impedances ZLC1 and ZLC2 of the circuit including the capacitor 7 and the coil 50 and the circuit including the capacitor 8 and the coil 51 are given by the following equation, respectively.

$$ZLC1 = -j \times \{\omega \times C1 - 1/(\omega \times L1)\}^{-1} \tag{32}$$

$$ZLC2 = -j \times \{\omega \times C2 - 1/(\omega \times L2)\}^{-1} \tag{33}$$

When a voltage v is applied to the signal terminal 11 with respect to the signal terminal 12, the voltage v is applied between the input terminals of the voltage-current converter 1. This voltage-current converter 1 converts this voltage v into a current with the current conversion rate of gm1. This current is supplied to the parallel circuit including the capacitor 7 and the coil 50. Therefore, the voltage v1 expressed by the following expression is generated across the parallel circuit.

$$v1 = -v \times gm1 \times j \times \{\omega \times C1 - 1/(\omega \times L1)\}^{-1} \tag{34}$$

This voltage v1 is applied between the input terminals of the voltage-current converter 2. The voltage-current converter 2 converts the voltage v1 into a current with the current conversion rate of gm2. This current is supplied to the parallel circuit including the capacitor 8 and the coil 51. Thus, a voltage v2 given by the following expression is generated across the parallel circuit.

$$v2 = v1 \times gm2 \times j \times \{\omega \times C2 - 1/(\omega \times L2)\}^{-1} \tag{35}$$

This voltage v2 is applied between the input terminals of the voltage-current converter 5. The voltage-current converter 5 converts the applied voltage v2 into the current expressed by the following expression with the current conversion rate of gm10 and puts out it from the output terminals of it. Numeral i10 is defined as a current; flowing from the signal terminal 11 toward one output terminal of the voltage-current converter 5; and flowing from the other output terminal toward the signal terminal 12.

$$-i10 = gm10 \times v2 \tag{36}$$

Thus, for the frequency dependent resistor shown in FIG. 8, the impedance Zin that is impedance as seen inward from the signal terminals 11, 12 is given by the following equation:

$$Zin = \{\omega \times C1 - 1/(\omega \times L1)\} \times \{\omega \times C2 - 1/(\omega \times L2)\}/(gm1 \times gm2 \times gm10) \tag{37}$$

As seen from this equation, the impedance Zin approaches to zero as the angular frequency ω approaches to $(L1 \times C1)^{-1/2}$ or $(L2 \times C2)^{-1/2}$.

Further, a frequency dependent resistor using series circuit including a capacitor and a coil as reactive load will be explained with reference to FIG. 9.

Figure 9:
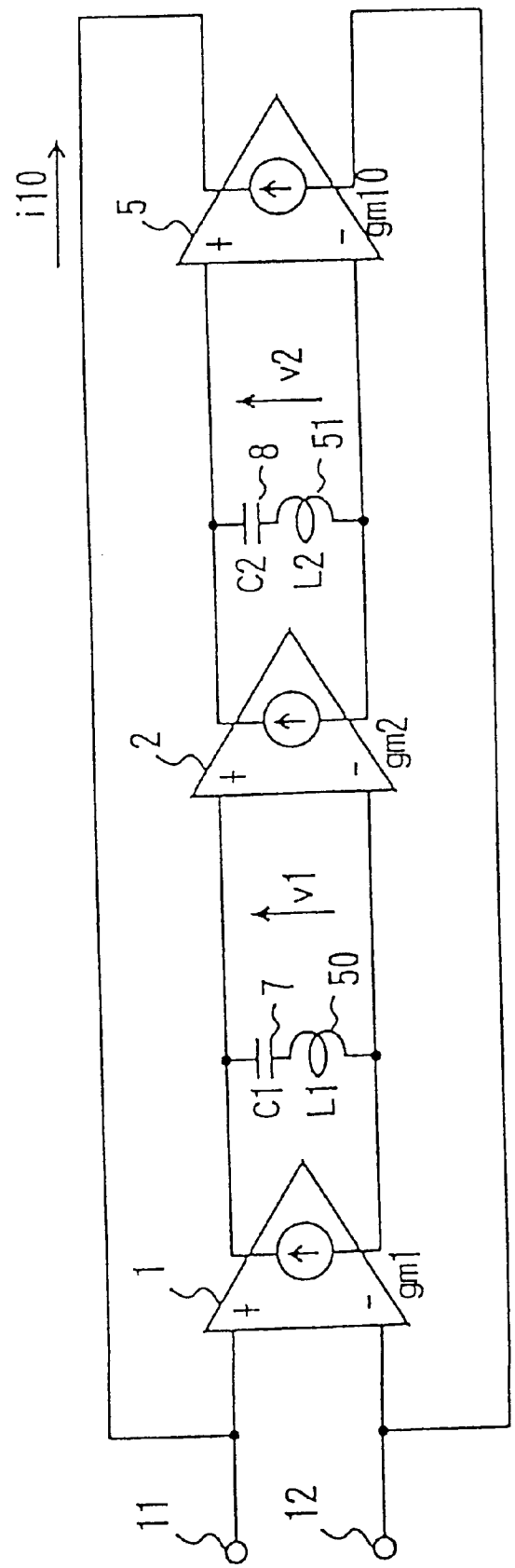
FIG. 9 shows still another frequency dependent resistor according to the invention.

The frequency dependent resistor shown in FIG. 9 comprises voltage-current converters 1, 2, 5, capacitors 7, 8, coils 50, 51, and signal terminals 11, 12. The voltage-current converter 1 and a series circuit including the coil 50 and the capacitor 7 connected to the output terminal pair of the voltage-current converter 1 form a first-stage phase rotator; and the voltage-current converter 2 and a series circuit including the coil 51 and the capacitor 8 connected to the output terminal pair of the voltage-current converter 2 form a second-stage phase rotator.

The capacitance values of the capacitors 7 and 8 are C1 and C2, respectively, and the inductance values of the coil 50 and the coil 51 are L1 and L2, respectively. The impedance ZLC3 of the circuit configured of the capacitor 7 and the coil 50 and the impedance ZLC4 of the circuit configured of the capacitor 8 and the coil 51 are given by the following equation, respectively.

$$ZLC3 = j \times \{\omega \times L1 - 1/(\omega \times C1)\} \tag{38}$$

$$ZLC4 = j \times \{\omega \times L2 - 1/(\omega \times C2)\} \tag{39}$$

When a voltage v is applied to the signal terminal 11 with respect to the signal terminal 12, the voltage v is applied between the input terminals of the voltage-current converter 1. The voltage-current converter 1 converts the voltage v into a current with the current conversion rate of gm1. This current is supplied to the series circuit including the capacitor 7 and the coil 50. Therefore, a voltage v1 expressed by the following expression is generated across the series circuit.

$$v1 = v \times gm1 \times j \times \{\omega \times L1 - (1/\omega \times C1)\} \tag{40}$$

This voltage v1 is applied between the input terminals of the voltage-current converter 2. The voltage-current converter 2 converts the voltage v1 into a current with the current conversion rate of gm2. This current is supplied to the series circuit including the capacitor 8 and the coil 51. A voltage v2 given by the following expression is generated across the series circuit.

$$v2 = v1 \times gm2 \times j \times \{\omega \times L2 - (1/\omega'C2)\} \tag{41}$$

This voltage v2 is applied between the input terminals of the voltage-current converter 5. The voltage-current converter 5 converts the applied voltage v2 into a current expressed by the following expression with the current conversion rate of gm10 for output from the output terminals of it. Numeral i10 is a current; flowing from the signal terminal 11 toward one output terminal of the voltage-current converter 5; and flowing from the other output terminal toward the signal terminal 12.

$$-i10 = gm10 \times v2 \tag{42}$$

Therefore, for the frequency dependent resistor shown in FIG. 9, the impedance Zin that is impedance as seen inward from the signal terminals 11, 12 is given by the following equation:

$$Zin = 1/[gm1 \times gm2 \times gm10 \times \{\omega \times L1 - 1/(\omega \times C1)\} \times \{\omega \times L2 \times 1/(\omega \times C2)\}] \tag{43}$$

As seen from this equation, the impedance Zin approaches a maximum value as the angular frequency ω approaches $(L1 \times C1)^{-1/2}$ and $(L2 \times C2)^{-1/2}$.

Embodiment 7

A further frequency dependent resistor according to the present invention will be described with reference to FIG. 10.

Figure 10:
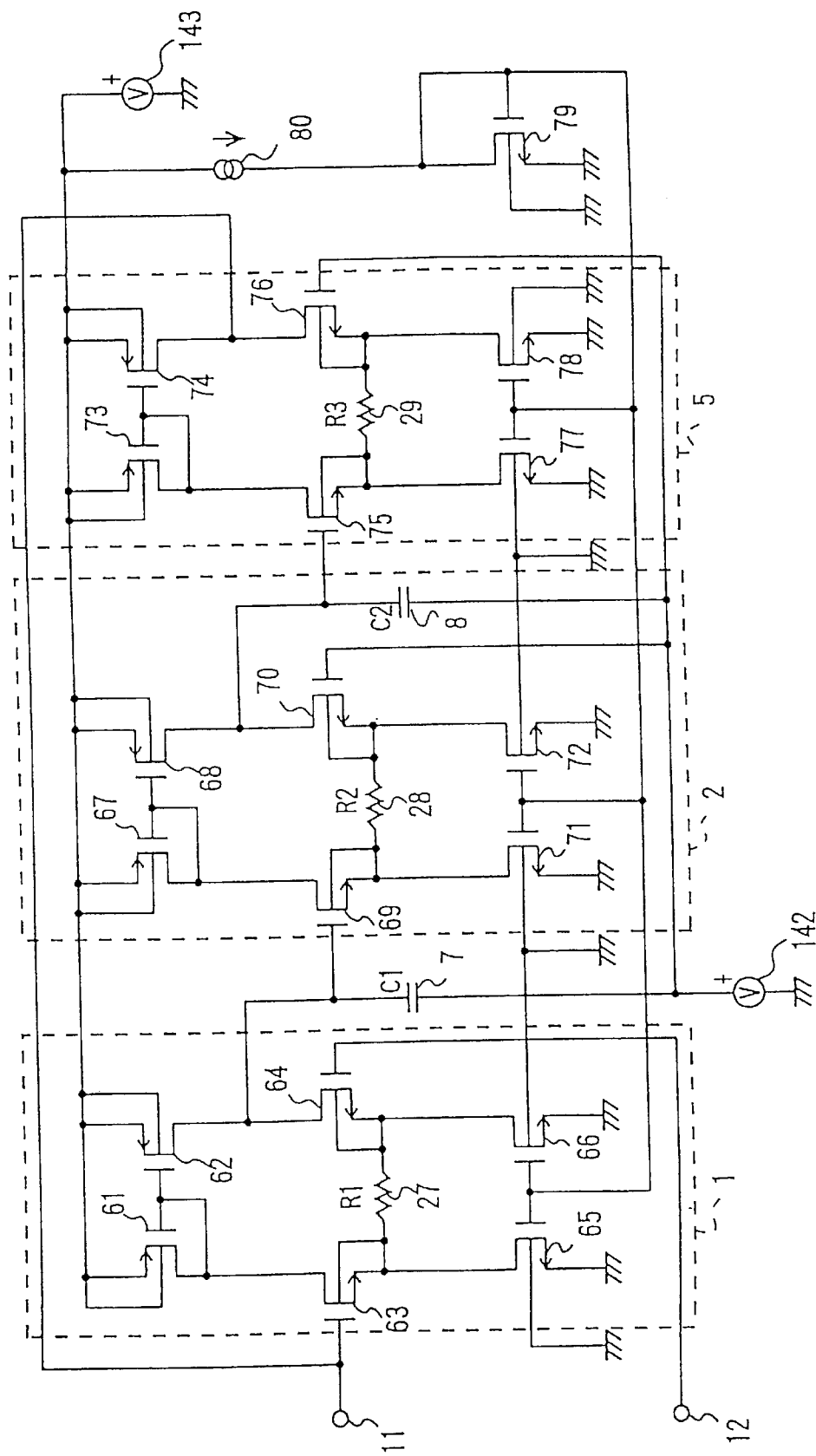
FIG. 10 shows a circuit configuration of another frequency dependent resistor according to the invention.

The frequency dependent resistor shown in FIG. 10 comprises MOS transistors 61, 62, 63, 64, 65, 66, 67, 68, 69, 70, 71, 72, 73, 74, 75, 76, 77, 78, 79; resistors 27, 28, 29; capacitors 7, 8; a current source 80; voltage sources 142, 143; and signal terminals 11, 12.

The MOS transistors 61, 62, 63, 64, 65, 66, and the resistor 27 connected between the sources of the MOS transistors 63 and 64 form a voltage-current converter 1. The voltage-current converter 1 and the capacitor 7 connected to the drain of the MOS transistor 64 form a first-stage phase rotator. The MOS transistors 67, 68, 69, 70, 71, 72 and the resistor 28 connected between the sources of the MOS transistors 69 and 70 form a voltage-current converter 2. The voltage-current converter 2 and the capacitor 8 connected to the drain of the MOS transistor 70 form a second-stage phase rotator. The MOS transistors 73, 74, 75, 76, 77, 78 and the resistor 29 connected between the sources of the MOS transistors 75 and 76 form a voltage-current converter 5. The MOS transistors 63, 64 and the resistor 27 form a differential amplifier circuit; the MOS transistors 69, 70 and the resistor 28 form a differential amplifier circuit; and the MOS transistors 75, 76 and the resistor 29 form a differential amplifier circuit. The MOS transistor 69, 70 the MOS transistor 62 form a current mirror circuit; the MOS transistor 67 and the MOS transistor 68 form a current mirror circuit; and the MOS transistor 73 and the MOS transistor 74 form a current mirror circuit.

The current of the current source 80 is uniformly supplied to the phase rotators and the voltage-current converter 5 by means of the MOS transistors 65, 66, 71, 72, 77, 78, 79.

The advantage of using the MOS transistors is that the gate of it has high input impedance, so that the current supplied to the phase rotators can be suppressed to a minimum value; by which, the design of the apparatus is easy. The use of the MOS transistors also makes it possible to incorporate the analog filter processing section as a part of digital signal processing operation on a semiconductor-integrated circuit mounted on the same pellet. Another advantage is that in the frequency dependent resistor of the present invention, it is not required to use a clock signal, and therefore, a filter free of clock interference can be realized.

Embodiment 8

Figure 11:
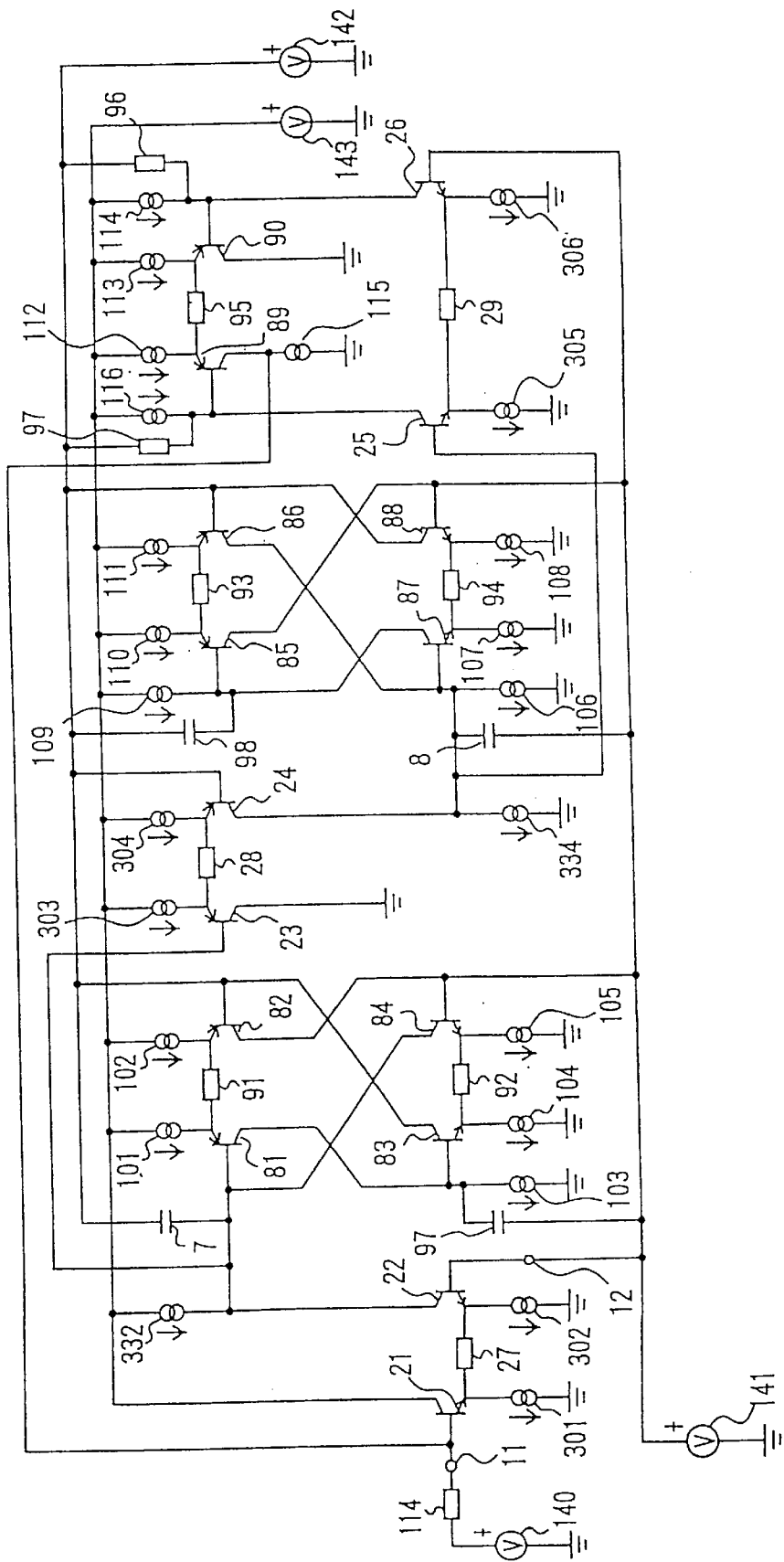
FIG. 11 shows a circuit configuration of still another frequency dependent resistor according to this invention.

Explanation will be referred to FIG. 11 for the case that an inductive load that is one reactive loads is formed with a gyrator circuit.

In the frequency dependent resistor shown in FIG. 11, a gyrator circuit obtaining an inductive load for a first-stage phase-rotator is constructed with transistors 81, 82; a transistor 83 connected its base to the collector of the transistor 81 and connected its collector to the base of the transistor 82; a transistor 84 connected its base to the collector of the transistor 82 and connected its collector to the base of the transistor 81; a resistor 91 connected between the emitters of the transistors 81 and 82; a resistor 92 connected between the emitters of the transistors 83 and 84; a capacitor 97 connected between the base of the transistor 83 and the voltage source 141; a current source 101 connected between the emitter of the transistor 81 and the voltage source 143; a current source 102 connected between the emitter of the transistor 82 and the voltage source 143; a current source 103 connected between the base of the transistor 83 and the ground; a current source 104 connected between the emitter of the transistor 83 and the ground; and a current source 105 connected between the emitter of the transistor 84 and the ground. A gyrator circuit for obtaining an inductive load for a second-stage phase-rotator is with transistors 85, 86; a transistor 87 connected its base to the collector of the transistor 86 and its collector to the base of the transistor 85; a transistor 88 connected its base to the collector of the transistor 85 and its collector to the base of the transistor 86; a resistor 93 connected between the emitters of the transistors 85 and 86; a resistor 94 connected between the emitters of the transistor 87 and 88; a capacitor 98 connected between the base of the transistor 85 and the voltage source 142; a current source 109 connected between the base of the transistor 85 and the voltage source 143; a current source 110 connected between the emitter of the transistor 85 and the voltage source 143; a current source 111 connected between the emitter of the transistor 86 and the voltage source 143; a current source 106 connected between the base of the transistor 87 and the ground; a current source 107 connected between the emitter of the transistor 87 and the ground; and a current source 108 connected between the emitter of the transistor 88 and the ground.

The first-stage phase rotator is connected in parallel with the capacitor 7 by that to obtain an inductance between the bases of the transistors 81 and 82; and the second-stage phase rotator is connected in parallel with the capacitor 8 by that to obtain an inductance between the bases of the transistors 87 and 88.

In this way, an inductive load is realized on a semiconductor-integrated circuit by means of capacitors, resistors and transistors.

Embodiment 9

Still another frequency dependent resistor according to the present invention will be explained about FIG. 12.

Figure 12:
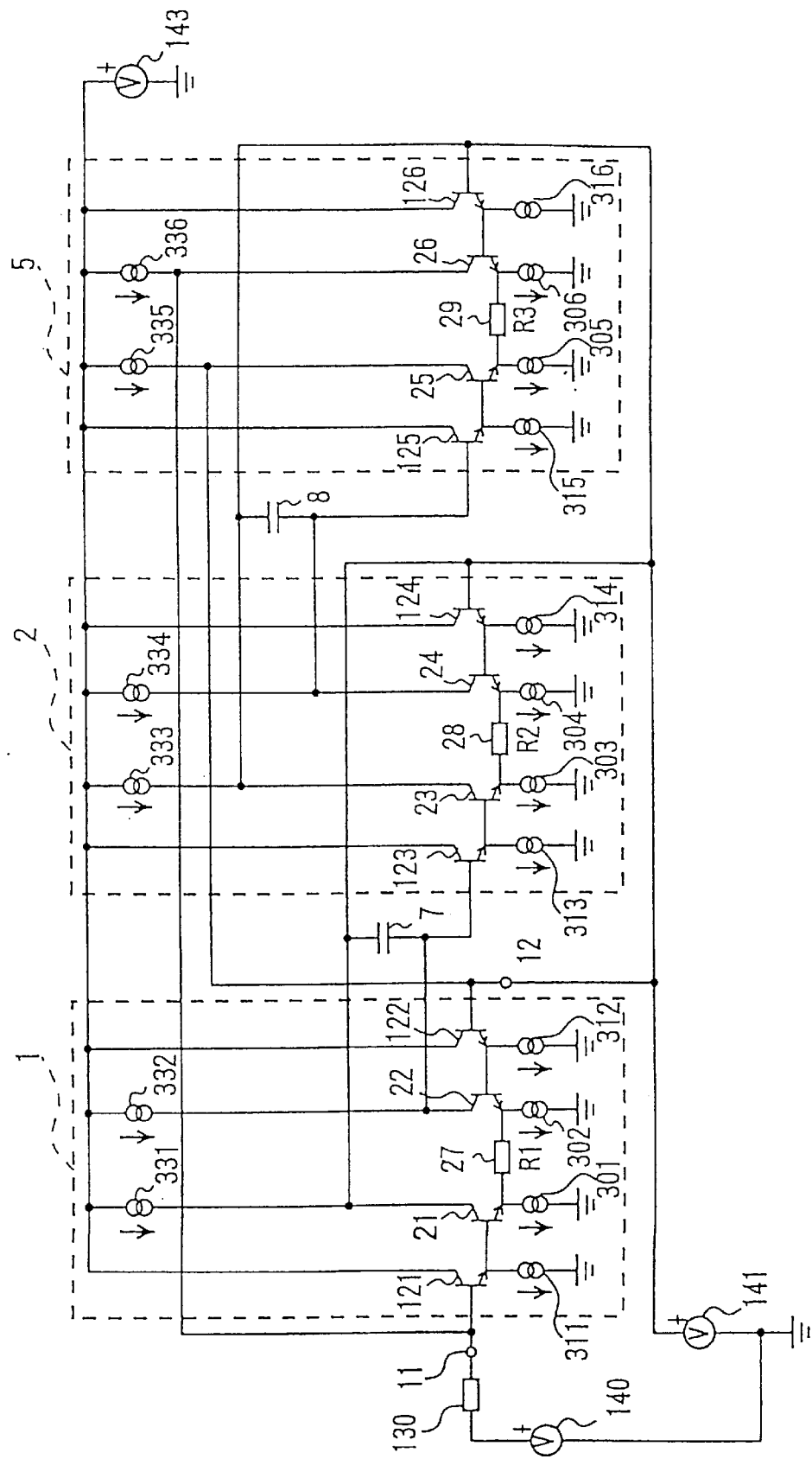
FIG. 12 shows a circuit configuration of still another frequency dependent resistor according to this invention.

The frequency dependent resistor shown in FIG. 12 comprises transistors 21, 22, 23, 24, 25, 26, 121, 122, 123, 124, 125, 126; capacitors 7, 8; resistors 27, 28, 29; current sources 301, 302, 303, 304, 305, 306, 311, 312, 313, 314, 315, 316, 331, 332, 333, 334, 335, 336; voltage sources 141, 143, and signal terminals 11, 12.

A voltage-current converter 1 with a differential amplifier circuit is constructed with the transistors 21, 22; the resistor 27 connected between the emitters of the transistors 21 and 22; the current source 301 connected between the emitter of the transistor 21 and the ground; the current source 302 connected between the emitter of the transistor 22 and the ground; the current source 331 connected between the collector of the transistor 21 and the voltage source 143; the current source 332 connected between the collector of the transistor 22 and the voltage source 143; the transistor 121 connected its emitter to the base of the transistor 21; the transistor 122 connected its emitter to the base of the transistor 22; the current source 311 connected between the emitter of the transistor 121 and the ground; and the current source 312 connected between the emitter of the transistor 122 and the ground. The voltage-current converter 1 and the capacitor 7 connected between the collectors of the transistors 21 and 22 form a first-stage phase rotator. The base of the transistor 21 of the first-stage phase rotator is connected to the signal terminal 11, and the base of the transistor 22 is connected to the signal terminal 12. A voltage-current converter 1 with a differential amplifier circuit is with the transistors 23, 24; the resistor 28 connected between the emitters of the transistors 23 and 24; the current source 303 connected between the emitter of the transistor 23 and the ground; the current source 304 connected between the emitter of the transistor 24 and the ground; the current source 333 connected between the collector of the transistor 23 and the voltage source 143; the current source 334 connected between the collector of the transistor 24 and the voltage source 143; the transistor 123 connected its emitter to the base of the transistor 23; the transistor 124 connected its emitter to the base of the transistor 24; the current source 313 connected between the emitter of the transistor 123 and the ground; and the current source 314 connected between the emitter of the transistor 124 and the ground. The voltage-current converter 2 and the capacitor 8 connected between the collectors of the transistors 23 and 24 form a second-stage phase rotator. A voltage-current converter 5 with a differential amplifier circuit is with the transistors 25, 26; the resistor 29 connected between the emitters of the transistors 25 and 26; the current source 305 connected between the emitter of the transistor 25 and the ground; the current source 306 connected between the emitter of the transistor 26 and the ground; the current source 335 connected between the collector of the transistor 25 and the voltage source 143; the current source 336 connected between the collector of the transistor 26 and the voltage source 143; the transistor 125 connected its emitter to the base of the transistor 25; the transistor 126 connected its emitter to the base of the transistor 26; the current source 315 connected between the emitter of the transistor 125 and the ground; and the current source 316 connected between the emitter of the transistor 126 and the ground. The bases of the transistors 124 and 126 are connected to the voltage source 141.

Each emitter-follower circuit, which is formed of the transistor 121 and the current source 311 or formed of the transistor 122 and the current source 312, is connected to the bases of the transistors 21 and 22, respectively. By which the input impedance of the first-stage phase rotator can be increased. The impedance of the emitter of each emitter-follower circuit is small. For example, it prevents coupling of the signal generated in the collector of the transistor 21, to the base of transistor 21; generated in the collector of the transistor 22, to the base of the transistor 22. A similar effect is obtained by each emitter-follower circuit formed of the transistor 123 and the current source 313 and of the transistor 124 and the current source 314; also formed of the transistor 125 and the current source 315 and of the transistor 126 and the current source 316.

Embodiment 10

Still another frequency dependent resistor according to this invention will be explained with reference to FIGS. 12, 13 and 14.

An end of the resistor 130 is connected to the signal terminal 11 of the frequency dependent resistor shown in FIG. 12. Voltage sources 140 and 141 are connected between the other end of the resistor 130 and the signal terminal 12. FIG. 13 is a block diagram showing a circuit configuration of the frequency dependent resistor of FIG. 12.

Figure 13:
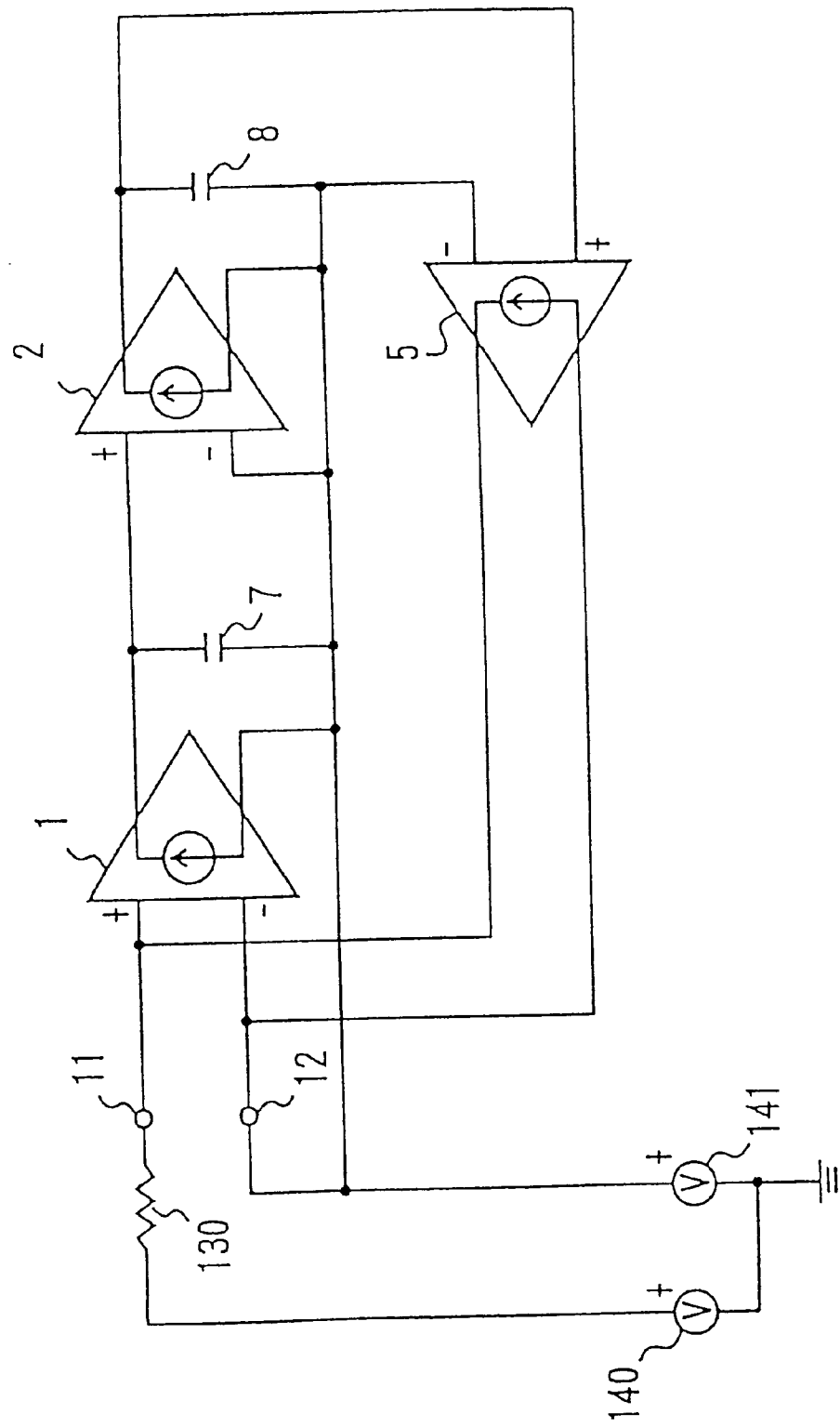
FIG. 13 is a block diagram showing the frequency dependent resistor shown in FIG. 12.
Figure 14:
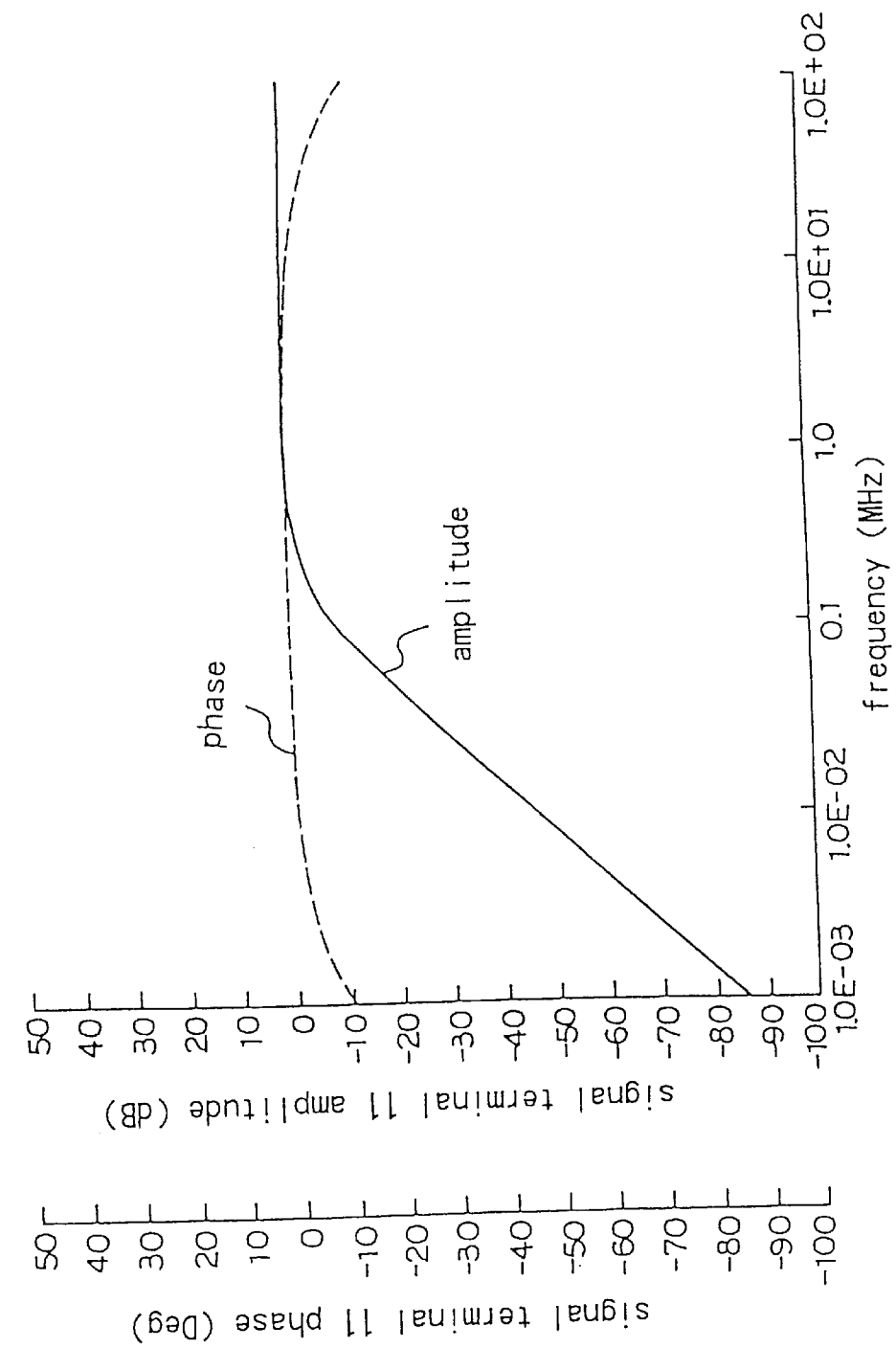
FIG. 14 is a diagram showing the result of simulating the frequency dependent resistor of FIGS. 12 and 13.

FIG. 14 shows the result of simulating the highpass filter characteristic obtained at the signal terminal 11 of the frequency dependent resistor of FIG. 12. The simulation of FIGS. 12 to 26 is based on the following definition and constants.

Each DC current value of the current sources 301, 302, 303, 304, 305, 306, 331, 332, 333, 334, 335, 336 is 100 μA; each DC current value of the current sources 311, 312, 313, 314, 315, 316 is 20 μA; each capacitance value of the capacitors 7, 8 is 100 μF, each resistance value of the resistors 27, 28, 29, 130 is 10 kΩ; the voltage value of the power supply 143 is 5 V; and each DC voltage value of the voltage sources 140, 141 is 2.5 V. The voltage source 140 is an AC signal input source. The input signal is a unit signal having a phase of zero degree and an amplitude assumed to have a value infinitely near to zero. The output amplitude of the simulation result has a value that is larger by a factor of 20 than the logarithmic value of the amplitude of the output signal with the input signal as a reference. A negative value of it means an attenuation, while a positive value of it means amplification. Also, the output phase in each diagram is based on the input signal, and a negative value of it means a phase's delay, while a positive value of it means a phase's lead. In the simulation, the Gunmel-Poon transistor model is used. The setting of the operating temperature is to 300 K; the current amplification factor $h_{FE}$ is 150; the collector-ground parasitic capacitance is 0.1 pF; the collector-base parasitic capacitance is 0.02 pF; and the Early voltage is 92 V.

The signal terminal 11 of FIGS. 12 and 13 are provided with a highpass filter characteristic in which the amplitude changes with the square of the frequency. As seen from FIG. 14, the phase change of output signal is no more than two degrees within the frequency band of 10 kHz and 10 MHz. In this way, a highpass filter having superior phase characteristic is obtained from the signal terminal 11.

The parasitic capacitance of the collector of the transistor 26 and the resistor 130 causes a lowpass filter of a high frequency in the signal terminal 11. The phase of the lowpass filter undergoes a change between the frequency from one tenth of the cut off frequency thereof to the high frequency range. As a preventive measure, the frequency generated the phase change can be transferred to a higher frequency range by setting the value of the resistor 130 to a low level again.

Embodiment 11

A further frequency dependent resistor according to this invention will be explained with reference to FIGS. 15 and 16.

Figure 15:
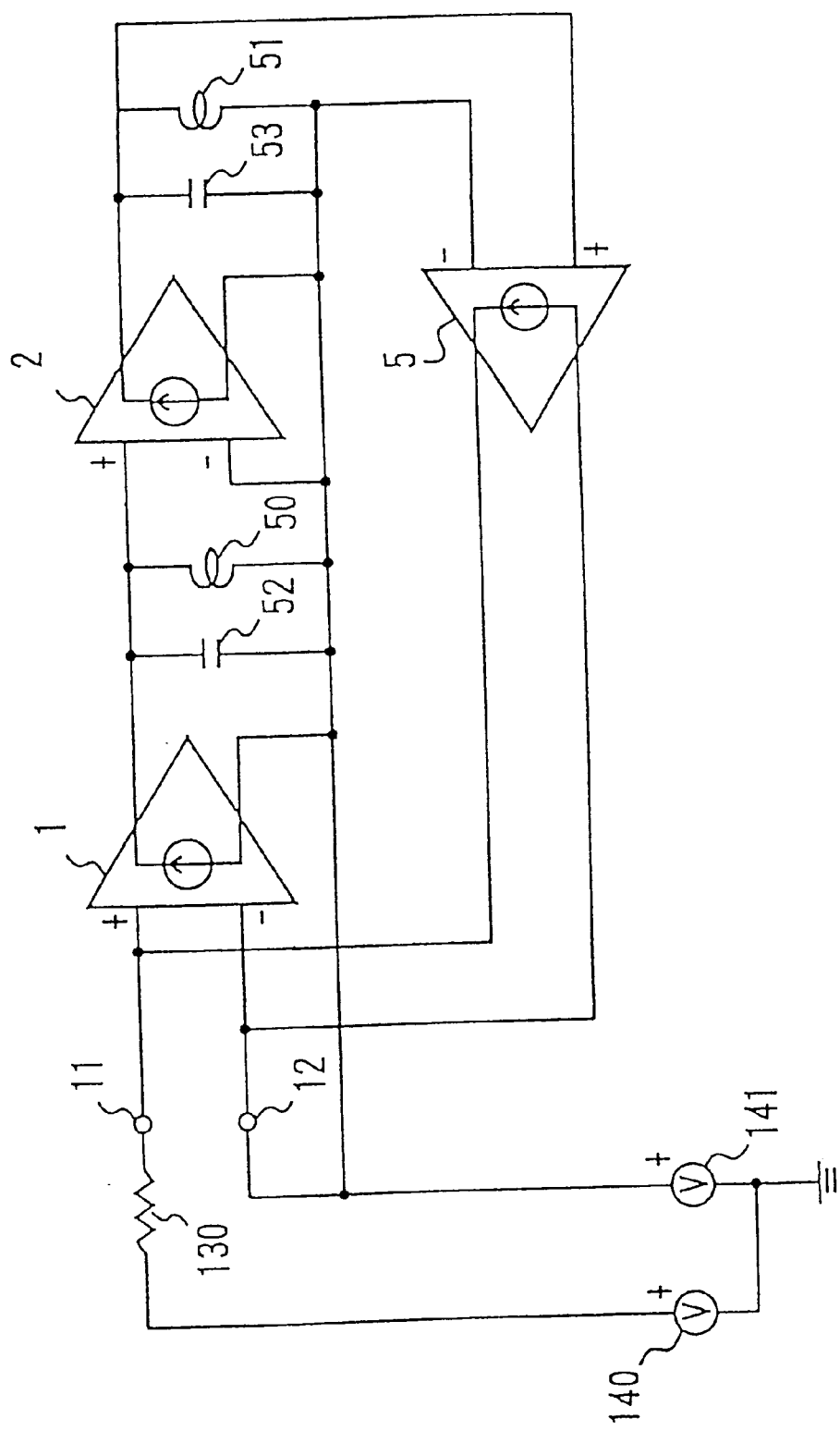
FIG. 15 shows still another frequency dependent resistor according to the present invention.

The frequency dependent resistor shown in FIG. 15 comprises voltage-current converters 1, 2, 5, capacitors 52, 53, coils 50, 51, and signal terminals 11, 12. The voltage-current converter 1 and the coil 50 and the capacitor 52 both connected to the output terminal pair of the voltage-current converter 1 form a first-stage phase rotator; and the voltage-current converter 2 and the coil 51 and the capacitor 53 both connected to the output terminal pair of the voltage-current converter 2 form a second-stage phase rotator. A parallel circuit including the coil 50 and the capacitor 52 form a reactive load; and a parallel circuit including the coil 51 and the capacitor 53 form a reactive load. The signal terminal 11 of the frequency dependent resistor is connected with an end of the resistor 130, and the other end of the resistor 130 is connected to the voltage source 140 having an AC signal source. The signal terminal 12 is connected to the voltage source 141.

This configuration can produce a band rejection filter characteristic at the signal terminal 11. The resonance frequency of the reactive load represents the center frequency of the band rejection frequency. As a result, a band rejection filter characteristic having plural band rejection frequencies can be realized by differentiating the resonance frequency of each reactive load.

Figure 16:
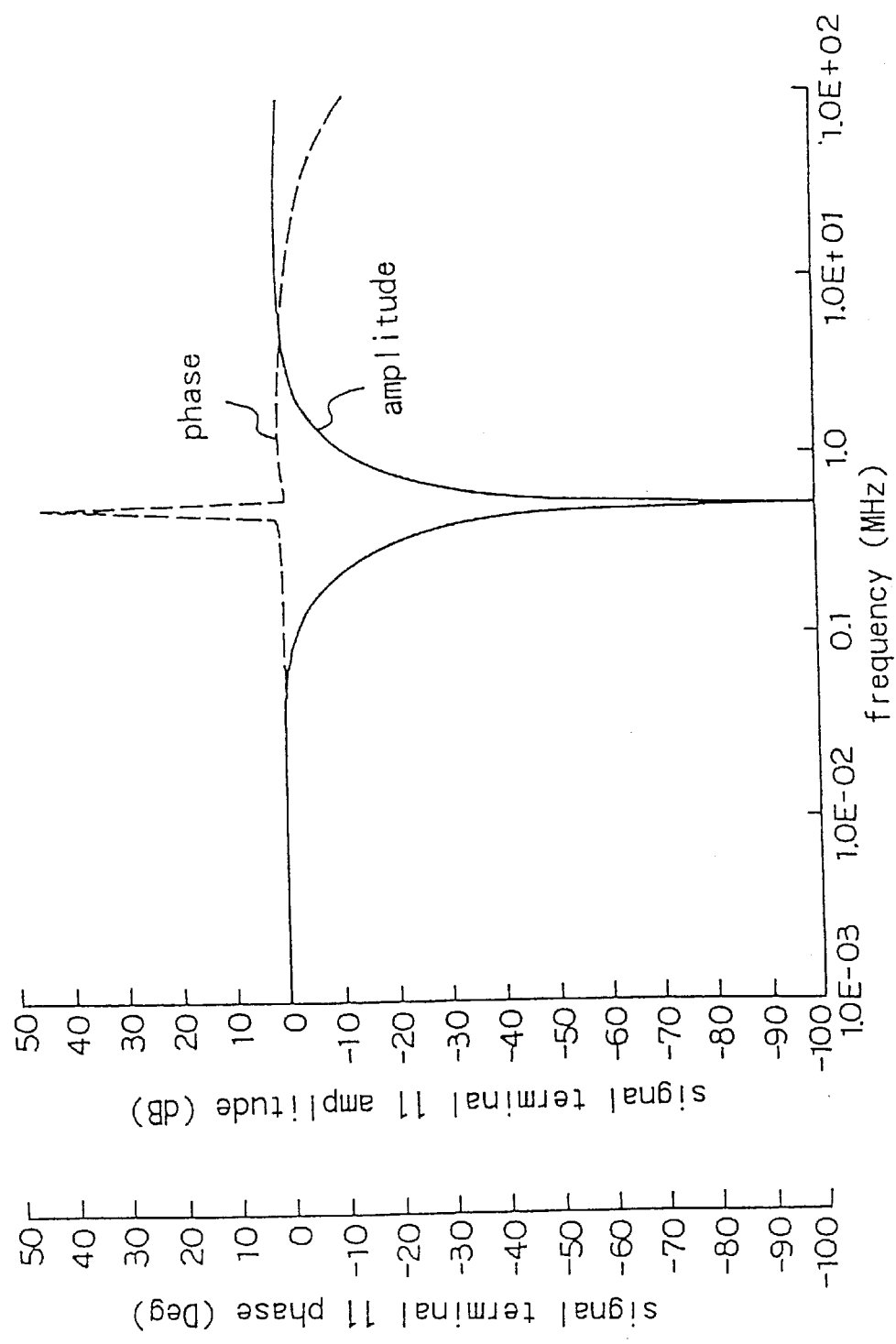
FIG. 16 is a diagram showing the result of simulating the frequency dependent resistor of FIG. 15.

FIG. 16 shows the result of simulating the band rejection filter characteristic obtained at the signal terminal 11 of the frequency dependent resistor shown in FIG. 15. The simulation is executed using the following-described values in addition to the above-mentioned values. Each capacitance value of the capacitors 52, 53 is 10 pF; and each value of the coils 50, 51 is 0.01 H. These values are shared by the respective simulations described below.

As seen from FIG. 16, the phase change is about zero degree for the frequency of about 2 MHz or less, but the center frequency and the frequency band in the vicinity of the center frequency. A band rejection filter having a superior phase characteristic can thus be obtained but the center frequency and near it.

Embodiment 12

A further frequency dependent resistor according to this invention will be explained about FIGS. 17 and 18.

Figure 17:
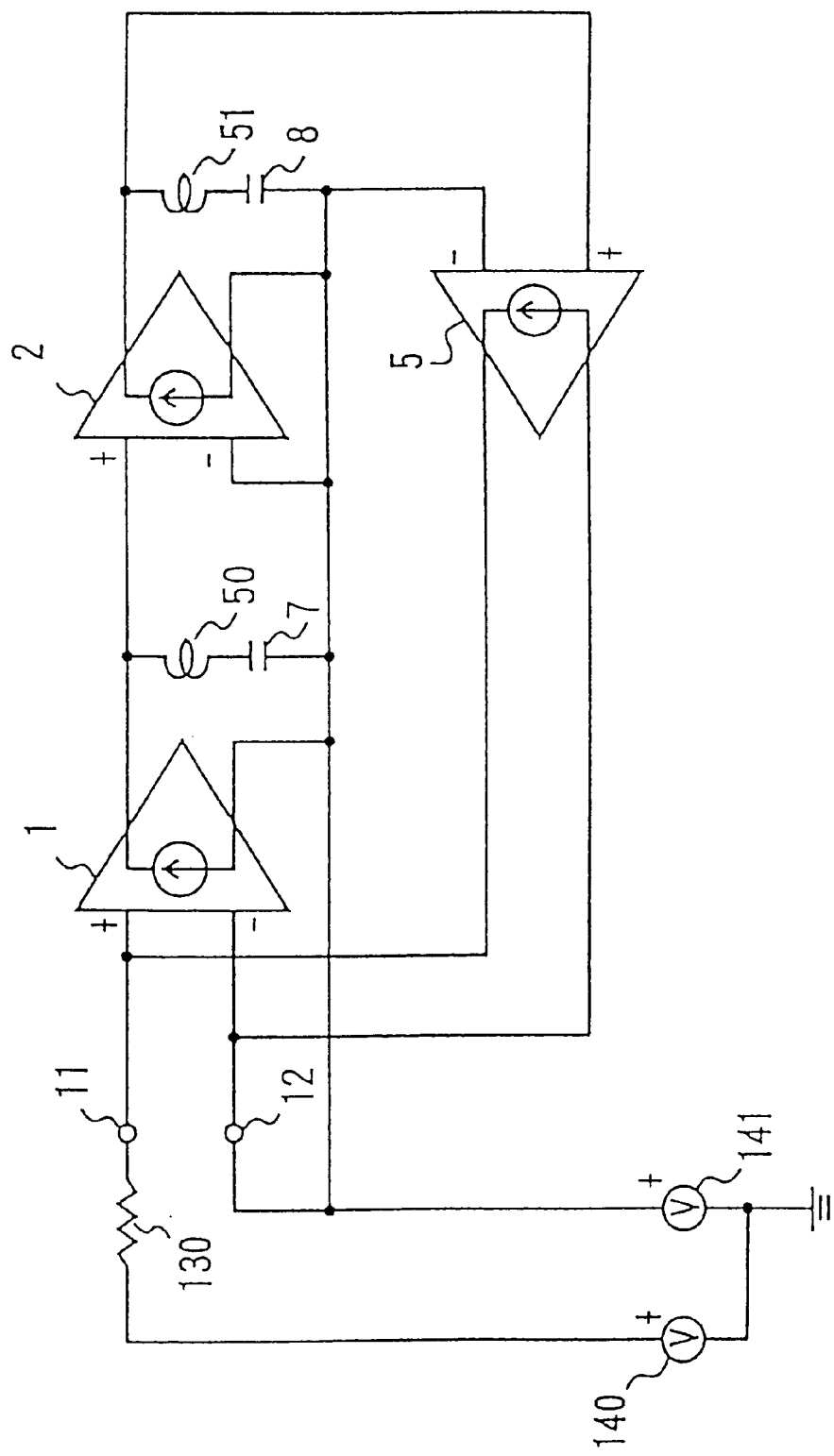
FIG. 17 shows still another frequency dependent resistor according to the present invention.

The frequency dependent resistor shown in FIG. 17 comprises voltage-current converters 1, 2, 5, capacitors 7, 8, coils 50, 51, and signal terminals 11, 12. Both the voltage-current converter 1, and a series circuit that include the coil 50 and the capacitor 7 and is connected to the output terminal pair of the voltage-current converter 1, form a first-stage phase rotator; and both the voltage-current converter 2, and a series circuit that include the coil 51 and the capacitor 8 and is connected to the output terminal pair of the voltage-current converter 2, form a second-stage phase rotator. The series circuit including the coil 50 and the capacitor 7 form a reactive load; and the series circuit including the coil 51 and the capacitor 8 form a reactive load. The signal terminal 11 of the frequency dependent resistor is connected to an end of the resistor 130, and the other end of the resistor 130 is connected to the voltage source 140 having an AC signal source. The signal terminal 12 is connected to the voltage source 141.

This configuration can produce a bandpass filter characteristic at the signal terminal 11. The resonance frequency of the reactive load provides the center frequency of the bandpass filter. By differentiating the resonance frequency of each reactive load, therefore, a bandpass filter having plural bandpass frequencies can be realized.

Figure 18:
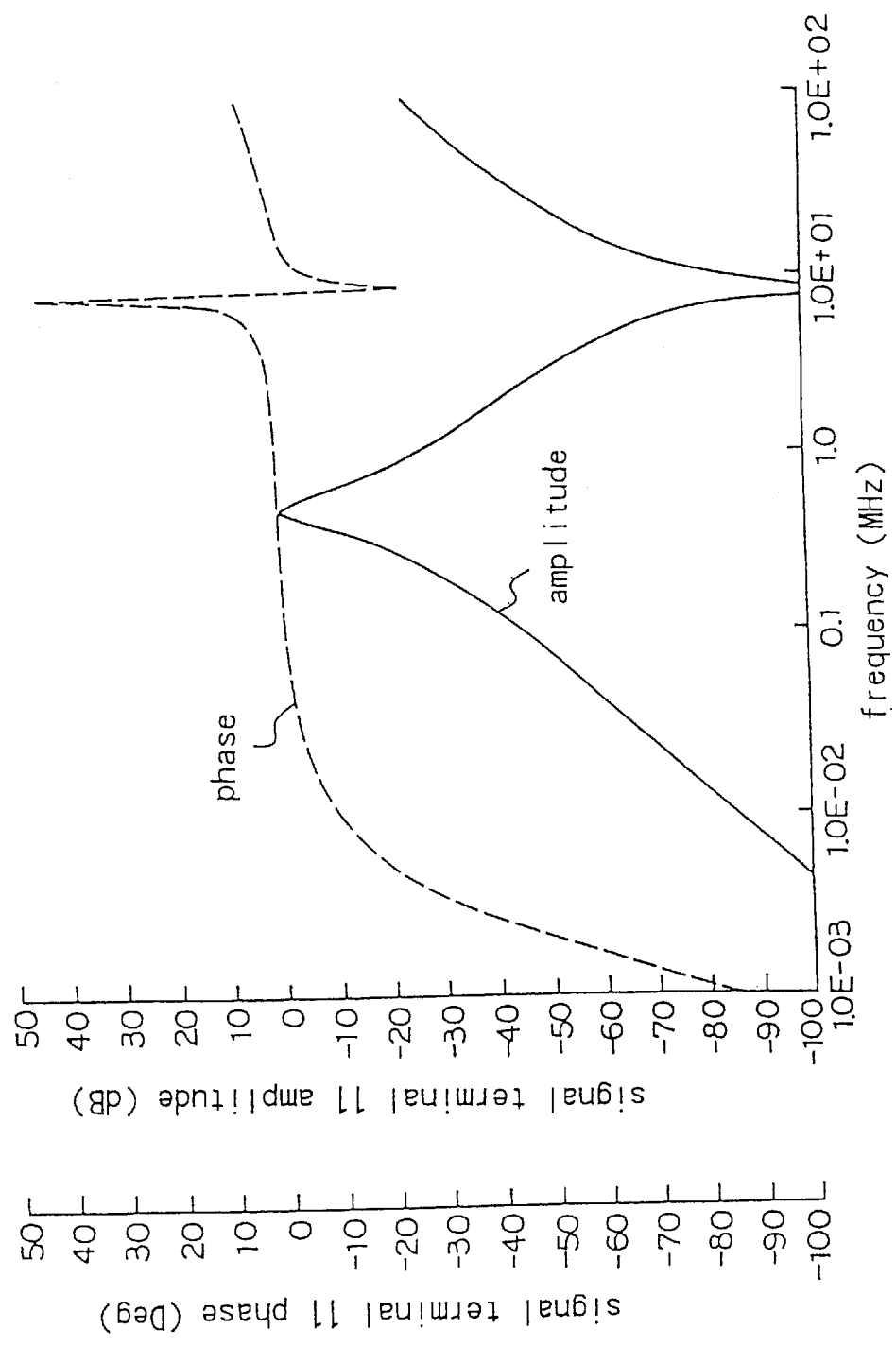
FIG. 18 is a diagram showing the result of simulating the frequency dependent resistor of FIG. 17.

FIG. 18 shows the result of simulating the bandpass filter characteristic obtained at the signal terminal 11 of the frequency dependent resistor of FIG. 17.

As seen from FIG. 18, the phase change is substantially zero at the center frequency of the bandpass frequency and the frequency band in the vicinity thereof. A superior phase characteristic is thus obtained at the center frequency and in the frequency band in the vicinity of the center frequency.

A sharp band rejection filter characteristic is exhibited in the vicinity of 9 MHz, which makes the bandpass filter characteristic more steep. However, this characteristic is the result of adding the parasitic capacitance of the transistor in parallel to each reactive load. A value of the band rejection frequency being stable against the fluctuations in the parasitic capacitance can be obtained by adding the capacitors 52, 53 that has a capacitance value comparatively large as compared with the parasitic capacitance of the transistor as described with reference to the 13th embodiment below.

Embodiment 13

A frequency dependent resistor according to this invention will be explained with reference to FIGS. 19 and 20.

Figure 19:
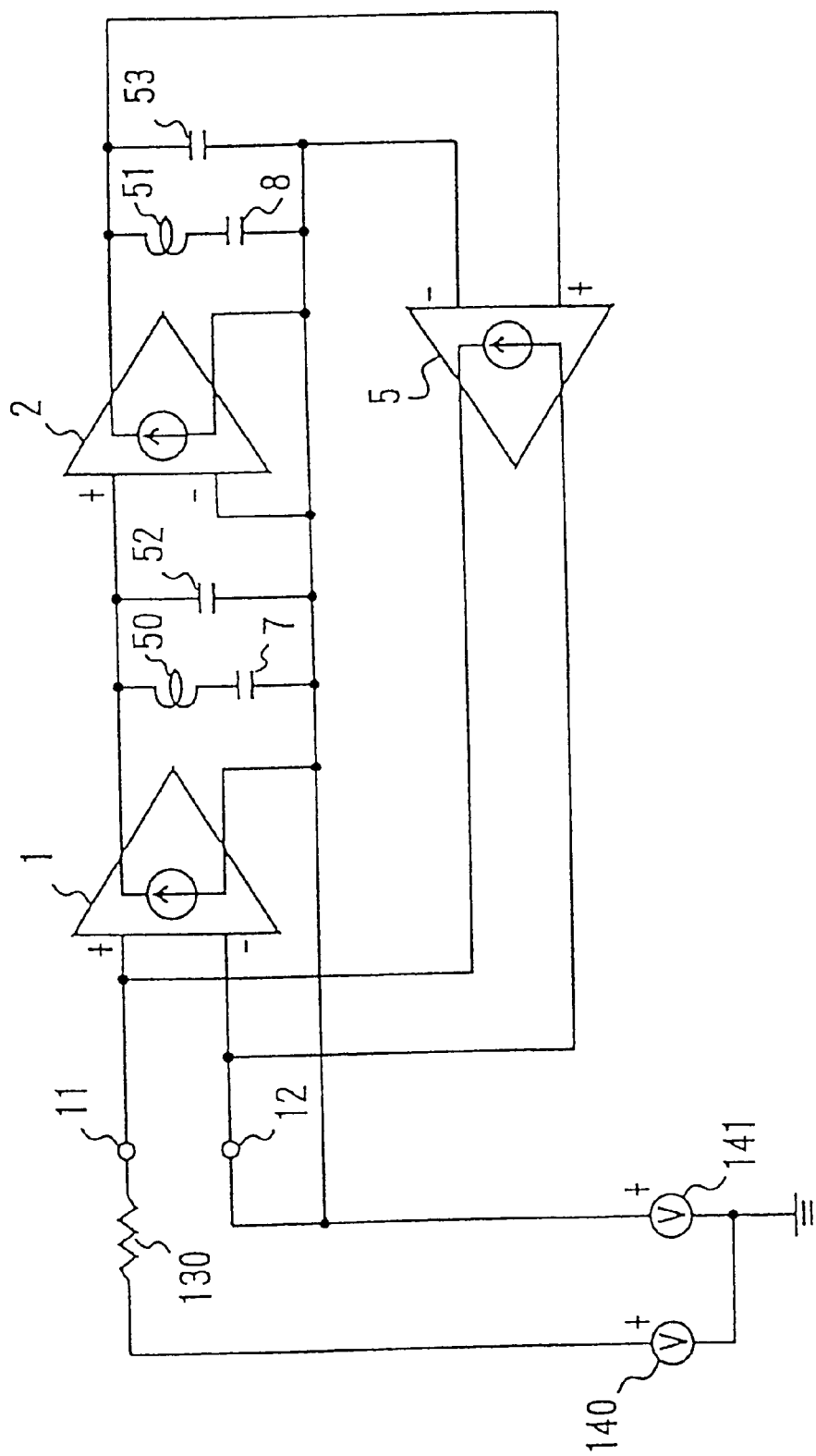
FIG. 19 shows still another frequency dependent resistor according to the present invention.

The frequency dependent resistor shown in FIG. 19 comprises voltage-current converters 1, 2, 5, capacitors 7, 8, 52, 53, coils 50, 51, and signal terminals 11, 12. A first-stage phase rotator is formed with the voltage-current converter 1, a series circuit including the coil 50 and the capacitor 7 and connected to the output terminal pair of the voltage-current converter 1, and the capacitor 52 connected in parallel to the series circuit. A second-stage phase rotator is formed with the voltage-current converter 2, a series circuit including the coil 51 and the capacitor 8 and connected to the output terminal pair of the voltage-current converter 2, and the capacitor 53 connected in parallel to the series circuit. The signal terminal 11 of the frequency dependent resistor is connected with one end of the resistor 130. The other end of the resistor 130 is connected to the voltage source 140 having an AC signal source. The signal terminal 12 is connected to the voltage source 141.

This configuration can produce a bandpass filter characteristic at the signal terminal 11. The series resonance frequency of the reactive load represents the center frequency of the bandpass filter, and the parallel resonance frequency thereof represents the center frequency of the band rejection filter. Thus, by differentiating the resonance frequency of each reactive load, a bandpass filter characteristic having plural bandpass frequencies can be realized. Especially, the trailing edge of the high frequency range of the bandpass filter characteristic can be differentiated with different capacitance values of the capacitors 52, 53. The trailing edge of the high-frequency range of the bandpass filter characteristic can be rendered more steep by increasing the capacitance value of the capacitor 52 or 53. This is effective especially for producing a symmetric frequency characteristic on linear scale. The output section of the voltage-current converters 1 and 2 are loaded with a parasitic capacitance. By that, a band rejection frequency determined according to this parasitic capacitance, presents itself, in the case where the value of the capacitors 52, 53 is zero, as described with reference to the 12th embodiment.

Figure 20:
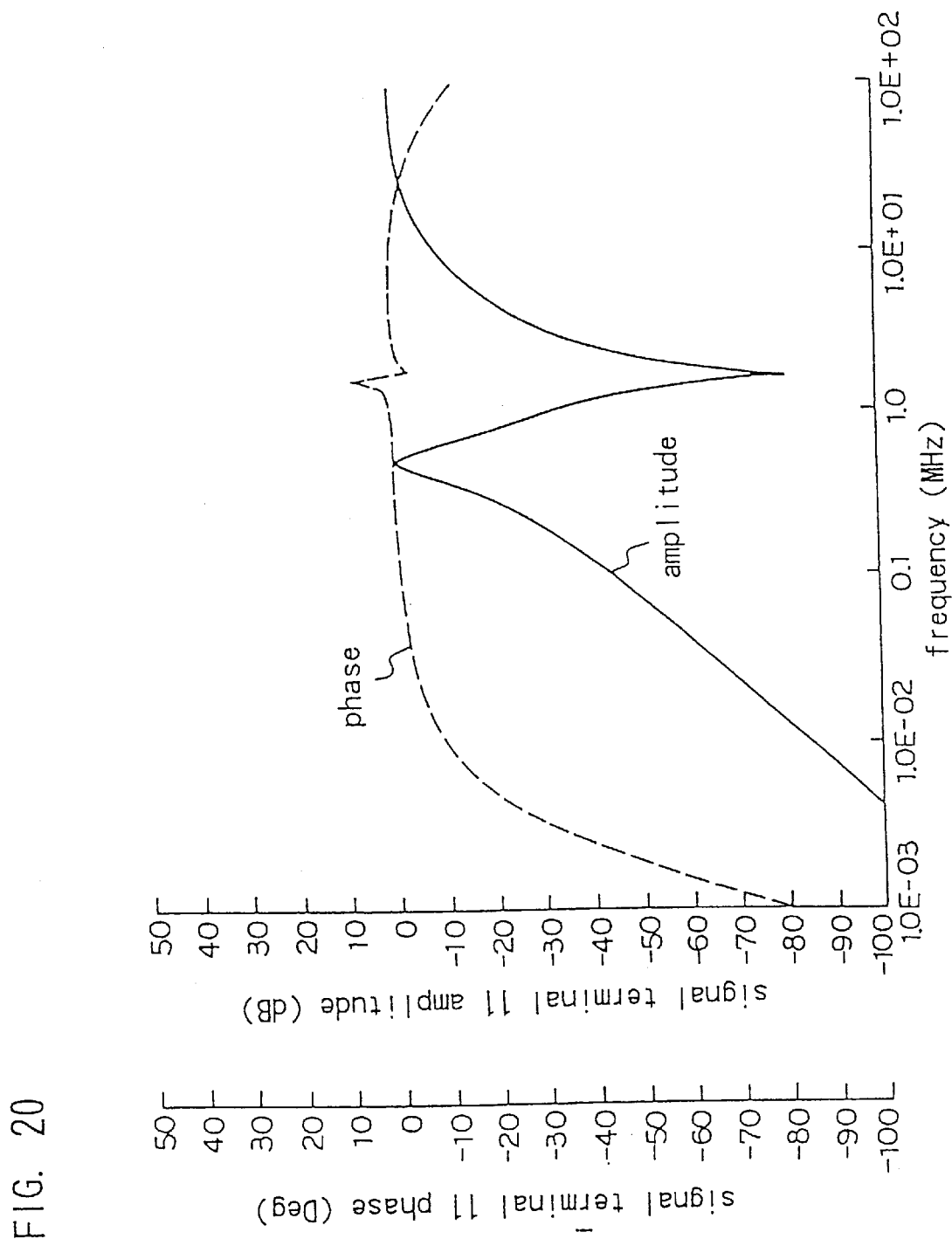
FIG. 20 is a diagram showing the result of simulating the frequency dependent resistor of FIG. 19.

FIG. 20 shows the result of simulating the bandpass filter characteristic obtained at the signal terminal 11 of the frequency dependent resistor of FIG. 19.

As seen from FIG. 20, the phase change is substantially zero at the center frequency of the bandpass frequency and in the neighboring frequency range. In this way, the bandpass filter having a superior phase characteristic at the center frequency and in the frequency band in the neighborhood thereof is obtained.

Embodiment 14

A frequency dependent resistor according to the present invention will be explained with reference to FIGS. 21 and 22.

Figure 21:
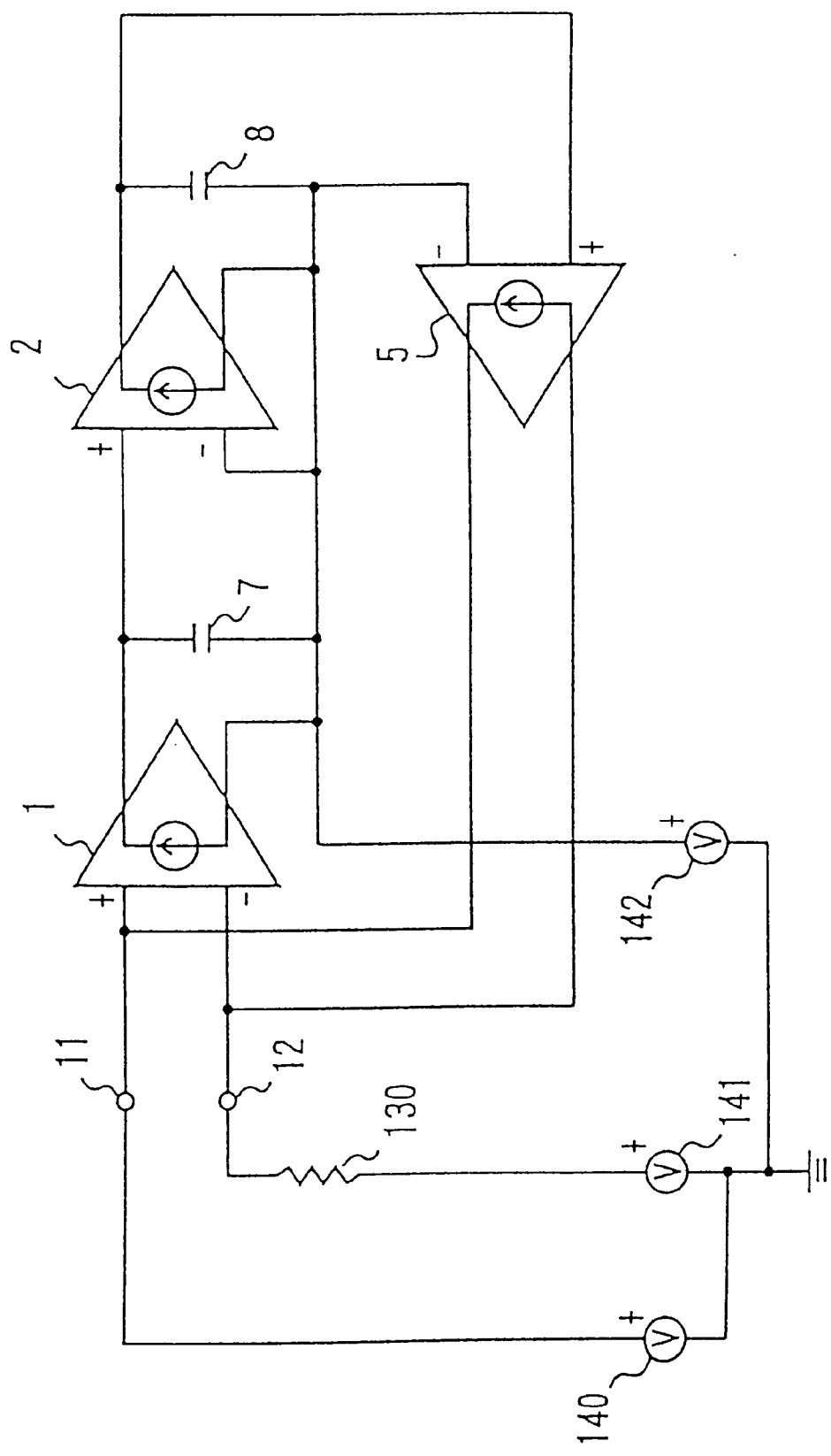
FIG. 21 shows still another frequency dependent resistor according to the present invention.

The frequency dependent resistor shown in FIG. 21 comprises voltage-current converters 1, 2, 5, capacitors 7, 8, and signal terminals 11, 12. The voltage-current converter 1 and the capacitor 7 connected to the output terminal pair of the voltage-current converter 1 form a first-stage phase rotator. The voltage-current converter 2 and the capacitor 8 connected to the output terminal pair of the voltage-current converter 2 form a second-stage phase rotator. The signal terminal 12 of the frequency dependent resistor is connected to an end of the resistor 130. The other end of the resistor 130 is connected to the voltage source 141. The signal terminal 11 is connected to the voltage source 140 having an AC signal source. We connect the voltage source 142 to the negative terminal of the voltage-current converters 2, 5 and an end each of the capacitors 7, 8.

This configuration can produce a lowpass filter characteristic to the signal terminal 12.

Figure 22:
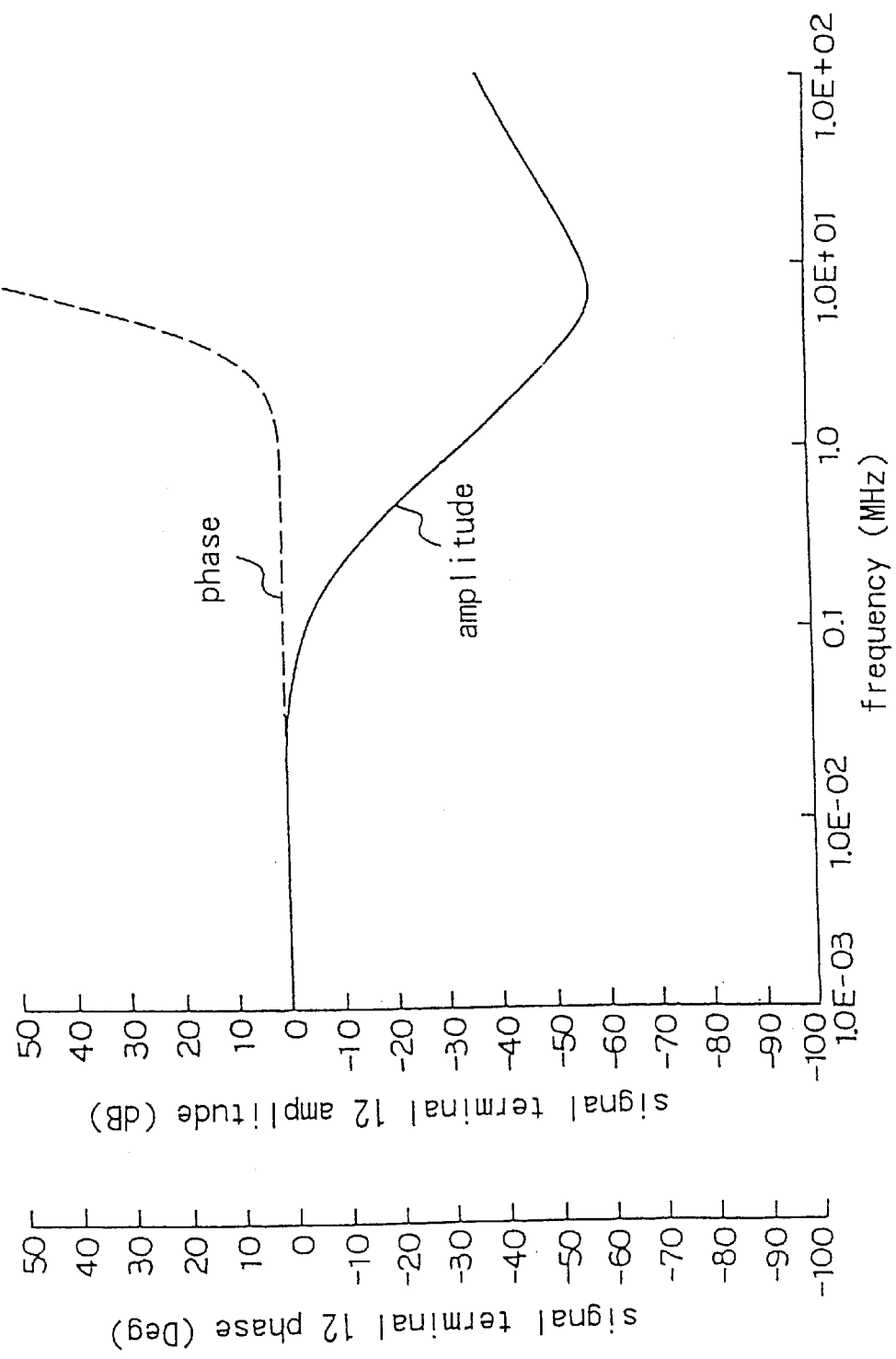
FIG. 22 is a diagram showing the result of simulating the frequency dependent resistor of FIG. 21.

FIG. 22 shows the result of simulating the lowpass filter characteristic obtained at the signal terminal 12 of the frequency dependent resistor of FIG. 21.

As seen from FIG. 22, the phase change is substantially zero in the frequency band from 1 kHz to 1 MHz. In this way, a lowpass filter is obtained having a superior phase characteristic in the frequency band of 1 kHz to 1 MHz.

In the 14th embodiment, however, the phase change is increased for frequencies higher than 1 MHz. This phenomenon of phase fluctuations can be reduced by adding the resistor 131 between the signal terminals 11, 12 as in the 15th embodiment described later.

Embodiment 15

A further frequency dependent resistor according to this invention will be explained with reference to FIGS. 23, 24 and 25.

Figure 23:
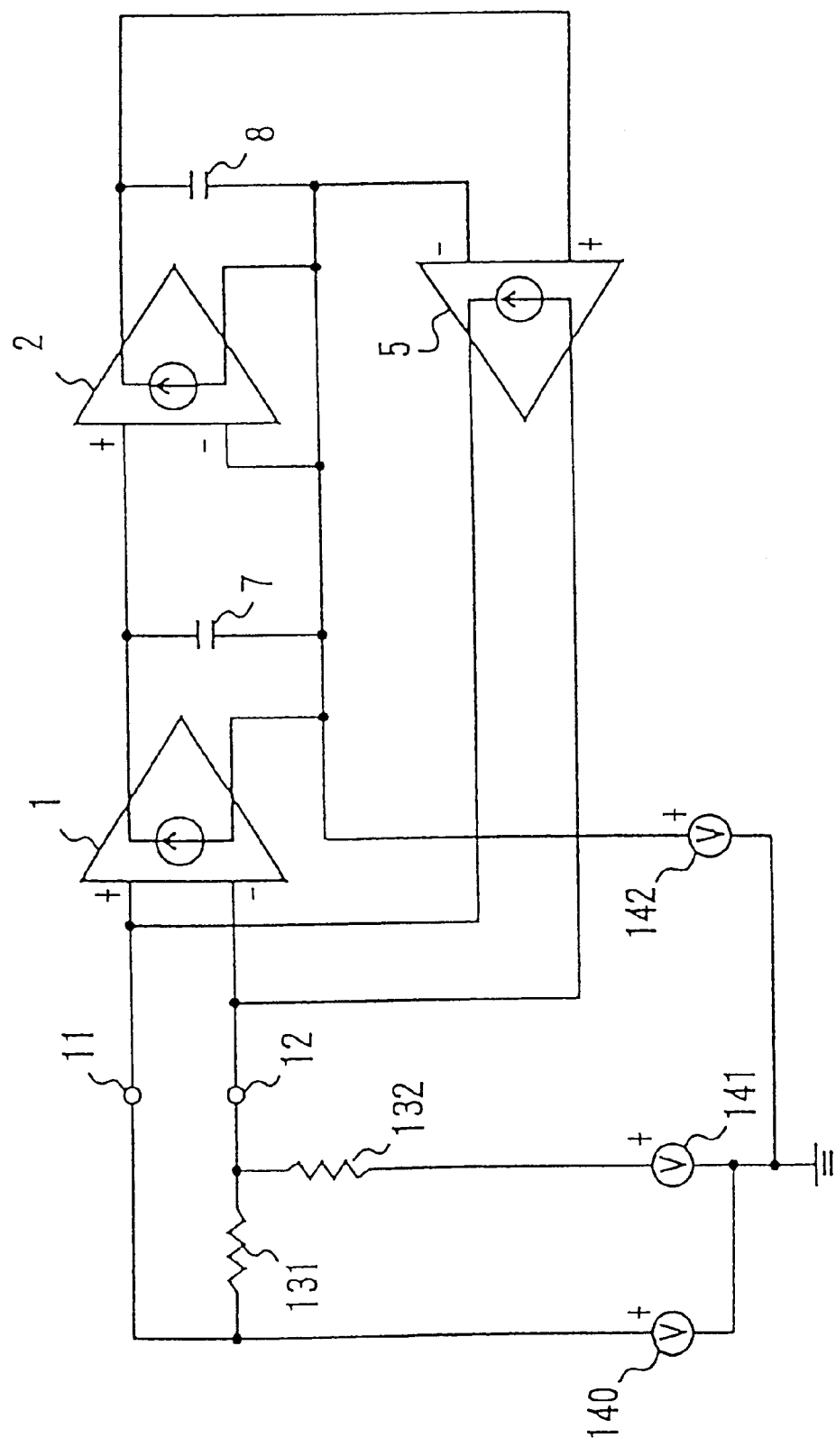
FIG. 23 shows still another frequency dependent resistor according to the present invention.

The frequency dependent resistor shown in FIG. 23 comprises voltage-current converters 1, 2, 5, capacitors 7, 8, and signal terminals 11, 12. The voltage-current converter 1 and the capacitor 7 connected to the output terminal pair of the voltage-current converter 1 form a first-stage phase rotator; and the voltage-current converter 2 and the capacitor 8 connected to the output terminal pair of the voltage-current converter 2 form a second-stage phase rotator. The signal terminal 12 of the frequency dependent resistor is connected with an end each of the resistors 131 and 132. The other end of the resistor 132 is connected to the voltage source 141. The other end of the resistor 131 and the signal terminal 11 are connected to the voltage source 140 having an AC signal source. Each negative terminal of the voltage-current converters 2, 5 and an end of each capacitors 7, 8 are connected to the voltage source 142.

This configuration can produce a lowpass filter characteristic to the signal terminal 12. The resistance value of the frequency dependent resistor changes with frequency; and in the case that the resistance value of the frequency dependent resistor is small as compared with the resistance value of the resistor 131, the resistance value of the combined resistor of the parallel circuit including the resistor 131 and the frequency dependent resistor is determined under the control of the resistance value of the frequency dependent resistor. In the case where the resistance value of the frequency dependent resistor is large, on the contrary, the resistance value of the combined resistor of the parallel circuit is determined under the control of the value of the resistor 131. The voltage of the voltage sources 140, 141 having an AC signal source is divided by the resistance value of the combined resistor determined in this way and the resistance value of the resistor 132. Usually, the DC voltages of the voltage sources 140, 141 are set to an equal value. The voltage output signal produced from the signal terminal 12 exhibits the lowpass filter characteristic, and the amplitude attenuation thereof is determined responding to the ratio between the resistors 132 and 131 in the high frequency range.

Figure 24:
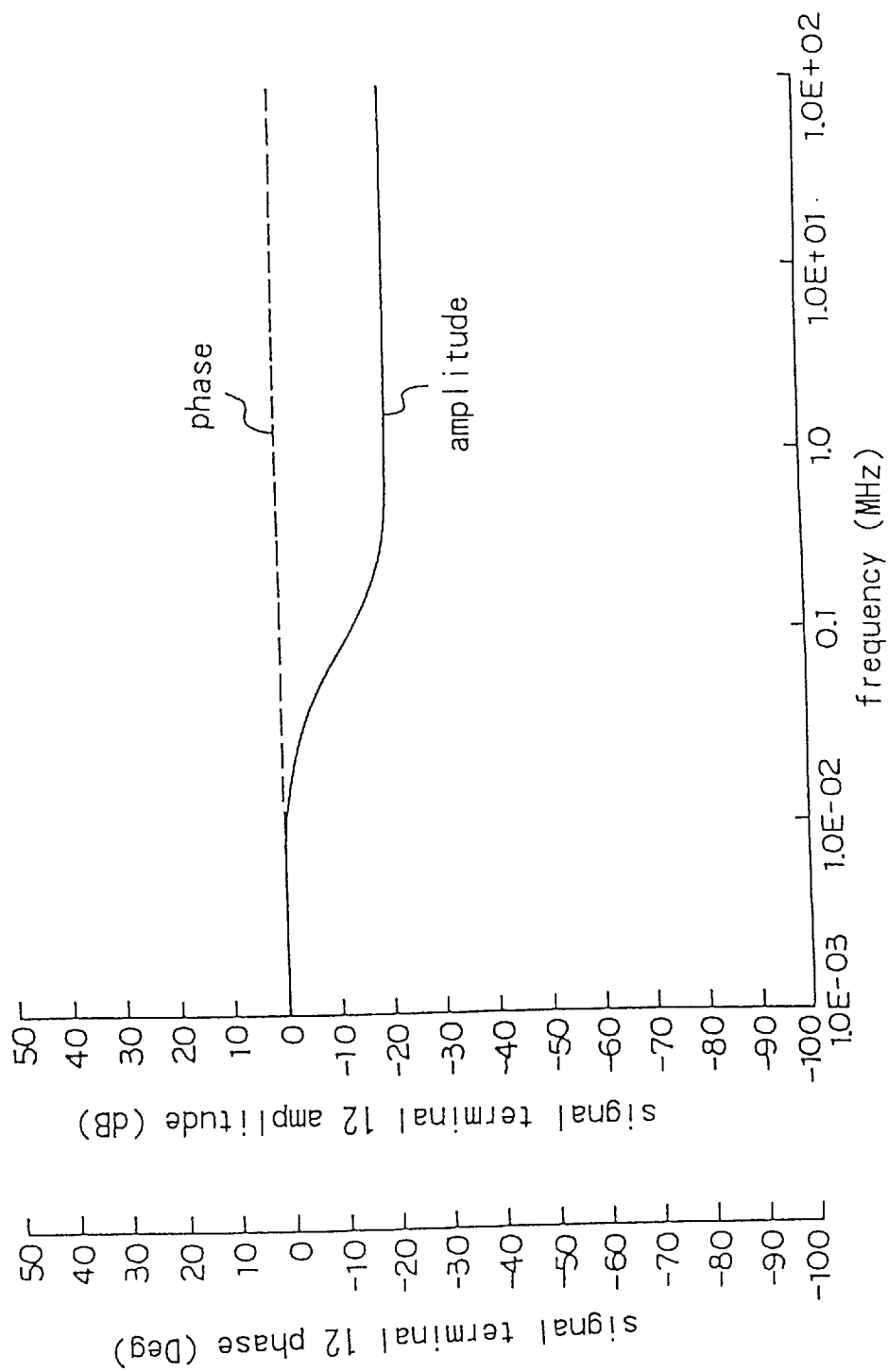
FIG. 24 is a diagram showing the result of simulating the frequency dependent resistor of FIG. 23.

FIG. 24 shows the result of simulating the lowpass filter characteristic obtained at the signal terminal 12 of the frequency dependent resistor of FIG. 23. The resistance value of the resistor 131 is set to 10 kΩ, and the resistance value of the resistor 132 to 1 kΩ.

As seen from FIG. 24, the phase change is substantially zero degree within a wide frequency range of 1 kHz to 100 MHz. In this way, the lowpass filter having a satisfactory phase characteristic is obtained within a wide frequency band of 1 kHz to 100 MHz.

FIG. 25 shows a configuration of a frequency dependent resistor having four phase rotators and a waveform-shaping circuit added to the signal terminal 12, as compared with the frequency dependent resistor shown in FIG. 23. Further, the voltage sources 141, 142 in FIG. 23 are replaced by a voltage source 144 in FIG. 25. The emitter-follower circuit is not shown.

The frequency dependent resistor shown in FIG. 25 comprises transistors 21, 22, 23, 24, 25, 26, 521, 522, 631, 631, 632, 634; capacitors 7, 8, 9, 10; resistors 27, 28, 29, 527, 528, 635, 636; current sources 301, 302, 303, 304, 305, 306, 331, 333, 335, 336, 501, 502, 503, 504, 531, 533; voltage sources 143, 144, 145; and signal terminals 11, 12, 16, 17.

A comparator is constituted by transistors 631, 632; the transistor 633 connected its collector to the collector of the transistor 631; the transistor 634 connected its base to the base of the transistor 633; the resistor 635 connected between the emitters of the transistors 631 and 632; and the resistor 636 connected to the collector of the transistor 634. This comparator and the voltage source 145 form a waveform shaping circuit been with a reference voltage of it is given by a voltage from the voltage source 145.

In the case where a pulse signal containing noises of a comparatively high frequency is applied to the signal terminal 11, an output signal of the lowpass filter free of the noises is put out at the signal terminal 16. Further, a signal shaped into a rectangular wave from the signal at the signal terminal 16 is put out from the signal terminal 17. An output signal with very small phase fluctuations with respect to the input pulse signal at the signal terminal 11 can be taken out at the signal terminals 16, 17. The high-frequency component of the signal at the signal terminal 11 is attenuated responding to the dividing ratio of the resistors 131 and 132. The signal being put out from the signal terminal 16, can hold a high-frequency component that is forming the input signal to the signal terminal 11.

Although, the frequency dependent resistor shown in FIG. 25 is formed by using a bipolar transistor, it may be also designed by using a MOS transistor as the frequency dependent resistor shown in FIG. 10.

Embodiment 16

A further frequency dependent resistor will be explained with reference to FIGS. 26 and 27.

Figure 26:
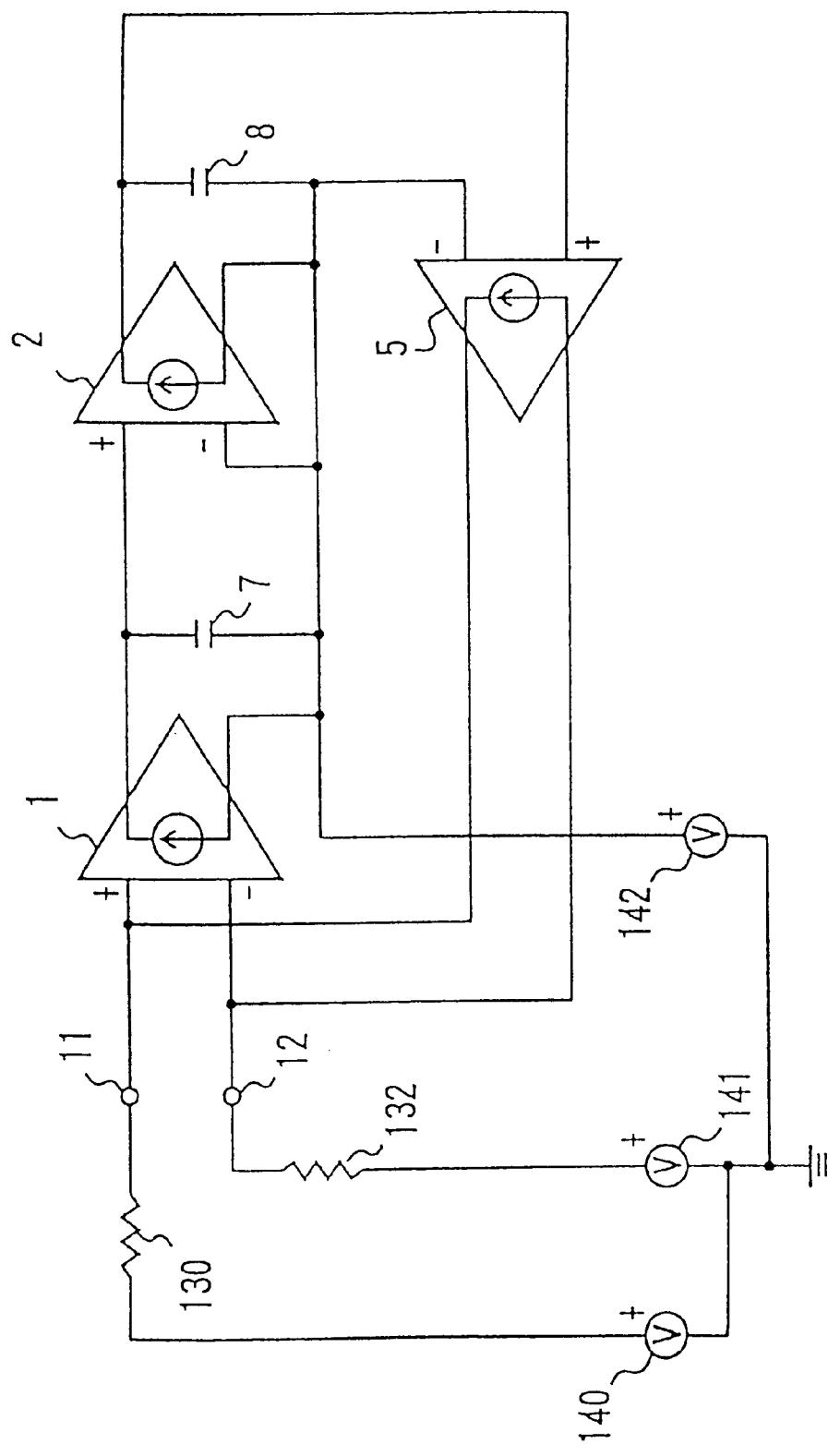
FIG. 26 shows still another frequency dependent resistor according to the present invention.

The frequency dependent resistor shown in FIG. 26 comprises voltage-current converters 1, 2, 5, capacitors 7, 8, and signal terminals 11, 12. The voltage-current converter 1 and the capacitor 7 connected to the output terminal pair of the voltage-current converter 1 form a first-stage phase rotator; and the voltage-current converter 2 and the capacitor 8 connected to the output terminal pair of the voltage-current converter 2 form a second-stage phase rotator. The signal terminal 12 of the frequency dependent resistor is connected with an end of the resistor 132, and the other end of the resistor 132 is connected with the voltage source 141. The signal terminal 11 is connected with an end of the resistor 130, and the other end of the resistor 130 is connected with the voltage source 140 having a signal source. The negative terminal each of the voltage-current converters 2, 5 and an end each of the capacitors 7, 8 are connected with the voltage source 142.

This configuration can produce a highpass filter characteristic at the signal terminal 11.

The resistance value of the frequency dependent resistor increases with the increase in frequency, so that the signal that is put out at the signal terminal 11 approaches to the voltage value of the voltage source 140. When the frequency decreases, on the contrary, the resistance value of the frequency dependent resistor approaches zero, so that the signal output at the signal terminal 11 approaches the voltage value of the voltage source 140 divided by the ratio in resistance value between the resistors 130 and 132.

Figure 27:
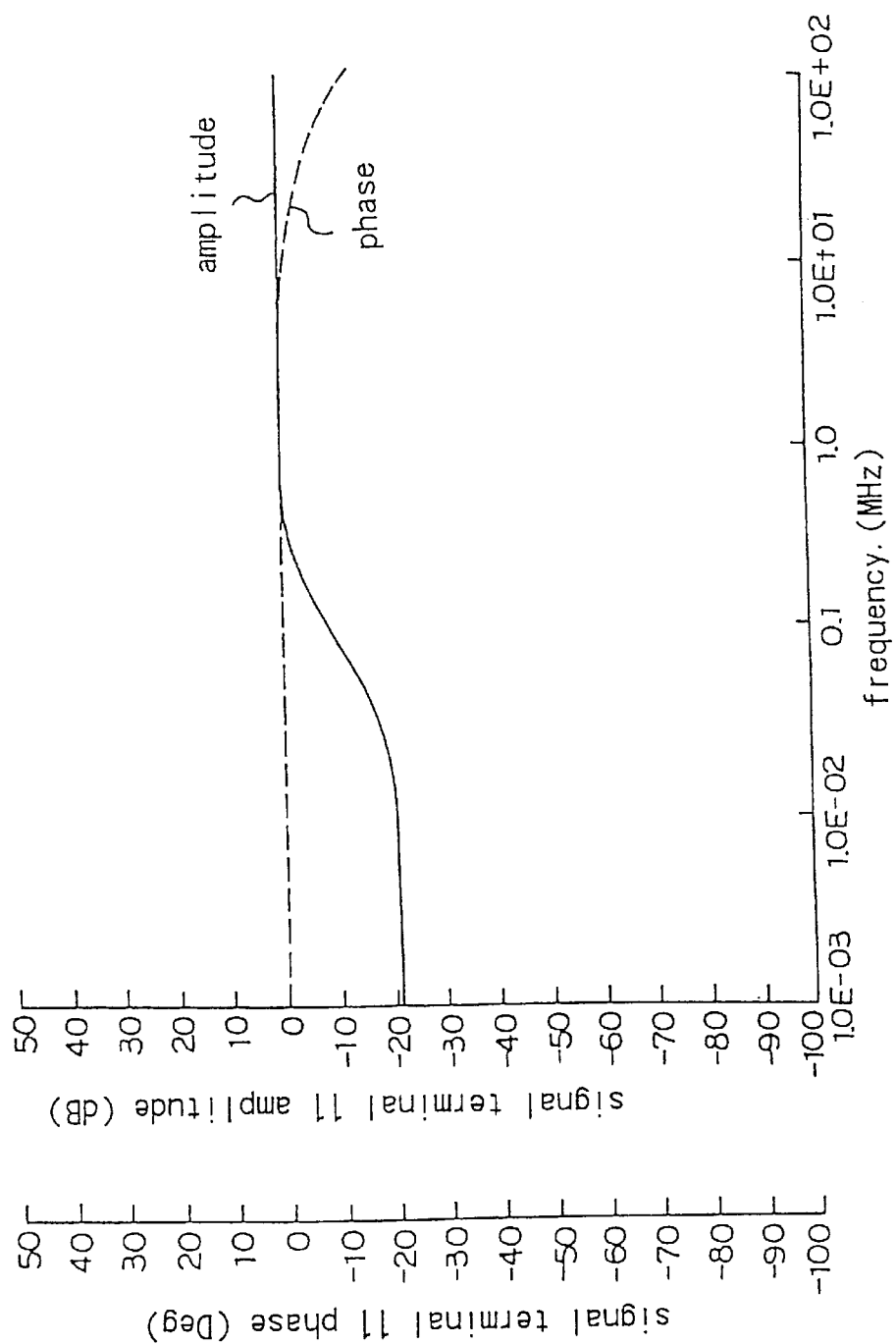
FIG. 27 is a diagram showing the result of simulating the frequency dependent resistor of FIG. 26.

FIG. 27 shows the result of simulating the highpass filter characteristic obtained at the signal terminal 11 of the frequency dependent resistor shown in FIG. 26.

As seen from FIG. 27, the phase change is no more than two degrees within the frequency band of 1 kHz to 10 MHz. In this way, a highpass filter having a satisfactory phase characteristic is obtained in the frequency range of 1 kHz to 10 MHz.

Embodiment 17

A frequency dependent resistor according to the present invention will be explained with reference to FIG. 28.

Figure 28:
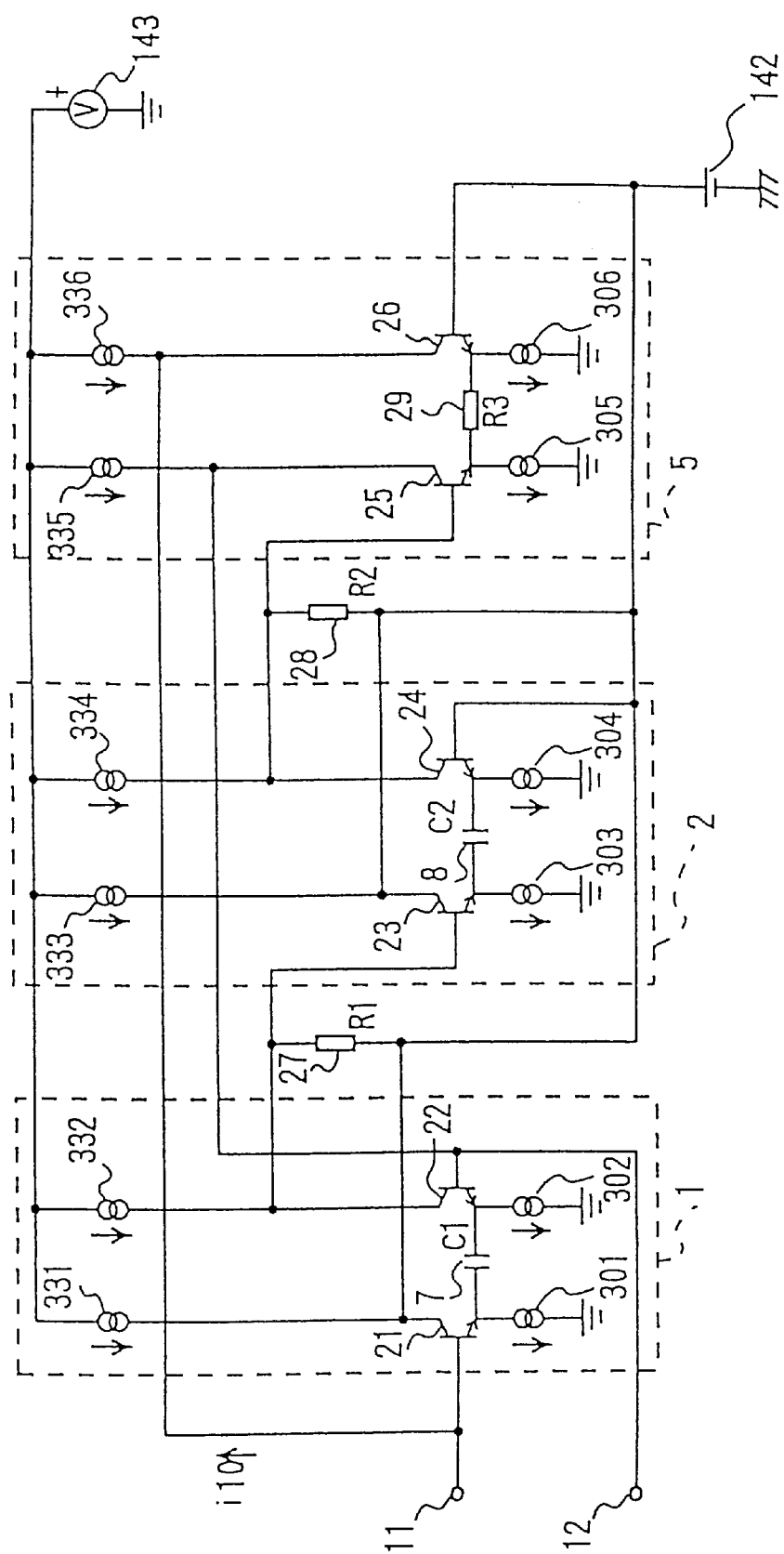
FIG. 28 shows a circuit configuration of still another frequency dependent resistor according to the present invention.

The frequency dependent resistor shown in FIG. 28 comprises transistors 21, 22, 23, 24, 25, 26; capacitors 7, 8; resistors 27, 28, 29; current sources 301, 302, 303, 304, 305, 306, 331, 332, 333, 334, 335, 336; voltage sources 142, 143; and signal terminals 11, 12.

In this embodiment, a frequency dependent resistor is configured by generating a reactive current. Specifically, a voltage-current converter 1 for generating a reactive current is constituted by the transistors 21, 22; the capacitor 7 connected between the emitters of the transistors 21 and 22; the current source 301 connected between the emitter of the transistor 21 and the ground; the current source 302 connected between the emitter of the transistor 22 and the ground; the current source 331 connected between the collector of the transistor 21 and the voltage source 143; and the current source 332 connected between the collector of the transistor 22 and the voltage source 143. The voltage-current converter 1 and the resistor 27 connected between the collectors of the transistors 21 and 22 form a first-stage phase rotator. The base of the transistor 21 of the first-stage phase rotator is connected with the signal terminal 11, and the base of the transistor 22 is connected with the signal terminal 12. A voltage-current converter 2 for generating a reactive current is constituted by the transistors 23, 24; the capacitor 8 connected between the emitters of the transistors 23 and 24; the current source 303 connected between the emitter of the transistor 23 and the ground; the current source 304 connected between the emitter of the transistor 24 and the ground; the current source 333 connected between the collector of the transistor 23 and the voltage source 143; and the current source 334 connected between the collector of the transistor 24 and the voltage source 143. The voltage-current converter 2 and the resistor 28 connected between the collectors of the transistors 23 and 24 form a second-stage phase rotator. A voltage-current converter 5 is constituted by the transistors 25, 26; the resistor 29 connected between the emitters of the transistors 25 and 26; the current source 305 connected between the emitter of the transistor 26 and the ground; the current source 306 connected between the emitter of the transistor 26 and the ground; the current source 335 connected between the collector of the transistor 25 and the voltage source 143; and the current source 336 connected between the collector of the transistor 26 and the voltage source 143.

Each current conversion rate of the voltage-current converters 1, 2 is given as the reciprocal of the sum, that is the sum of the emitter resistance value of the transistors and the impedance value of the capacitors 7, 8 connected between the emitters of the transistors. When a current of 1 mA flows in the transistors, the emitter resistance value is about 26 Ω, which is usually sufficiently small as compared with the impedance value of the capacitor connected between the emitters of the transistors. In this way, the current conversion rate can be approximated by the reciprocal of the impedance value of the capacitor connected between the emitters. When a differential amplifier circuit is comprised and the voltage at the non-inverted-output terminal of the differential amplifier circuit is applied to the inverted-input terminal through an emitter-follower circuit, the emitter resistance can be reduced, at that each transistor of each differential amplifier circuit in each voltage-current converter is replaced by a transistor circuit. The base of it is a non-inverted input terminal; the emitter of it is an inverted input terminal; and the collector of it is the collector of the emitter-follower circuit. By defining the capacitance values of the capacitors 7 and 8 as C1 and C2, respectively, and the current conversion rates of the voltage-current converters 1, 2 as gm1 and gm2, respectively, gm1 and gm2 are given by the following equation:

$$gm1 = j \times \omega \times C1 \quad (44)$$

$$gm2 = j \times \omega \times C2 \quad (45)$$

Also, the current conversion rate of the voltage-current converter 5 is defined as gm10.

When the voltage applied to the signal terminal 11 with respect to the signal terminal 12 is v, the voltage v1 expressed by the following expression is generated across the resistor 27.

$$v1 = v \times gm1 \times R1 \quad (46)$$

This voltage v1 is applied to the second-stage phase rotator, and the voltage v2 given by the following expression is generated across the resistor 28.

$$v2 = v1 \times gm2 \times R2 \quad (47)$$

This voltage v2 is applied to the voltage-current converter 5, which converts the applied voltage v2 into a current with the current conversion rate of gm10 and puts out it.

$$-i10 = gm10 \times v2 \quad (48)$$

The impedance Zin that is impedance as seen inward from the signal terminals 11, 12 is given by the following equation:

$$Zin = 1/(\omega^2 \times gm10 \times C1 \times C2 \times R1 \times R2) \quad (49)$$

In the frequency dependent resistor, it is possible obtaining the resistance characteristic inversely proportional to the product of the square of ω, the capacitance values C1, C2, the resistance values R1, R2 and the current conversion rate gm10.

Embodiment 18

Another frequency dependent resistor according to this invention will be explained below with reference to FIG. 29.

Figure 29:
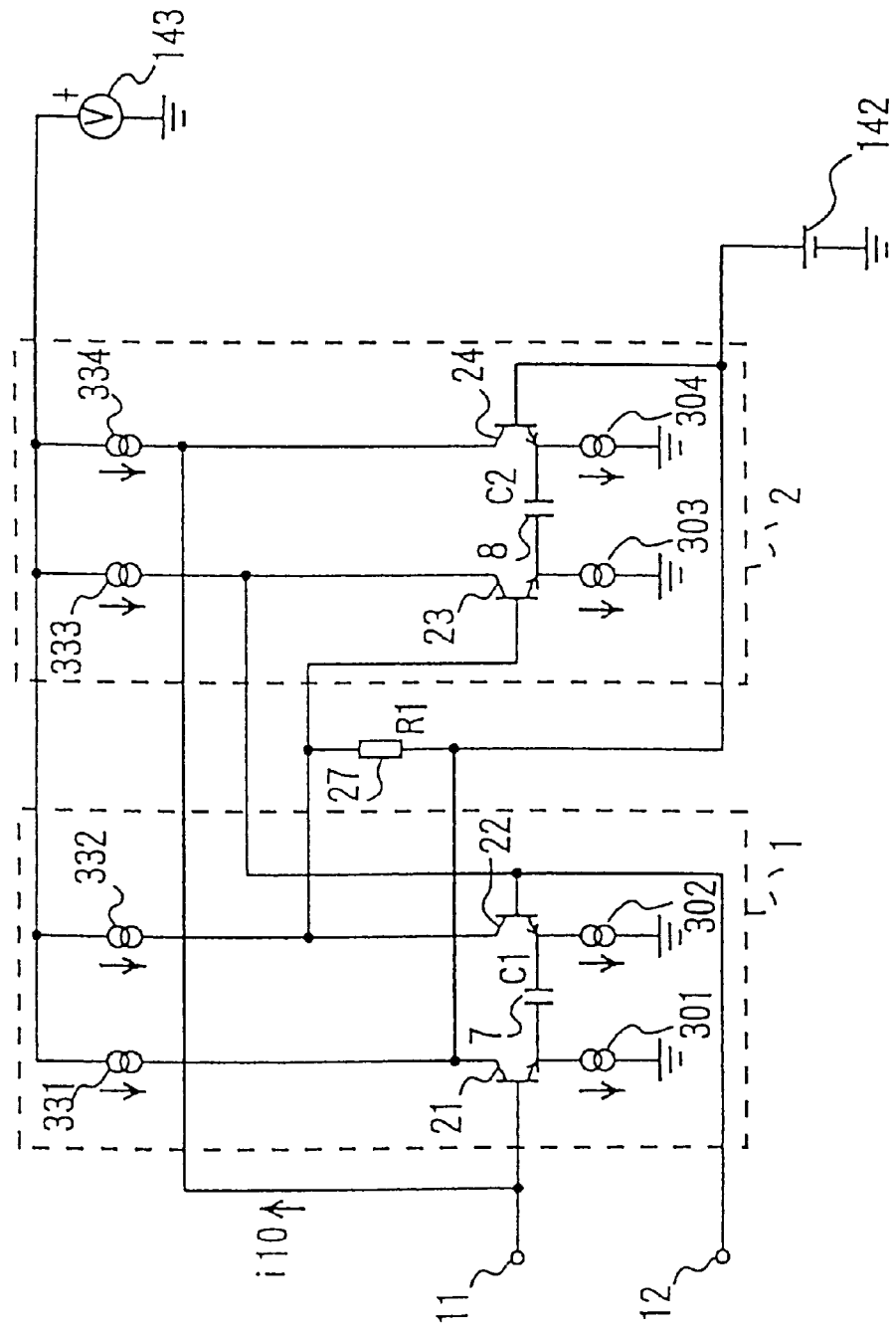
FIG. 29 shows a circuit configuration of still another frequency dependent resistor according to the present invention.
Figure 30:
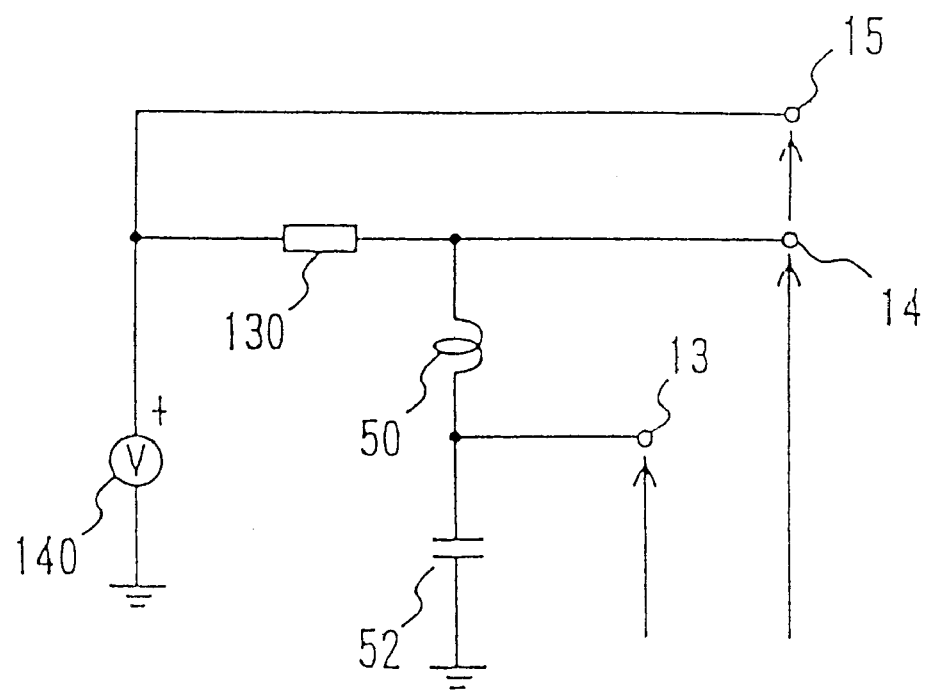
FIG. 30 is a diagram showing a conventional filter unit.
Figure 31:
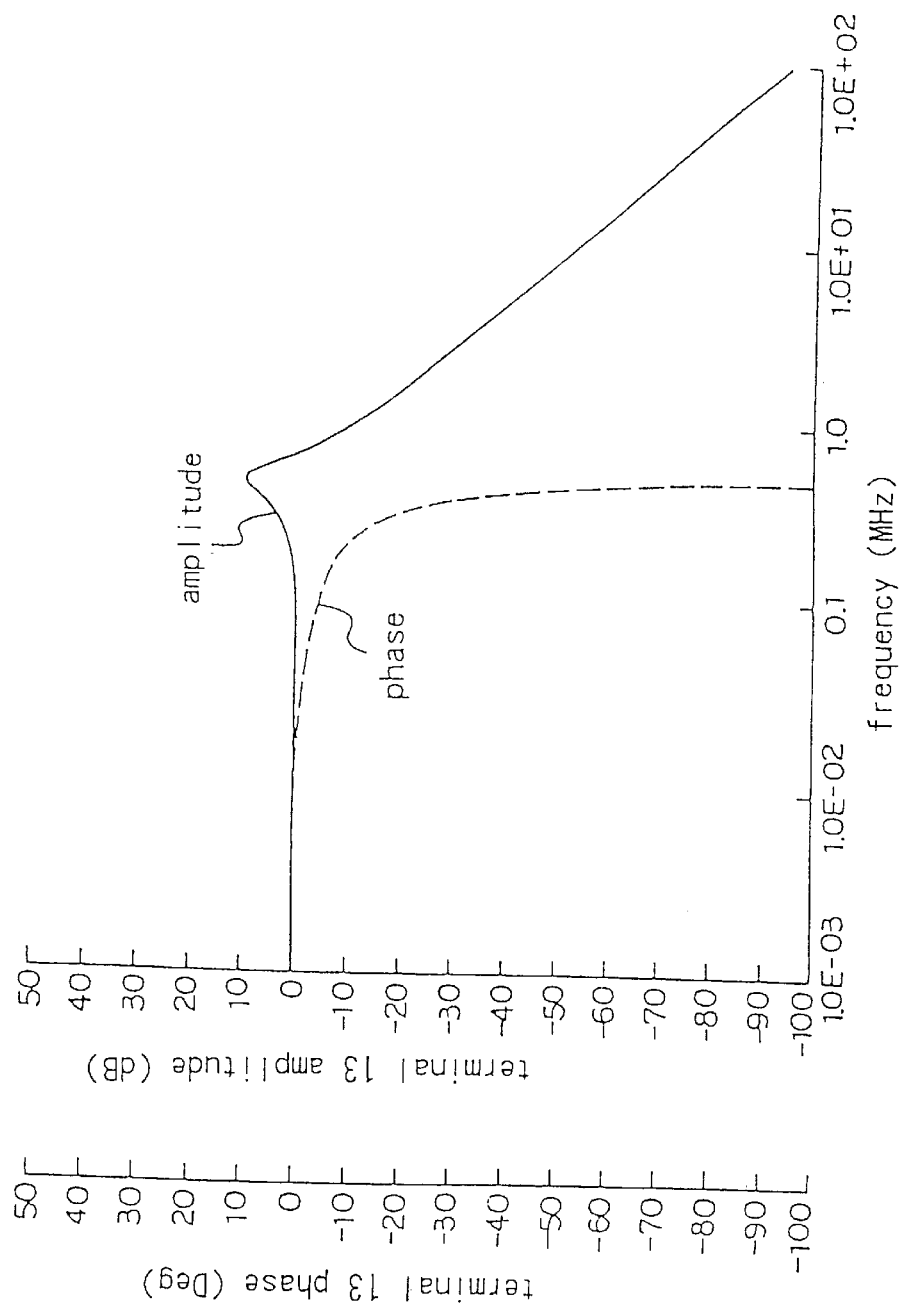
FIG. 31 is a diagram showing the result of simulating the filter unit of FIG. 30.
Figure 32:
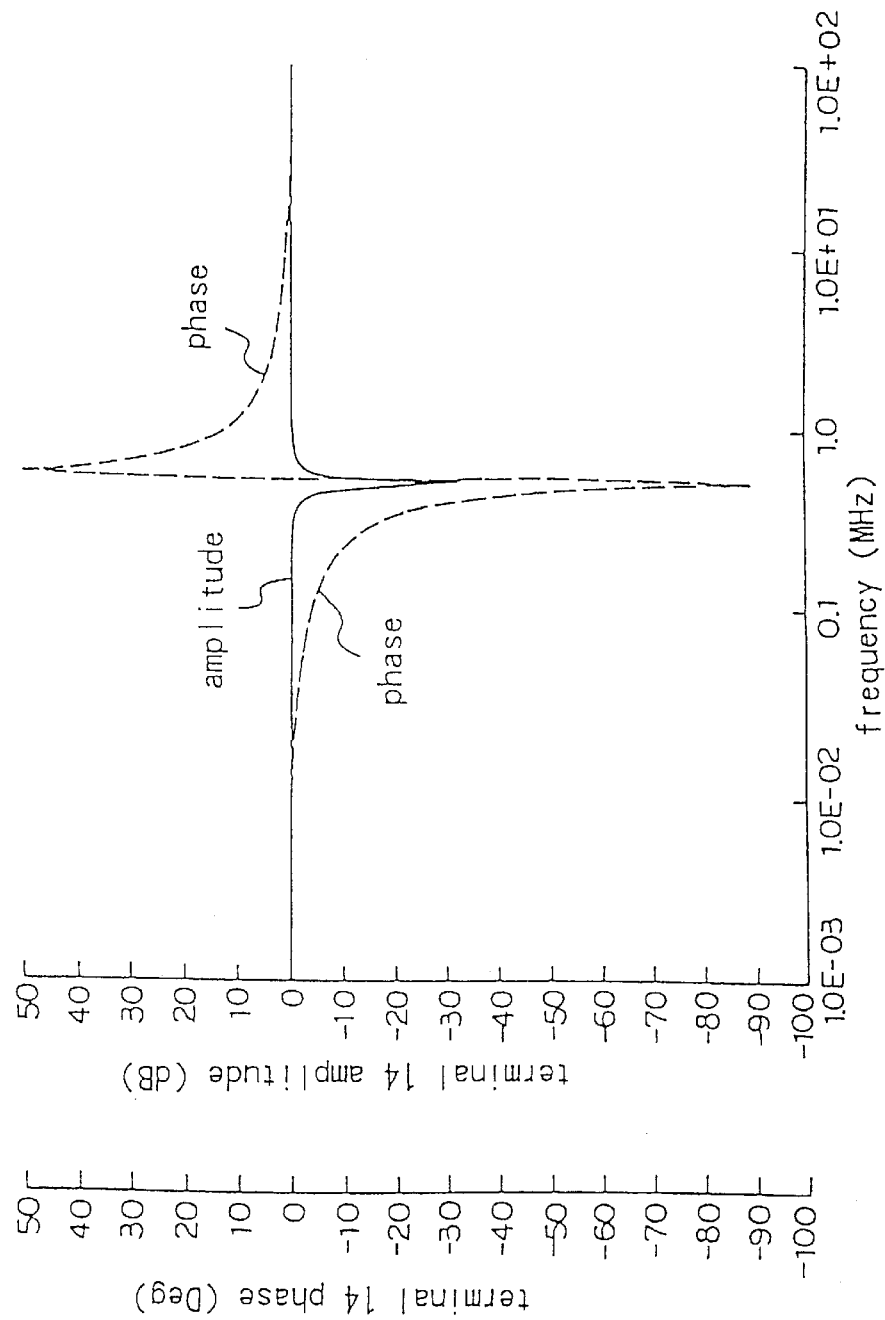
FIG. 32 is a diagram showing the result of simulating the filter unit of FIG. 30.
Figure 33:
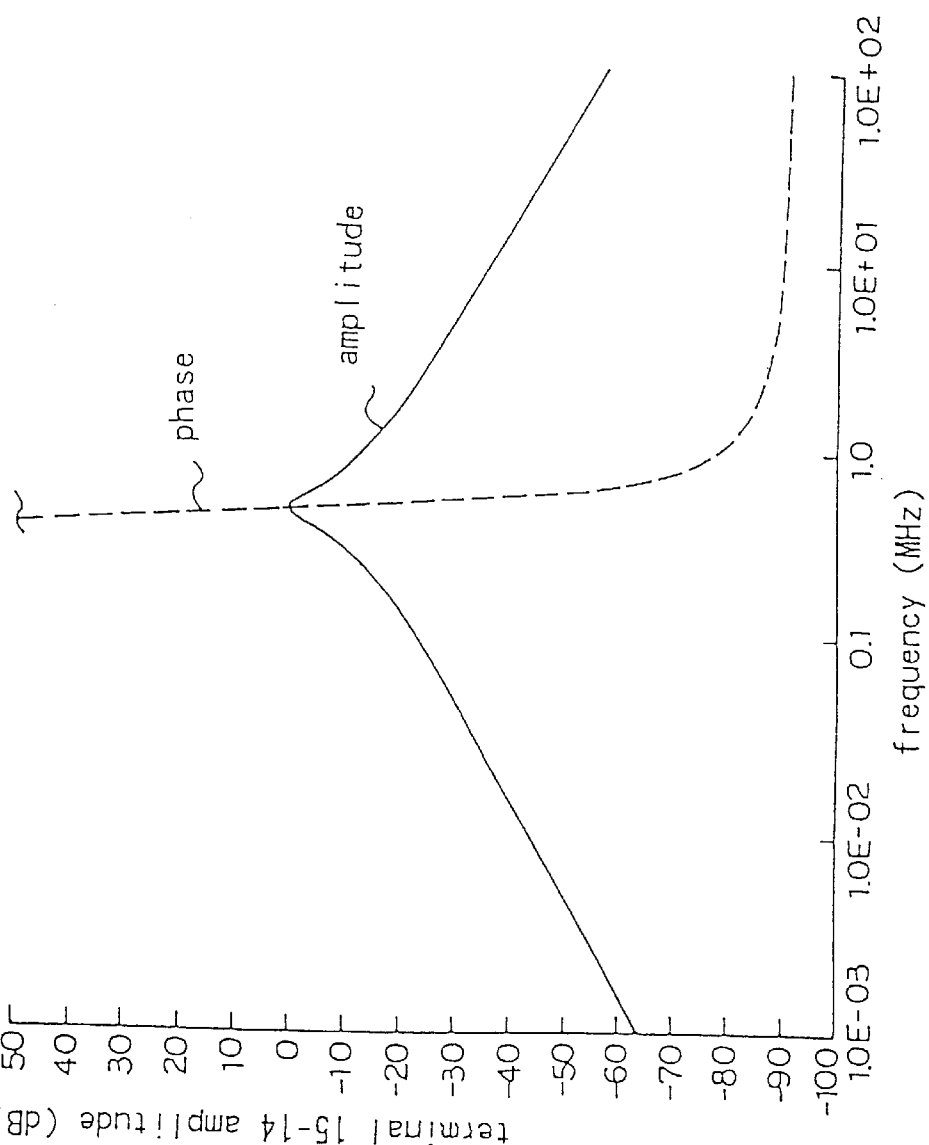
FIG. 33 is a diagram showing the result of simulating the filter unit of FIG. 30.

The frequency dependent resistor shown in FIG. 29 comprises transistors 21, 22, 23, 24; capacitors 7, 8; a resistor 27; current sources 301, 302, 303, 304, 331, 332, 333, 334; voltage sources 142, 143; and signal terminals 11, 12.

A voltage-current converter 1 for generating a reactive current has the transistors 21, 22; the capacitor 7 connected between the emitters of the transistors 21 and 22; the current source 301 connected between the emitter of the transistor 21 and the ground; the current source 302 connected between the emitter of the transistor 22 and the ground; the current source 331 connected between the collector of the transistor 21 and the voltage source 143; and the current source 333 connected between the collector of the transistor 22 and the voltage source 143. This voltage-current converter 1 and the resistor 27 connected between the collectors of the transistors 21 and 22 form a first-stage phase rotator. The base of the transistor 21 of the first-stage phase rotator is connected to the signal terminal 11, and the base of the transistor 22 is connected to the signal terminal 12. A voltage-current converter 2 for generating a reactive current has the transistors 23, 24; the capacitor 8 connected between the emitters of the transistors 23 and 24; the current source 303 connected between the emitter of the transistor 23 and the ground; the current source 304 connected between the emitter of the transistor 24 and the ground; the current source 333 connected between the collector of the transistor 23 and the voltage source 143; and the current source 334 connected between the collector of the transistor 24 and the voltage source 143.

The current conversion rates gm1 and gm2 of the voltage-current converters 1, 2, as in the case of FIG. 28, are given by equations (44) and (45), respectively.

When a voltage applied to the signal terminal 11 with respect to the signal terminal 12 is v, a voltage v1 expressed by the following expression is generated across the resistor 27:

$$v1 = v \times gm1 \times R1 \qquad (50)$$

This voltage v1 is applied to the voltage-current converter 2. The applied voltage v1 is converted into a current with the current conversion rate of gm2, and this current is put out:

$$-i10 = gm2 \times v1 \qquad (51)$$

The impedance Zin that is impedance as seen inward from the signal terminals 11, 12 is given by the following equation:

$$Zin = 1/(\omega^2 \times C1 \times C2 \times R1) \qquad (52)$$

This frequency dependent resistor can obtain a resistance characteristic inversely proportional to the product of the square of ω, the capacitance values C1, C2, and the resistance value R1.

The present invention was explained above in some detail about preferred embodiments. The disclosed contents of these embodiments should, of course, be modified in detailed points of the configuration. It should be understood that we can reconstruct it without departing from the scope and spirit of the invention as claimed below.

INDUSTRIAL APPLICABILITY

The frequency dependent resistor according to the present invention, has the resistance characteristic having no imaginary part in the impedance and changing with the even-numbered power of the frequency. By that it can make a filter with a small phase change. Consequently, the present invention has great technical advantages using for video signal processing filters in TV or VTR applications; one example is the bandpass filter that produces a chrominance signal from the composite video signal; another one is a lowpass filter that removes some high harmonics after demodulation of the chrominance signal: using for an equalizer amplifier that controls frequency and amplitude in audio circuits: using for a filter that detects the IQ signal in BS tuner applications; and using for a filter that removes some noise component of the pulse signal in a digital signal processing circuits.

I claim:

1. A frequency dependent resistor comprising:
   a cascade-connected circuit in which plural phase rotator stages are connected in cascade, each of said phase rotator stages including both a voltage-current converter which provides a current from an output terminal thereof responding to a voltage applied to an input terminal thereof and a reactive load connected to the output terminal of said voltage-current converter, each of said phase rotator stages providing an output voltage across said reactive load responding to the voltage applied to said input terminal;
   a signal input terminal connected to said input terminal of said voltage-current converter of the first phase rotator stage included in said cascade-connected circuit; and
   at least one voltage-current converter providing a current to said signal input terminal, responding to the output voltage of even-numbered phase rotator stages, as counted from the first phase rotator stage of said cascade-connected circuit.

2. A frequency dependent resistor comprising:
   a cascade-connected circuit in which plural phase rotator stages are connected in cascade, each of said phase rotator stages including both a voltage-current converter which provides a bidirectional AC current from an output terminal pair thereof responding to an AC voltage applied to an input terminal pair thereof and a reactive load connected to the output terminal pair of said voltage-current converter, each of said phase rotator stages providing an output voltage across said reactive load responding to the voltage applied to said input terminal pair;
   a signal input terminal pair connected to said input terminal pair of said voltage-current converter of the first phase rotator stage included in said cascade-connected circuit; and
   at least one voltage-current converter providing a bidirectional AC current to said signal input terminal pair from said output terminal pair, responding to the output voltage of even-numbered phase rotator stages, as counted from the first phase rotator stage of said cascade-connected circuit.

3. A frequency dependent resistor comprising:
   a cascade-connected circuit in which plural phase rotator stages are connected in cascade, each of said phase rotator stages being comprised of a differential amplifier circuit having an output terminal pair for providing a current responding to the voltage applied from an input terminal pair thereof and a reactive load connected to said output terminal pair;
   a signal input terminal pair connected to said input terminal pair of the first-stage differential amplifier circuit of said cascade-connected circuit; and
   at least one differential amplifier circuit providing a current from an output terminal pair thereof to said signal input terminal pair, responding to a voltage applied to the input terminal pair, that said voltage is dropped across a reactive load of even-numbered phase rotator stages, as counted from the first phase rotator stage of said cascade-connected circuit.

4. A frequency dependent resistor according to claim 1 further comprising at least one current-current converter in which a current transmission coefficient varies responding to a control signal applied thereto from an external source.

5. A frequency dependent resistor according to claim 1 wherein the current fed back to said signal input terminal or said signal input terminal pair is in an opposite phase to the voltage applied to said signal input terminal or said signal input terminal pair, respectively.

6. A frequency dependent resistor according to claim 1, in which the current fed back to said signal input terminal is in phase with the voltage applied to said signal input terminal.

7. A frequency dependent resistor according to claim 1, wherein said reactive load is a capacitive element.

8. A frequency dependent resistor according to claim 1, wherein said reactive load is an inductive element.

9. A frequency dependent resistor according to claim 1, wherein said reactive load is a parallel circuit including a capacitive element and an inductive element.

10. A frequency dependent resistor according to claim 1, wherein said reactive load is a series circuit including a capacitive element and an inductive element.

11. A frequency dependent resistor according to claim 1, wherein said voltage-current converter comprises plural MOS transistors.

12. A frequency dependent resistor according to claim 8, wherein said reactive load is a gyrator circuit.

13. A frequency dependent resistor according to claim 3, in which a signal is applied through a buffer circuit to the base of a transistor of said differential amplifier circuit.

14. A frequency dependent resistor comprising:
a first resistance circuit including a cascade-connected circuit in which plural phase rotator stages are connected in cascade, each of said phase rotator stages having both a voltage-current converter providing a bidirectional AC current from an output terminal pair thereof responding to an AC voltage applied to an input terminal pair thereof and a reactive load connected to the output terminal pair of said voltage-current converter, each of said phase rotator stages providing a voltage across said reactive load responding to the voltage applied to said input terminal pair, a signal input terminal pair connected to said input terminal pair of the first phase rotator stage of said cascade-connected circuit, and at least one voltage-current converter providing a bidirectional AC current to said signal input terminal pair through said output terminal pair thereof, responding to the output voltage of even-numbered phase rotator stages as counted from the first phase rotator stage of said cascade-connected circuit, in number, and at least applied to one terminal of said input terminal pair; and
a first resistor connected at a first end to one terminal of said signal input terminal pair of said first resistance circuit;
a signal applied between the other terminal of said signal input terminal pair of said first resistance circuit and the other end of said first resistor, and an output signal being produced from one end of said signal input terminal pair of said first resistance circuit, or of said first resistor.

15. A frequency dependent resistor according to claim 14, further comprising a second resistor connected to said signal input terminal pair of said first resistance circuit.

16. A frequency dependent resistor according to claim 14, further comprising a pulse waveform shaping circuit connected to one terminal of each of said signal input terminal pair.

17. A frequency dependent resistor comprising:
a cascade-connected circuit in which plural phase rotator stages are connected in cascade, each of said phase rotator stages including a voltage-current converter providing a reactive current from an output terminal pair thereof responding to a voltage applied to an input terminal pair thereof and a resistive load connected to said output terminal pair of said voltage-current converter, each of said phase rotator stages providing a voltage across said resistive load responding to the voltage applied to said input terminal pair;
a signal input terminal pair connected to said input terminal pair of said voltage-current converter of the first phase rotator stage of said cascade-connected circuit; and
at least one voltage-current converter providing a current to said signal input terminal pair responding to the output voltage of even-numbered phase rotator stages as counted from the first phase rotator stage of said cascade-connected circuit.

18. A frequency dependent resistor comprising:
a cascade-connected circuit in which plural phase rotator stages are connected in cascade, each of said phase rotator stages including a voltage-current converter providing a reactive current from an output terminal pair thereof responding to a voltage applied to an input terminal pair thereof and a resistive load connected to the output terminal pair of said voltage-current converter, each of said phase rotator stages providing a voltage across said resistive load responding to the voltage applied to said input terminal pair; and
a signal input terminal pair connected to said input terminal pair of said voltage-current converter of the first phase rotator stage of said cascade-connected circuit;
the output current of the voltage-current converter of even-numbered phase rotator stages, as counted from the first phase rotator stage of said cascade-connected circuit, being supplied to said signal input terminal pair.

19. A frequency dependent resistor according to claim 17, in which a fixed voltage is applied to an end of said input terminal pair or said output terminal pair.

20. A frequency dependent resistor comprising:
a cascade-connected circuit in which plural phase rotator stages are connected in cascade, each of said phase rotator stages providing an AC voltage which is proportional to a value of an AC voltage applied to an input terminal thereof, orthogonal to a phase of said AC voltage applied to said input terminal thereof, and changeful responding to said AC voltage applied to said input terminal thereof, from an output terminal thereof;
a signal input terminal connected to said input terminal of said voltage-current converter of the first phase rotator stage of said cascade-connected circuit; and
at least one voltage-current converter for providing a current to said signal input terminal responding to the output voltage of even-numbered phase rotator stages, as counted from the first phase rotator stage of said cascade-connected circuit.

21. A frequency dependent resistor comprising:
a cascade-connected circuit in which plural phase rotator stages are connected in cascade, each of said phase rotator stages providing an AC voltage, which is proportional to a value of an AC voltage applied to an input terminal pair thereof, orthogonal to a phase of said AC voltage applied to said input terminal pair thereof, and changeful responding to said AC voltage applied to said input terminal pair thereof, from an output terminal pair thereof;
a signal input terminal pair connected to said input terminal pair of said voltage-current converter of the first phase rotator stage of said cascade-connected circuit; and
at least one voltage-current converter for providing a current to said signal input terminal pair responding to the output voltage of even-numbered phase rotator stages as counted from the first phase rotator stage of said cascade-connected circuit.

22. A frequency dependent resistor comprising:
a first resistance circuit including, a cascade-connected circuit in which connected plural phase rotator stages are connected in cascade, each of said phase rotator stages providing an AC voltage which is proportional to a value of an AC voltage applied to an input terminal pair thereof, orthogonal to a phase of said AC voltage applied to said input terminal pair thereof, and changeful responding to said AC voltage applied to said input terminal thereof, from an output terminal pair thereof,
a signal input terminal pair connected to said input terminal pair of the first phase rotator stage of said cascade-connected circuit and at least one voltage-current converter providing a bidirectional current to said signal input terminal pair through said output terminal pair thereof, responding to the output voltage of even-numbered phase rotator stages as counted from the first phase rotator stage of said cascade-connected circuit, and at least applied to the one of said input terminal pair; and a first resistor connected at an end thereof to one of said signal input terminal pair of said first resistance circuit;

wherein a signal is applied between the other terminal of said signal input terminal pair of said first resistance circuit and the other end of said first resistor; and an output signal is produced from said signal input terminal of said first resistance circuit or at least an end of said first resistor.

23. A frequency dependent resistor according to claim 22 further comprising a second resistor connected to said signal input terminal pair of said first resistance circuit.

* * * * *